(12) United States Patent
Ker et al.

(10) Patent No.: US 9,748,219 B1
(45) Date of Patent: Aug. 29, 2017

(54) SELF-BALANCED SILICON-CONTROLLED RECTIFICATION DEVICE

(71) Applicant: AMAZING MICROELECTRONIC CORP., New Taipei (TW)

(72) Inventors: Ming-Dou Ker, Hsinchu County (TW); Woei-Lin Wu, Hsinchu County (TW); James Jeng-Jie Peng, Taoyuan County (TW); Ryan Hsin-Chin Jiang, Taipei (TW)

(73) Assignee: Amazing Microelectronic Corp., New Taipei (TW)

( * ) Notice: Subject to any disclaimer, the term of this patent is extended or adjusted under 35 U.S.C. 154(b) by 0 days.

(21) Appl. No.: 15/241,365

(22) Filed: Aug. 19, 2016

(51) Int. Cl.
*H01L 27/02* (2006.01)
*H01L 23/528* (2006.01)

(52) U.S. Cl.
CPC ........ *H01L 27/0262* (2013.01); *H01L 23/528* (2013.01)

(58) Field of Classification Search
CPC ................ H01L 27/0262; H01L 23/528
See application file for complete search history.

(56) References Cited

U.S. PATENT DOCUMENTS

| | | | |
|---|---|---|---|
| 8,085,518 B2 * | 12/2011 | Chaudhary | H01L 27/0266 361/56 |
| 9,318,479 B2 | 4/2016 | Li et al. | |
| 2003/0007301 A1 * | 1/2003 | Ker | H01L 27/0262 361/111 |
| 2007/0131965 A1 * | 6/2007 | Kim | H01L 27/0262 257/173 |
| 2007/0262386 A1 * | 11/2007 | Gossner | H01L 27/0262 257/355 |
| 2017/0125399 A1 * | 5/2017 | Huang | H01L 27/0262 |

FOREIGN PATENT DOCUMENTS

TW 201419490 A 5/2014

\* cited by examiner

*Primary Examiner* — Yasser A Abdelaziez
(74) *Attorney, Agent, or Firm* — Rosenberg, Klein & Lee

(57) ABSTRACT

A self-balanced silicon-controlled rectification device includes a substrate, an N-type doped well, a P-type doped well, at least one heavily doped clamping fin, at least one first P-type heavily doped fin, and at least one first N-type heavily doped fin. The N-type doped well and the P-type doped well are arranged in the substrate. The heavily doped clamping fin is arranged in the N-type doped well and the P-type well and protruded up from a surface of the substrate. The first P-type heavily doped fin and the first N-type heavily doped fin are respectively arranged in the N-type doped well and the P-type doped well, and protruded up from the surface of the substrate. The abovementioned elements forms silicon-controlled rectifiers (SCRs) are forward biased to generate uniform electrostatic discharge (ESD) currents through the SCRs.

38 Claims, 81 Drawing Sheets

SELF-BALANCED SILICON-CONTROLLED RECTIFICATION DEVICE

BACKGROUND OF THE INVENTION

Field of the Invention

The present invention relates to a silicon-controlled rectification device, particularly to a self-balanced silicon-controlled rectification device.

Description of the Related Art

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

As semiconductor technologies evolve, fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. The active region of the FinFET, like a fin, may be rectangular in shape from a cross section view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current. Semiconductor devices including FinFETs are susceptible to extremely high voltage spikes such as an electrostatic discharge (ESD) transient. ESD is a rapid discharge that flows between two objects due to the built-up of static charge. ESD may destroy semiconductor devices because the rapid discharge can produce a relatively large current.

To overcome the abovementioned problems, the present invention provides a self-balanced silicon-controlled rectification device, so as to solve the afore-mentioned problems of the prior art.

SUMMARY OF THE INVENTION

A primary objective of the present invention is to provide a self-balanced silicon-controlled rectification device, which uses an N-type doped well, a P-type doped well, at least one heavily doped clamping fin, at least one first P-type heavily doped fin, and at least one first N-type heavily doped fin to establish a plurality of silicon-controlled rectifiers (SCRs) which discharge uniform electrostatic discharge (ESD) currents, so as to reduce the semiconductor failures due to ESD and obtain a lower trigger voltage.

To achieve the abovementioned objectives, the present invention provides a self-balanced silicon-controlled rectification device, which comprises a substrate, an N-type doped well, a P-type doped well, at least one heavily doped clamping fin, at least one first P-type heavily doped fin, at least one first N-type heavily doped fin and an insulation layer, wherein the substrate is a semiconductor substrate. The N-type doped well is arranged in the substrate. The P-type doped well is arranged in the substrate and arranged adjacent to the N-type doped well. The heavily doped clamping fin is arranged in the N-type doped well and the P-type well and protruded up from a surface of the substrate. The first P-type heavily doped fin and the first N-type heavily doped fin are respectively arranged in the N-type doped well and the P-type doped well, respectively arranged at two opposite sides of the heavily doped clamping fin, and protruded up from the surface of the substrate, and the heavily doped clamping fin and each of the first P-type heavily doped fin and the first N-type heavily doped fin are spaced at a fixed interval, and the insulation layer is arranged on the surface of the substrate and arranged between the heavily doped clamping fin and each of the first P-type heavily doped fin and the first N-type heavily doped fin. The N-type doped well, the P-type doped well, the heavily doped clamping fin, the first P-type heavily doped fin and the first N-type heavily doped fin form a plurality of silicon-controlled rectifiers (SCRs), and the first P-type heavily doped fin and the first N-type heavily doped fin are respectively coupled to a high voltage terminal and a low voltage terminal, and voltages of the high voltage terminal and the low voltage terminal forward bias the SCRs to generate a plurality of uniform electrostatic discharge (ESD) currents through the SCRs.

In an embodiment, the heavily doped clamping fin is a P-type heavily doped clamping fin or an N-type heavily doped clamping fin. There are a plurality of heavily doped clamping fins arranged along a first direction, a plurality of first P-type heavily doped fins arranged along the first direction, and a plurality of first N-type heavily doped fins arranged along the first direction, and the insulation layer is arranged among the heavily doped clamping fins, arranged among the first P-type heavily doped fins and arranged among the first N-type heavily doped fins. A first contact is arranged on sidewalls and tops of the first P-type heavily doped fins and the insulation layer, and arranged along a second direction intersecting the first direction, and the first P-type heavily doped fins are coupled to the high voltage terminal via the first contact. A second contact is arranged on sidewalls and tops of the first N-type heavily doped fins and the insulation layer, and arranged along the second direction, and the first N-type heavily doped fins are coupled to the low voltage terminal via the second contact.

In an embodiment, the heavily doped clamping fin is a P-type heavily doped clamping fin or an N-type heavily doped clamping fin. The heavily doped clamping fin is arranged along a first direction, and the first P-type heavily doped fin is arranged along the first direction, and the first N-type heavily doped fin is arranged along the first direction. A plurality of first contacts is arranged on sidewalls and a top of the first P-type heavily doped fin and the insulation layer, and arranged along a second direction intersecting the first direction, and the first P-type heavily doped fin is coupled to the high voltage terminal via the first contacts. A plurality of second contacts is arranged on sidewalls and a top of the first N-type heavily doped fin and the insulation layer, and arranged along the second direction, and the first N-type heavily doped fin is coupled to the low voltage terminal via the second contacts.

In an embodiment, the heavily doped clamping fin is a P-type heavily doped clamping fin or an N-type heavily doped clamping fin. There are a plurality of heavily doped clamping fins arranged along a first direction, and the first P-type heavily doped fin is arranged along a second direction intersecting the first direction, and the first N-type heavily doped fin is arranged along the second direction, and the insulation layer is arranged among the heavily doped clamping fins. A plurality of first contacts is arranged on sidewalls and a top of the first P-type heavily doped fin and the insulation layer, and arranged along the first direction, and the first P-type heavily doped fin is coupled to the high voltage terminal via the first contacts. A plurality of second contacts is arranged on sidewalls and a top of the first N-type heavily doped fin and the insulation layer, and arranged along the first direction, and the first N-type heavily doped fin is coupled to the low voltage terminal via the second contacts.

In an embodiment, the heavily doped clamping fin is a P-type heavily doped clamping fin or an N-type heavily doped clamping fin. The heavily doped clamping fin is arranged along a first direction, and there are a plurality of first P-type heavily doped fins arranged along a second direction intersecting the first direction, and a plurality of first N-type heavily doped fins arranged along the second direction, and the insulation layer is arranged among the first P-type heavily doped fins and arranged among the first N-type heavily doped fins. A first contact is arranged on sidewalls and tops of the first P-type heavily doped fins and the insulation layer, and arranged along the first direction, and the first P-type heavily doped fins are coupled to the high voltage terminal via the first contact. A second contact is arranged on sidewalls and tops of the first N-type heavily doped fins and the insulation layer, and arranged along the first direction, and the first N-type heavily doped fins are coupled to the low voltage terminal via the second contact.

At least one heavily doped clamping fin comprises at least one P-type heavily doped clamping fin and at least one N-type heavily doped clamping fin, and the insulation layer is arranged among the heavily doped clamping fins.

In an embodiment, there are a plurality of P-type heavily doped clamping fins neighbored and arranged along a first direction, a plurality of N-type heavily doped clamping fins neighbored and arranged along the first direction, a plurality of first P-type heavily doped fins arranged along the first direction, and a plurality of first N-type heavily doped fins arranged along the first direction, and the insulation layer is arranged among the first P-type heavily doped fins and arranged among the first N-type heavily doped fins. A first contact is arranged on sidewalls and tops of the first P-type heavily doped fins and the insulation layer, and arranged along a second direction intersecting the first direction, and the first P-type heavily doped fins are coupled to the high voltage terminal via the first contact. A second contact is arranged on sidewalls and tops of the first N-type heavily doped fins and the insulation layer, and arranged along the second direction, and the first N-type heavily doped fins are coupled to the low voltage terminal via the second contact.

In an embodiment, the P-type heavily doped clamping fin is arranged along a first direction, and the N-type heavily doped clamping fin is arranged along the first direction, and the first P-type heavily doped fin is arranged along the first direction, and the first N-type heavily doped fin is arranged along the first direction. A plurality of first contacts is arranged on sidewalls and a top of the first P-type heavily doped fin and the insulation layer, and arranged along a second direction intersecting the first direction, and the first P-type heavily doped fin is coupled to the high voltage terminal via the first contacts. A plurality of second contacts is arranged on sidewalls and a top of the first N-type heavily doped fin and the insulation layer, and arranged along the second direction, and the first N-type heavily doped fin is coupled to the low voltage terminal via the second contacts.

In an embodiment, there are a plurality of P-type heavily doped clamping fins neighbored and arranged along a first direction and a plurality of N-type heavily doped clamping fins neighbored and arranged along the first direction. The first P-type heavily doped fin is arranged along a second direction intersecting the first direction, and the first N-type heavily doped fin is arranged along the second direction. A plurality of first contacts is arranged on sidewalls and a top of the first P-type heavily doped fin and the insulation layer, and arranged along the first direction, and the first P-type heavily doped fin is coupled to the high voltage terminal via the first contacts. A plurality of second contacts is arranged on sidewalls and a top of the first N-type heavily doped fin and the insulation layer, and arranged along the first direction, and the first N-type heavily doped fin is coupled to the low voltage terminal via the second contacts.

In an embodiment, the P-type heavily doped clamping fin is arranged along a first direction, and the N-type heavily doped clamping fin is arranged along the first direction. There are a plurality of first P-type heavily doped fins arranged along a second direction intersecting the first direction and a plurality of first N-type heavily doped fins arranged along the second direction. The insulation layer is arranged among the first P-type heavily doped fins and arranged among the first N-type heavily doped fins. A first contact is arranged on sidewalls and tops of the first P-type heavily doped fins and the insulation layer, and arranged along the first direction, and the first P-type heavily doped fins are coupled to the high voltage terminal via the first contact. A second contact is arranged on sidewalls and tops of the first N-type heavily doped fins and the insulation layer, and arranged along the first direction, and the first N-type heavily doped fins are coupled to the low voltage terminal via the second contact.

There are a plurality of P-type heavily doped clamping fins and a plurality of N-type heavily doped clamping fins, and the P-type heavily doped clamping fins and the N-type heavily doped clamping fins are arranged in an alternative way, and the insulation layer is arranged among the heavily doped clamping fins.

In an embodiment, the P-type heavily doped clamping fins and the N-type heavily doped clamping fins are arranged along a first direction. There are a plurality of first P-type heavily doped fins arranged along the first direction and a plurality of first N-type heavily doped fins arranged along the first direction. The insulation layer is arranged among the first P-type heavily doped fins and arranged among the first N-type heavily doped fins. A first contact is arranged on sidewalls and tops of the first P-type heavily doped fins and the insulation layer, and arranged along a second direction intersecting the first direction, and the first P-type heavily doped fins are coupled to the high voltage terminal via the first contact. A second contact is arranged on sidewalls and tops of the first N-type heavily doped fins and the insulation layer, and arranged along the second direction, and the first N-type heavily doped fins are coupled to the low voltage terminal via the second contact.

In an embodiment, the P-type heavily doped clamping fins are arranged along a first direction, and the N-type heavily doped clamping fins are arranged along the first direction, and the first P-type heavily doped fin is arranged along the first direction, and the first N-type heavily doped fin is arranged along the first direction. A plurality of first contacts is arranged on sidewalls and a top of the first P-type heavily doped fin and the insulation layer, and arranged along a second direction intersecting the first direction, and the first P-type heavily doped fin is coupled to the high voltage terminal via the first contacts. A plurality of second contacts is arranged on sidewalls and a top of the first N-type heavily doped fin and the insulation layer, and arranged along the second direction, and the first N-type heavily doped fin is coupled to the low voltage terminal via the second contacts.

In an embodiment, the P-type heavily doped clamping fins are arranged along a first direction, and the N-type heavily doped clamping fins are arranged along a second direction intersecting the first direction. There are a plurality of first P-type heavily doped fins arranged along the first direction and a plurality of first N-type heavily doped fins arranged along the first direction, and the insulation layer is arranged among the first P-type heavily doped fins and arranged among the first N-type heavily doped fins. A first contact is arranged on sidewalls and tops of the first P-type heavily doped fins and the insulation layer, and arranged along the second direction, and the first P-type heavily doped fins are coupled to the high voltage terminal via the first contact. A second contact is arranged on sidewalls and tops of the first N-type heavily doped fins and the insulation layer, and arranged along the second direction, and the first N-type heavily doped fins are coupled to the low voltage terminal via the second contact.

In an embodiment, the N-type heavily doped clamping fins are arranged along a first direction, and the P-type heavily doped clamping fins are arranged along a second direction intersecting the first direction. There are a plurality of first P-type heavily doped fins arranged along the first direction and a plurality of first N-type heavily doped fins arranged along the second direction, and the insulation layer is arranged among the first P-type heavily doped fins and arranged among the first N-type heavily doped fins. A first contact is arranged on sidewalls and tops of the first P-type heavily doped fins and the insulation layer, and arranged along the second direction, and the first P-type heavily doped fins are coupled to the high voltage terminal via the first contact. A second contact is arranged on sidewalls and tops of the first N-type heavily doped fins and the insulation layer, and arranged along the second direction, and the first N-type heavily doped fins are coupled to the low voltage terminal via the second contact.

Besides, the self-balanced silicon-controlled rectification device further comprises at least one second N-type heavily doped fin and at least one second P-type heavily doped fin. The second N-type heavily doped fin is arranged in the N-type doped well, protruded up from the surface of the substrate and coupled to the high voltage terminal, and the insulation layer is arranged between the second N-type heavily doped fin and each of the first P-type heavily doped fin and the heavily doped clamping fin. The second P-type heavily doped fin is arranged in the P-type doped well, protruded up from the surface of the substrate and coupled to the low voltage terminal, and the insulation layer is arranged between the second P-type heavily doped fin and each of the first N-type heavily doped fin and the heavily doped clamping fin.

In an embodiment, there are a plurality of second N-type heavily doped fins and a plurality of second P-type heavily doped fins, and the insulation layer is arranged among the second N-type heavily doped fins and arranged among the second P-type heavily doped fins. A third contact is arranged on sidewalls and tops of the second N-type heavily doped fins and the insulation layer and the second N-type heavily doped fins are coupled to the high voltage terminal via the third contact. A fourth contact is arranged on sidewalls and tops of the second P-type heavily doped fins and the insulation layer and the second P-type heavily doped fins are coupled to the low voltage terminal via the fourth contact.

In an embodiment, a plurality of third contacts is arranged on sidewalls and a top of the second N-type heavily doped fin and the insulation layer and the second N-type heavily doped fin is coupled to the high voltage terminal via the third contacts. A plurality of fourth contacts is arranged on sidewalls and a top of the second P-type heavily doped fin and the insulation layer and the second P-type heavily doped fin is coupled to the low voltage terminal via the fourth contacts.

In an embodiment, there is a plurality of second P-type heavily doped fins, and the insulation layer is arranged among the second P-type heavily doped fins. A plurality of third contacts is arranged on sidewalls and a top of the second N-type heavily doped fin and the insulation layer and the second N-type heavily doped fin is coupled to the high voltage terminal via the third contacts. A fourth contact is arranged on sidewalls and tops of the second P-type heavily doped fins and the insulation layer and the second P-type heavily doped fins are coupled to the low voltage terminal via the fourth contact.

In an embodiment, there is a plurality of second N-type heavily doped fins, and the insulation layer is arranged among the second N-type heavily doped fins. A third contact is arranged on sidewalls and tops of the second N-type heavily doped fins and the insulation layer and the second N-type heavily doped fins are coupled to the high voltage terminal via the third contact. A plurality of fourth contacts is arranged on sidewalls and a top of the second P-type heavily doped fin and the insulation layer and the second P-type heavily doped fin is coupled to the low voltage terminal via the fourth contacts.

Below, the embodiments are described in detail in cooperation with the drawings to make easily understood the technical contents, characteristics and accomplishments of the present invention.

BRIEF DESCRIPTION OF THE DRAWINGS

FIG. 120 is a layout schematically showing a self-balanced silicon-controlled rectification device according to the forty-sixth embodiment of the present invention;

FIG. 121 is a sectional view taken along Line L2-L2' of FIG. 120;

FIG. 122 is a sectional view taken along Line l2-l2' of FIG. 120;

FIG. 123 is a layout schematically showing a self-balanced silicon-controlled rectification device according to the forty-seventh embodiment of the present invention;

FIG. 124 is a sectional view taken along Line L3-L3' of FIG. 123;

FIG. 125 is a sectional view taken along Line I3-I3' of FIG. 123;

FIG. 126 is a layout schematically showing a self-balanced silicon-controlled rectification device according to the forty-eighth embodiment of the present invention;

FIG. 127 is a sectional view taken along Line L4-L4' of FIG. 126;

FIG. 128 is a sectional view taken along Line I4-I4' of FIG. 126; and

FIG. 129 is a diagram showing I-V characteristic curves of a conventional silicon-controlled rectifier (SCR), a P-type fin-based self-balanced silicon-controlled rectification device, an N-type fin-based self-balanced silicon-controlled rectification device and a PN-type fin-based self-balanced silicon-controlled rectification device according to an embodiment of the present invention.

DETAILED DESCRIPTION OF THE INVENTION

Figure 1:
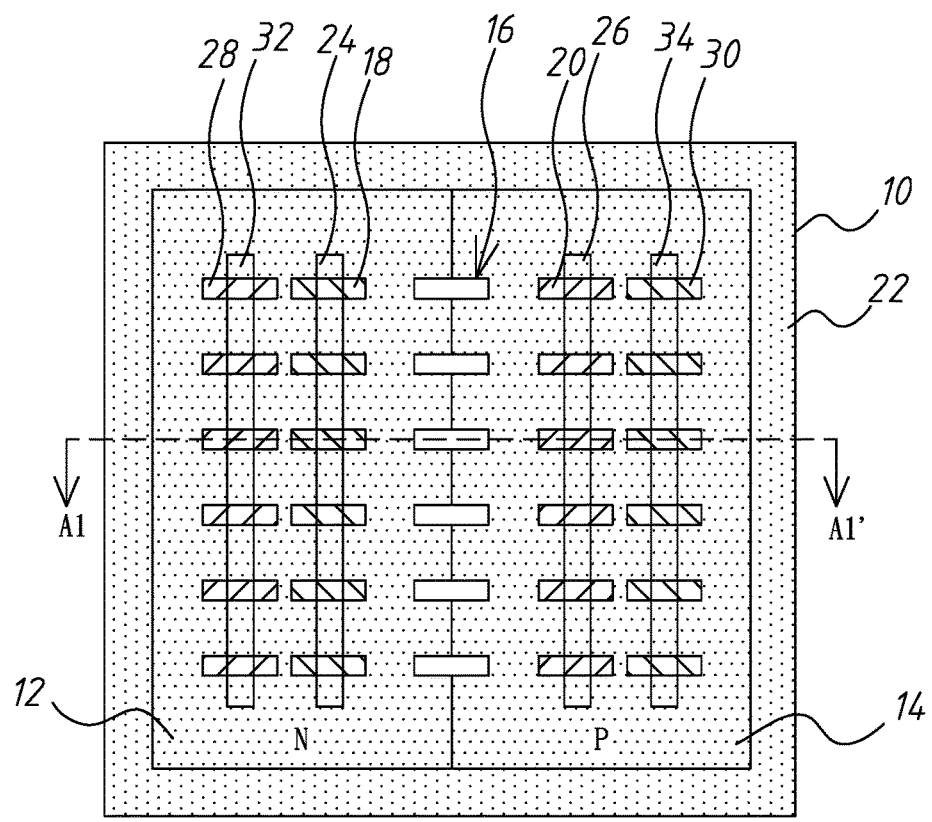
FIG. 1 is a layout schematically showing a self-balanced silicon-controlled rectification device according to the first embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

The self-balanced silicon-controlled rectification device of the present invention is used as an electrostatic discharge (ESD) protection structure needed for integrated circuits. In ESD protection, an ESD circuit is formed near integrated circuit terminals such as input and output pads, and also for power supply terminals. ESD protection circuits may provide a current discharge path so as to reduce the semiconductor failures due to ESD.

Figure 2:
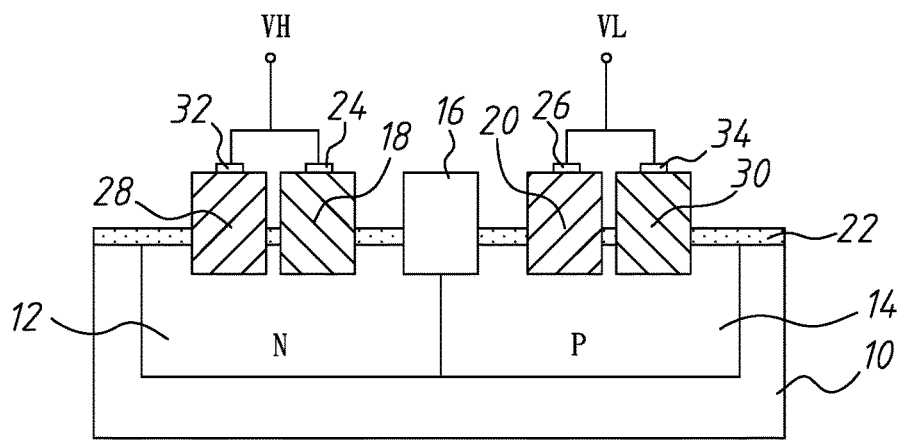
FIG. 2 is a sectional view taken along Line A1-A1' of FIG. 1.

Refer to FIG. 1 and FIG. 2. The first embodiment of the self-balanced silicon-controlled rectification device of the present invention is introduced as below. The first embodiment comprises a substrate 10, an N-type doped well 12, a P-type doped well 14, at least one heavily doped clamping fin 16, at least one first P-type heavily doped fin 18, at least one first N-type heavily doped fin 20, an insulation layer 22, at least one first contact 24, at least one second contact 26, at least one second N-type heavily doped fin 28, at least one second P-type heavily doped fin 30, at least one third contact 32 and at least one fourth contact 34, wherein the substrate 10 is a semiconductor substrate, and the heavily doped clamping fin 16 is a P-type heavily doped clamping fin or an N-type heavily doped clamping fin. Compared with a conventional fin-based silicon-controlled rectifier (SCR), the present invention adds the heavily doped clamping fins 16 to reduce the trigger voltage.

The N-type doped well 12 is arranged in the substrate 10. The P-type doped well 14 is arranged in the substrate 10 and arranged adjacent to the N-type doped well 12. The heavily doped clamping fin 16 is arranged in the N-type doped well 12 and the P-type well 14 and protruded up from a surface of the substrate 10. The first P-type heavily doped fin 18 and the first N-type heavily doped fin 20 are respectively arranged in the N-type doped well 12 and the P-type doped well 14, respectively arranged at two opposite sides of the heavily doped clamping fin 16, and protruded up from the surface of the substrate 10, and the heavily doped clamping fin 16 and each of the first P-type heavily doped fin 18 and the first N-type heavily doped fin 20 are spaced at a fixed interval, and the insulation layer 22 is arranged on the surface of the substrate 10 and arranged between the heavily doped clamping fin 16 and each of the first P-type heavily doped fin 18 and the first N-type heavily doped fin 20. The N-type doped well 12, the P-type doped well 14, the heavily doped clamping fins 16, the first P-type heavily doped fins 18 and the first N-type heavily doped fins 20 form a plurality of silicon-controlled rectifiers (SCRs), and the first P-type heavily doped fins 18 and the first N-type heavily doped fins 20 are respectively coupled to a high voltage terminal VH and a low voltage terminal VL, and voltages of the high voltage terminal VH and the low voltage terminal VL forward bias the SCRs to generate a plurality of uniform electrostatic discharge (ESD) currents through the SCRs, so as to reduce the semiconductor failures due to ESD and obtain a lower trigger voltage.

There are a plurality of heavily doped clamping fins 16 arranged along a first direction, a plurality of first P-type heavily doped fins 18 arranged along the first direction, and a plurality of first N-type heavily doped fins 20 arranged along the first direction, and the insulation layer 22 is arranged among the heavily doped clamping fins 16, arranged among the first P-type heavily doped fins 18 and arranged among the first N-type heavily doped fins 20. There are one first contact 24 and one second contact 26.

The first contact 24 is arranged on sidewalls and tops of the first P-type heavily doped fins 18 and the insulation layer 22, and arranged along a second direction intersecting the first direction. For example, the first direction is perpendicular to the second direction. The first P-type heavily doped fins 18 are coupled to the high voltage terminal VH via the first contact 24. The second contact 26 is arranged on sidewalls and tops of the first N-type heavily doped fins 20 and the insulation layer 22, and arranged along the second direction, and the first N-type heavily doped fins 20 are coupled to the low voltage terminal VL via the second contact 26.

The second N-type heavily doped fin 28 is arranged in the N-type doped well 12, protruded up from the surface of the substrate 10, arranged along the first direction and coupled to the high voltage terminal VH, and the insulation layer 22 is arranged between the second N-type heavily doped fin 28 and each of the first P-type heavily doped fin 18 and the heavily doped clamping fin 16. The second P-type heavily doped fin 30 is arranged in the P-type doped well 14, protruded up from the surface of the substrate 10, arranged along the first direction and coupled to the low voltage terminal VL, and the insulation layer 22 is arranged between the second P-type heavily doped fin 30 and each of the first N-type heavily doped fin 20 and the heavily doped clamping fin 16. The second N-type heavily doped fin 28 and the second P-type heavily doped fin 30 are used to stabilize the voltages of the N-type doped well 12 and the P-type doped well 14, whereby the breakdowns of the SCRs do not easily occur.

There are a plurality of second N-type heavily doped fins 28 and a plurality of second P-type heavily doped fins 30, and the insulation layer 22 is arranged among the second N-type heavily doped fins 28 and arranged among the second P-type heavily doped fins 30. There are one third contact 32 and one fourth contact 34 arranged along the second direction. The third contact 32 is arranged on sidewalls and tops of the second N-type heavily doped fins 28 and the insulation layer 22, and the second N-type heavily doped fins 28 are coupled to the high voltage terminal VH via the third contact 32. The fourth contact 34 is arranged on sidewalls and tops of the second P-type heavily doped fins 30 and the insulation layer 22, and the second P-type heavily doped fins 30 are coupled to the low voltage terminal VL via the fourth contact 34.

Figure 3:
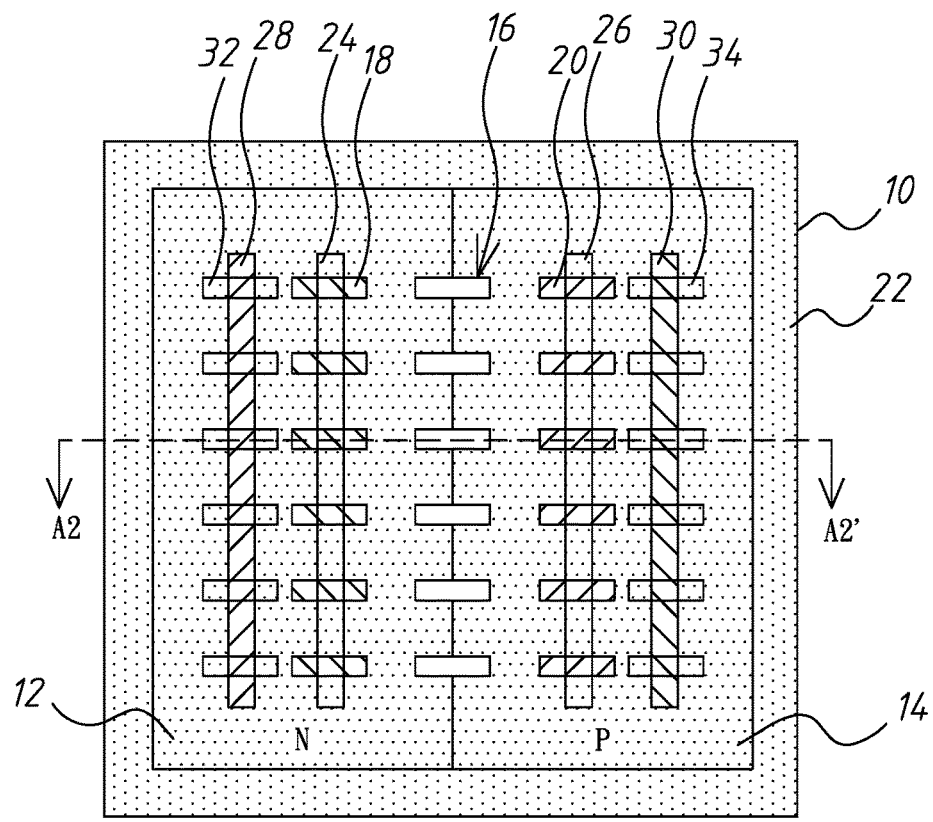
FIG. 3 is a layout schematically showing a self-balanced silicon-controlled rectification device according to the second embodiment of the present invention.
Figure 4:
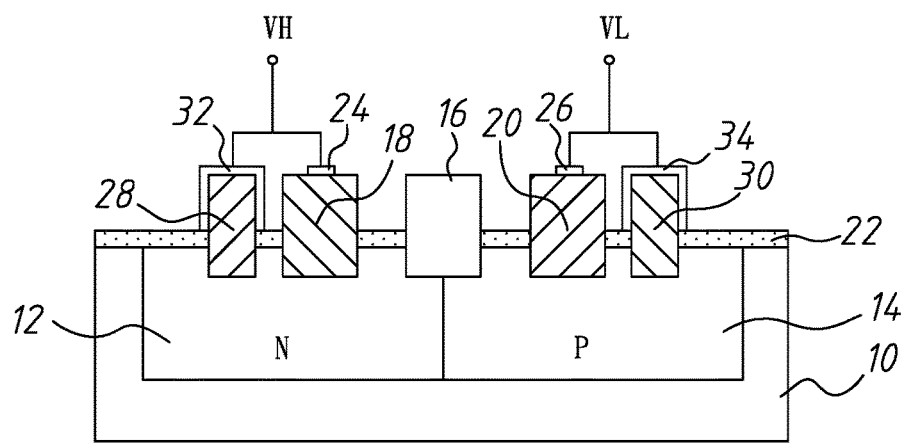
FIG. 4 is a sectional view taken along Line A2-A2' of FIG. 3.

Refer to FIG. 3 and FIG. 4. The second embodiment of the self-balanced silicon-controlled rectification device of the present invention is introduced as below. The second embodiment is different from the first embodiment in the direction and amount of the second N-type heavily doped fin 28, the second P-type heavily doped fin 30, the third contact 32 and the fourth contact 34. In the second embodiment, there are one second N-type heavily doped fin 28 arranged along the second direction, one second P-type heavily doped fin 30 arranged along the second direction, a plurality of third contacts 32 arranged along the first direction and a plurality of fourth contacts 34 arranged along the first direction. The third contacts 32 are arranged on sidewalls and a top of the second N-type heavily doped fin 28 and the insulation layer 22, and the second N-type heavily doped fin 28 is coupled to the high voltage terminal VH via the third contacts 32. The fourth contacts 34 are arranged on sidewalls and a top of the second P-type heavily doped fin 30 and the insulation layer 22, and the second P-type heavily doped fin 30 is coupled to the low voltage terminal VL via the fourth contacts 34.

Figure 5:
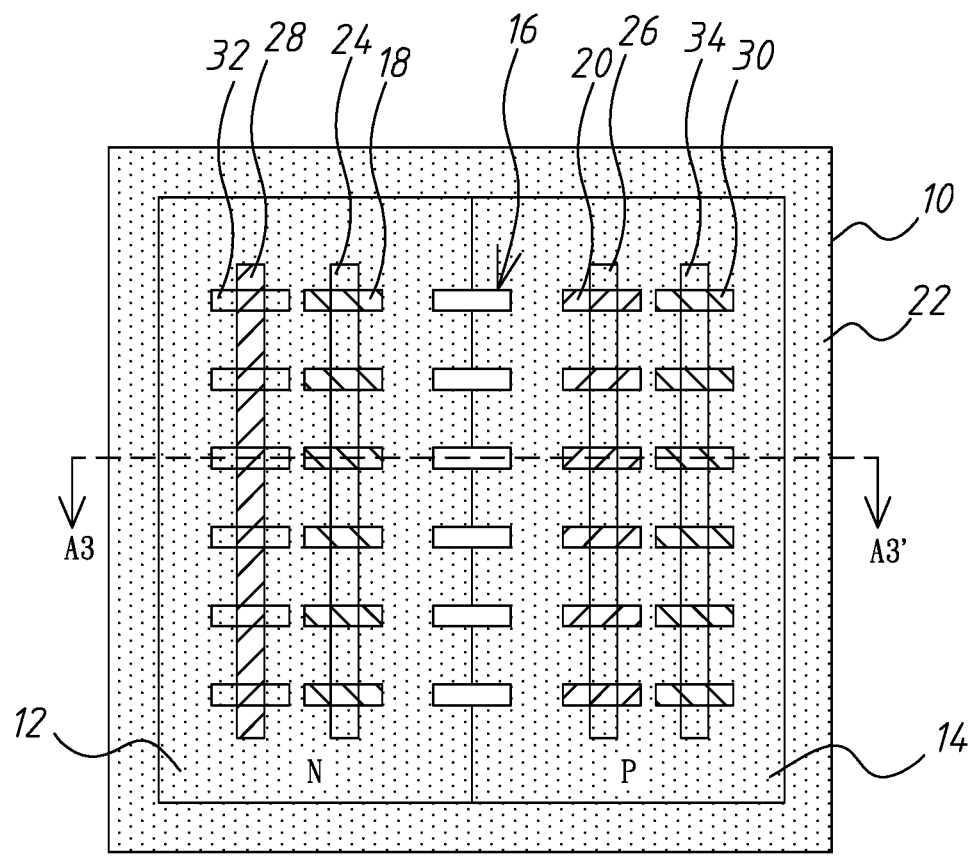
FIG. 5 is a layout schematically showing a self-balanced silicon-controlled rectification device according to the third embodiment of the present invention.
Figure 6:
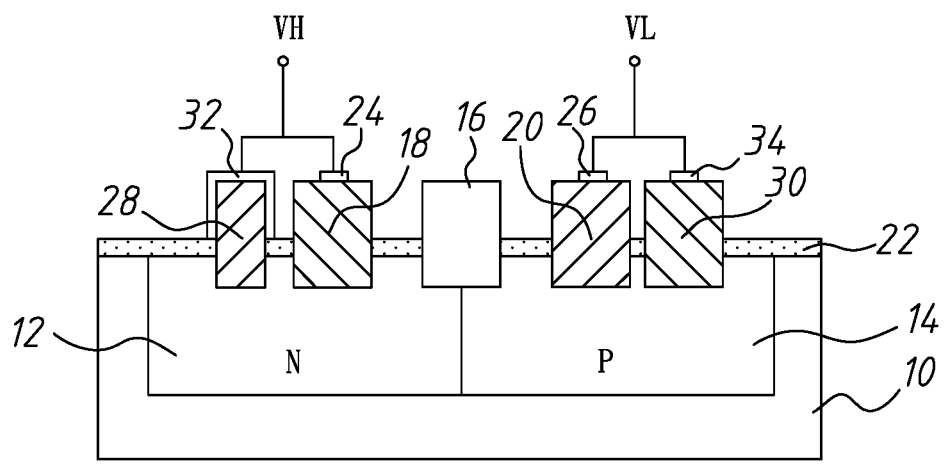
FIG. 6 is a sectional view taken along Line A3-A3' of FIG. 5.

Refer to FIG. 5 and FIG. 6. The third embodiment of the self-balanced silicon-controlled rectification device of the present invention is introduced as below. The third embodiment is different from the first embodiment in the direction and amount of the second N-type heavily doped fin 28 and the second P-type heavily doped fin 30. In the third embodiment, there is one second N-type heavily doped fin 28 arranged along the second direction, a plurality of second P-type heavily doped fins 30 arranged along the first direction, a plurality of third contacts 32 arranged along the first direction, and a fourth contact 34 arranged along the second direction, and the insulation layer 22 is arranged among the second P-type heavily doped fins 30. The third contacts 32 are arranged on sidewalls and a top of the second N-type heavily doped fin 28 and the insulation layer 22 and the second N-type heavily doped fin 28 is coupled to the high voltage terminal VH via the third contacts 32. The fourth contact 34 is arranged on sidewalls and tops of the second P-type heavily doped fins 30 and the insulation layer 22 and the second P-type heavily doped fins 30 are coupled to the low voltage terminal VL via the fourth contact 34.

Figure 7:
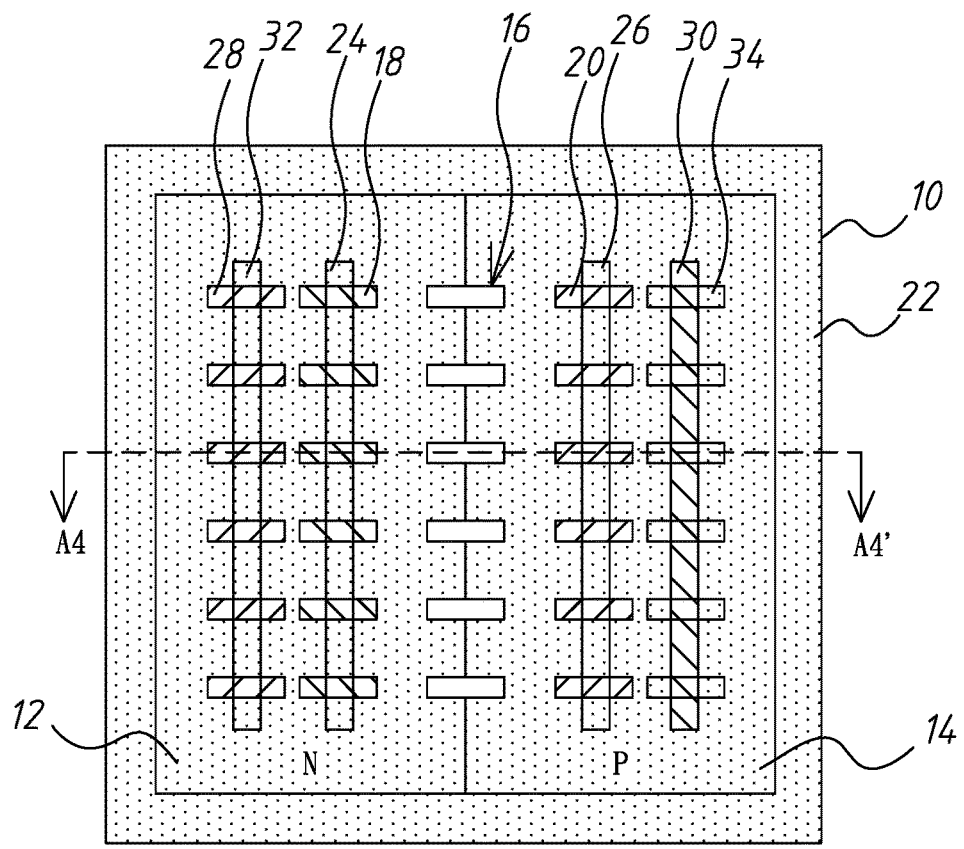
FIG. 7 is a layout schematically showing a self-balanced silicon-controlled rectification device according to the fourth embodiment of the present invention.
Figure 8:
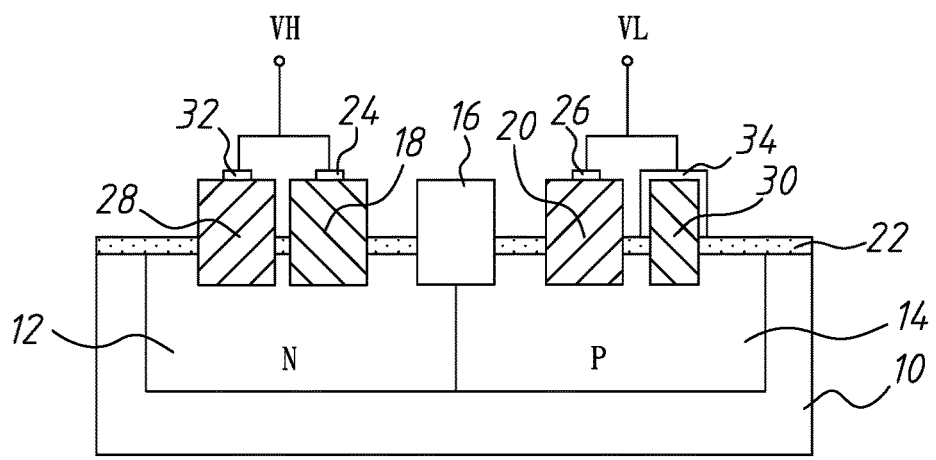
FIG. 8 is a sectional view taken along Line A4-A4' of FIG. 7.

Refer to FIG. 7 and FIG. 8. The fourth embodiment of the self-balanced silicon-controlled rectification device of the present invention is introduced as below. The fourth embodiment is different from the first embodiment in the direction and amount of the second P-type heavily doped fin 30 and the fourth contact 34. In the fourth embodiment, there are a plurality of second N-type heavily doped fins 28 arranged along the first direction, one second P-type heavily doped fin 30 arranged along the second direction, one third contact 32 arranged along the second direction, and a plurality of fourth contacts 34 arranged along the first direction, and the insulation layer 22 is arranged among the second N-type heavily doped fins 28. The third contact 32 is arranged on sidewalls and tops of the second N-type heavily doped fins 28 and the insulation layer 22, and the second N-type heavily doped fins 28 are coupled to the high voltage terminal VH via the third contact 32. The fourth contacts 34 are arranged on sidewalls and a top of the second P-type heavily doped fin 30 and the insulation layer 22, and the second P-type heavily doped fin 30 is coupled to the low voltage terminal VL via the fourth contacts 34.

Figure 9:
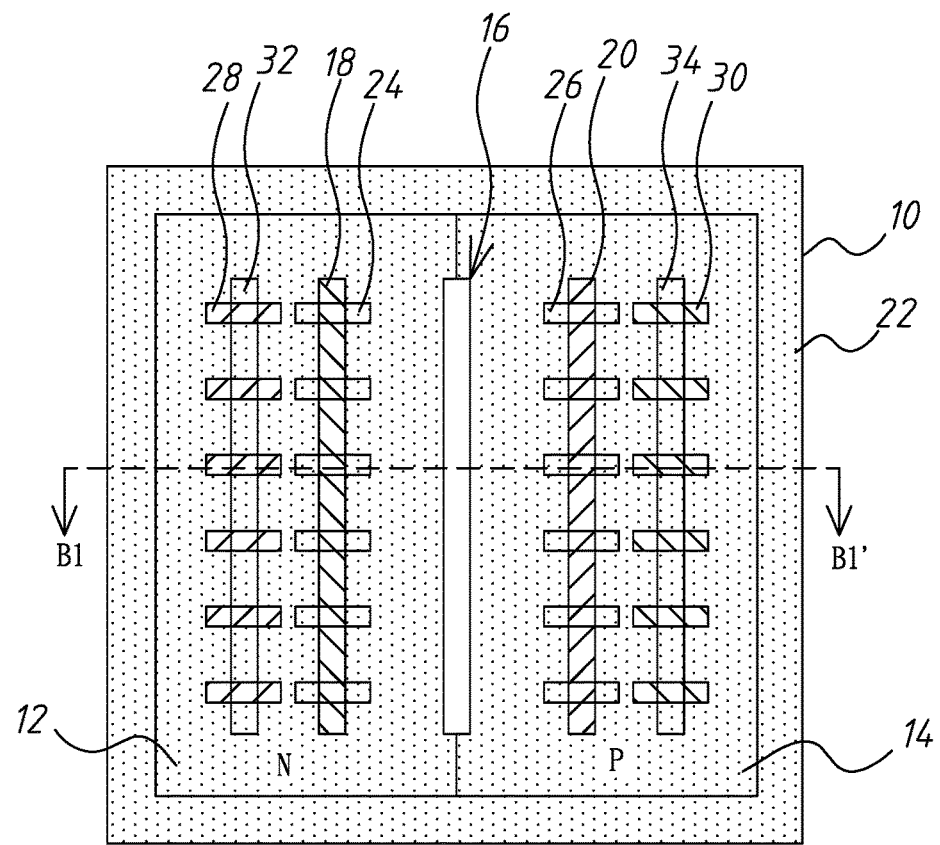
FIG. 9 is a layout schematically showing a self-balanced silicon-controlled rectification device according to the fifth embodiment of the present invention.
Figure 10:
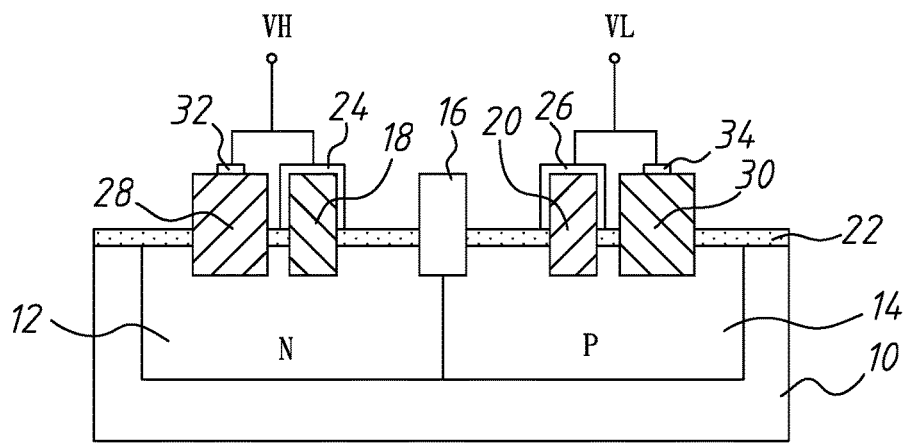
FIG. 10 is a sectional view taken along Line B1-B1' of FIG. 9.

Refer to FIG. 9 and FIG. 10. The fifth embodiment of the self-balanced silicon-controlled rectification device of the present invention is introduced as below. The fifth embodiment comprises a substrate 10, an N-type doped well 12, a P-type doped well 14, one heavily doped clamping fin 16, one first P-type heavily doped fin 18, one first N-type heavily doped fin 20, an insulation layer 22, a plurality of first contacts 24, a plurality of second contacts 26, a plurality of second N-type heavily doped fins 28, a plurality of second P-type heavily doped fins 30, one third contact 32 and one fourth contact 34, wherein the substrate 10 is a semiconductor substrate, and the heavily doped clamping fin 16 is a P-type heavily doped clamping fin or an N-type heavily doped clamping fin. Compared with a conventional fin-based silicon-controlled rectifier (SCR), the present invention adds the heavily doped clamping fins 16 to reduce the trigger voltage.

The N-type doped well 12 is arranged in the substrate 10. The P-type doped well 14 is arranged in the substrate 10 and arranged adjacent to the N-type doped well 12. The heavily doped clamping fin 16 is arranged in the N-type doped well 12 and the P-type well 14 and protruded up from a surface of the substrate 10. The first P-type heavily doped fin 18 and the first N-type heavily doped fin 20 are respectively arranged in the N-type doped well 12 and the P-type doped well 14, respectively arranged at two opposite sides of the heavily doped clamping fin 16, and protruded up from the surface of the substrate 10, and the heavily doped clamping fin 16 and each of the first P-type heavily doped fin 18 and the first N-type heavily doped fin 20 are spaced at a fixed interval, and the insulation layer 22 is arranged on the surface of the substrate 10 and arranged between the heavily doped clamping fin 16 and each of the first P-type heavily doped fin 18 and the first N-type heavily doped fin 20. The N-type doped well 12, the P-type doped well 14, the heavily doped clamping fin 16, the first P-type heavily doped fin 18 and the first N-type heavily doped fin 20 form a plurality of silicon-controlled rectifiers (SCRs), and the first P-type heavily doped fin 18 and the first N-type heavily doped fin 20 are respectively coupled to a high voltage terminal VH and a low voltage terminal VL, and voltages of the high voltage terminal VH and the low voltage terminal VL forward bias the SCRs to generate a plurality of uniform electrostatic discharge (ESD) currents through the SCRs, so as to reduce the semiconductor failures due to ESD and obtain a lower trigger voltage.

The heavily doped clamping fin 16 is arranged along a first direction, and the first P-type heavily doped fin 18 is arranged along the first direction, and the first N-type heavily doped fin 20 is arranged along the first direction. The first contacts 24 are arranged on sidewalls and a top of the first P-type heavily doped fin 18 and the insulation layer 22, and arranged along a second direction intersecting the first direction, and the first P-type heavily doped fin 18 is coupled to the high voltage terminal VH via the first contacts 24. For example, the first direction is perpendicular to the second direction. The second contacts 26 are arranged on sidewalls and a top of the first N-type heavily doped fin 20 and the insulation layer 22, and arranged along the second direction, and the first N-type heavily doped fin 20 is coupled to the low voltage terminal VL via the second contacts 26.

The second N-type heavily doped fins 28 are arranged in the N-type doped well 12, protruded up from the surface of the substrate 10, arranged along the second direction and coupled to the high voltage terminal VH, and the insulation layer 22 is arranged between the second N-type heavily doped fin 28 and each of the first P-type heavily doped fin 18 and the heavily doped clamping fin 16. The second P-type heavily doped fins 30 are arranged in the P-type doped well 14, protruded up from the surface of the substrate 10, arranged along the second direction and coupled to the low voltage terminal VL, and the insulation layer 22 is arranged between the second P-type heavily doped fin 30 and each of the first N-type heavily doped fin 20 and the heavily doped clamping fin 16. The second N-type heavily doped fin 28 and the second P-type heavily doped fin 30 are used to stabilize the voltages of the N-type doped well 12 and the P-type doped well 14, whereby the breakdowns of the SCRs do not easily occur.

The insulation layer 22 is arranged among the second N-type heavily doped fins 28 and arranged among the second P-type heavily doped fins 30. The third contact 32 and the fourth contact 34 are arranged along the first direction. The third contact 32 is arranged on sidewalls and tops of the second N-type heavily doped fins 28 and the insulation layer 22, and the second N-type heavily doped fins 28 are coupled to the high voltage terminal VH via the third contact 32. The fourth contact 34 is arranged on sidewalls and tops of the second P-type heavily doped fins 30 and the insulation layer 22, and the second P-type heavily doped fins 30 are coupled to the low voltage terminal VL via the fourth contact 34.

Figure 11:
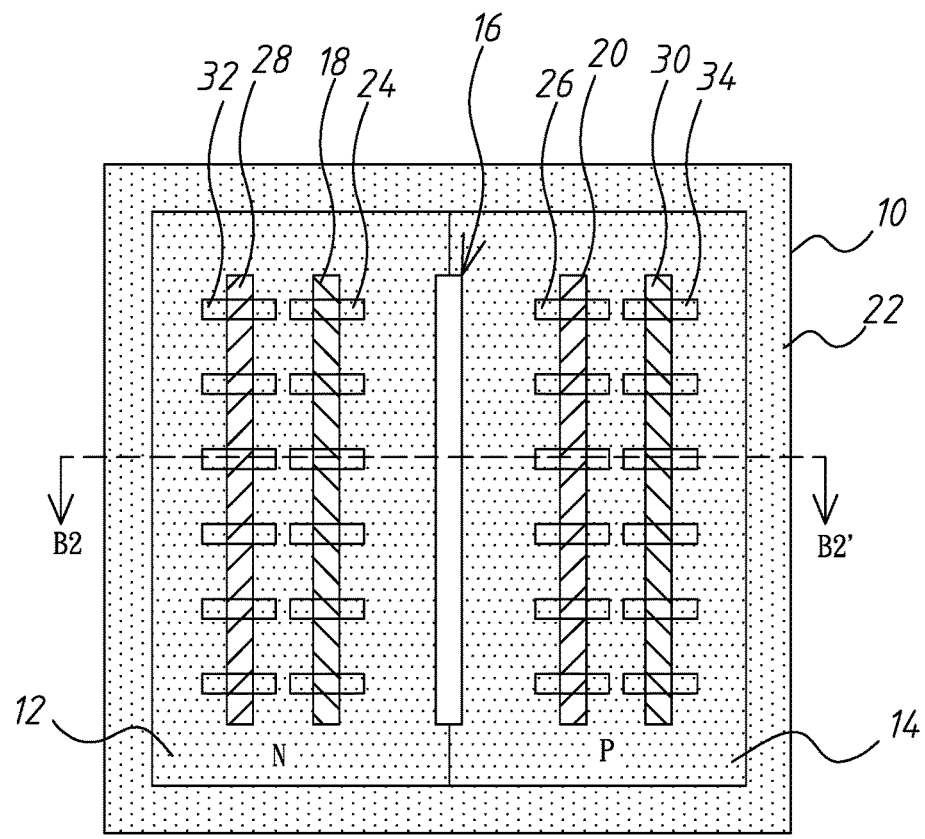
FIG. 11 is a layout schematically showing a self-balanced silicon-controlled rectification device according to the sixth embodiment of the present invention.
Figure 12:
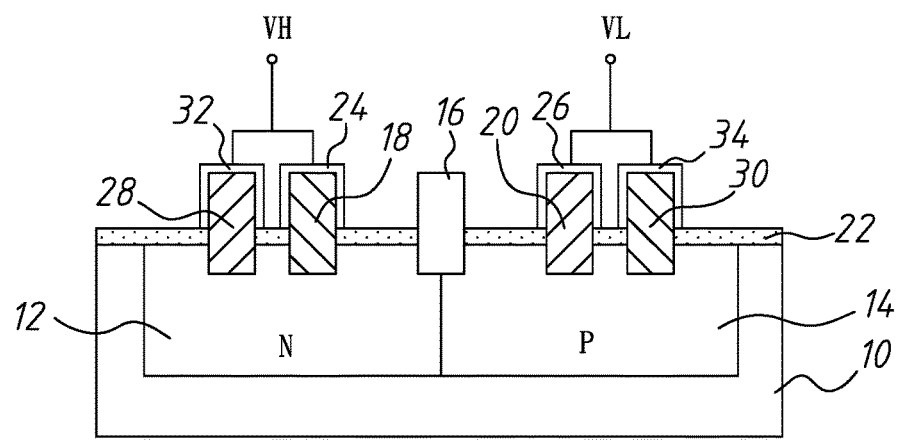
FIG. 12 is a sectional view taken along Line B2-B2' of FIG. 11.

Refer to FIG. 11 and FIG. 12. The sixth embodiment of the self-balanced silicon-controlled rectification device of the present invention is introduced as below. The sixth embodiment is different from the fifth embodiment in the direction and amount of the second N-type heavily doped fin 28, the second P-type heavily doped fin 30, the third contact 32 and the fourth contact 34. In the sixth embodiment, there are one second N-type heavily doped fin 28 arranged along the first direction, one second P-type heavily doped fin 30 arranged along the first direction, a plurality of third contacts 32 arranged along the second direction and a plurality of fourth contacts 34 arranged along the second direction. The third contacts 32 are arranged on sidewalls and a top of the second N-type heavily doped fin 28 and the insulation layer 22, and the second N-type heavily doped fin 28 is coupled to the high voltage terminal VH via the third contacts 32. The fourth contacts 34 are arranged on sidewalls and a top of the second P-type heavily doped fin 30 and the insulation layer 22, and the second P-type heavily doped fin 30 is coupled to the low voltage terminal VL via the fourth contacts 34.

Figure 13:
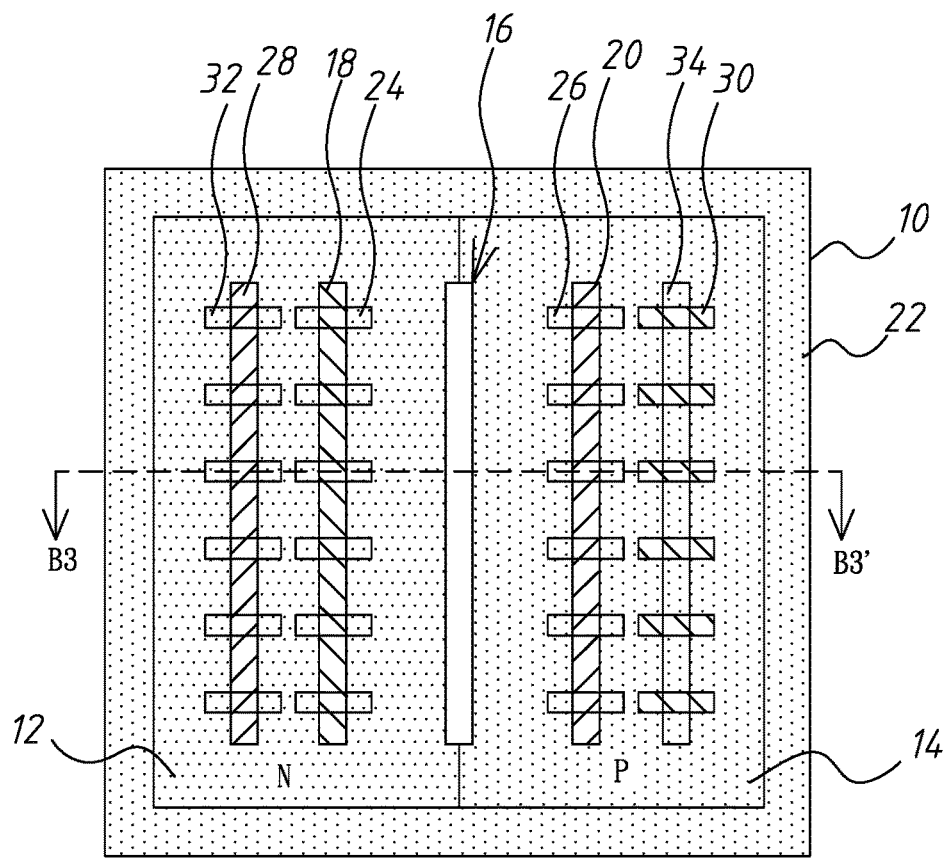
FIG. 13 is a layout schematically showing a self-balanced silicon-controlled rectification device according to the seventh embodiment of the present invention.
Figure 14:
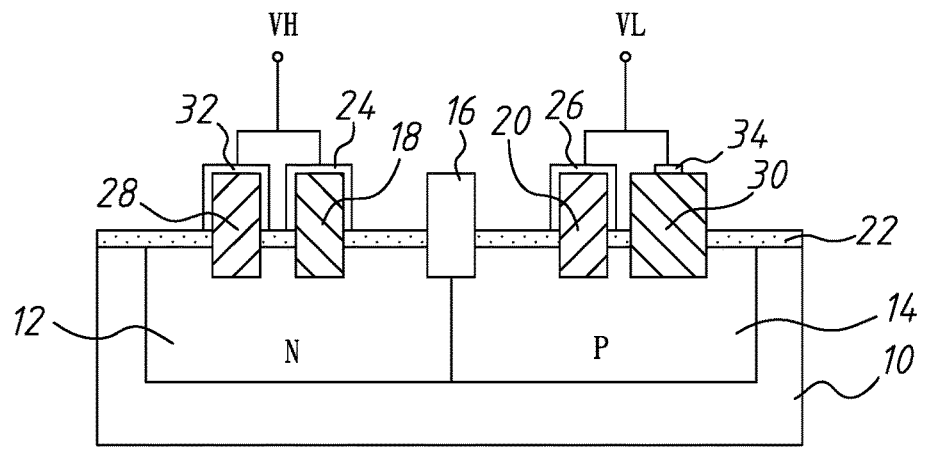
FIG. 14 is a sectional view taken along Line B3-B3' of FIG. 13.

Refer to FIG. 13 and FIG. 14. The seventh embodiment of the self-balanced silicon-controlled rectification device of the present invention is introduced as below. The seventh embodiment is different from the fifth embodiment in the direction and amount of the second N-type heavily doped fin 28 and the third contact 32. In the seventh embodiment, there is one second N-type heavily doped fin 28 arranged along the first direction, a plurality of second P-type heavily doped fins 30 arranged along the second direction, a plurality of third contacts 32 arranged along the second direction, and a fourth contact 34 arranged along the first direction, and the insulation layer 22 is arranged among the second P-type heavily doped fins 30. The third contacts 32 are arranged on sidewalls and a top of the second N-type heavily doped fin 28 and the insulation layer 22, and the second N-type heavily doped fin 28 is coupled to the high voltage terminal VH via the third contacts 32. The fourth contact 34 is arranged on sidewalls and tops of the second P-type heavily doped fins 30 and the insulation layer 22, and the second P-type heavily doped fins 30 are coupled to the low voltage terminal VL via the fourth contact 34.

Figure 15:
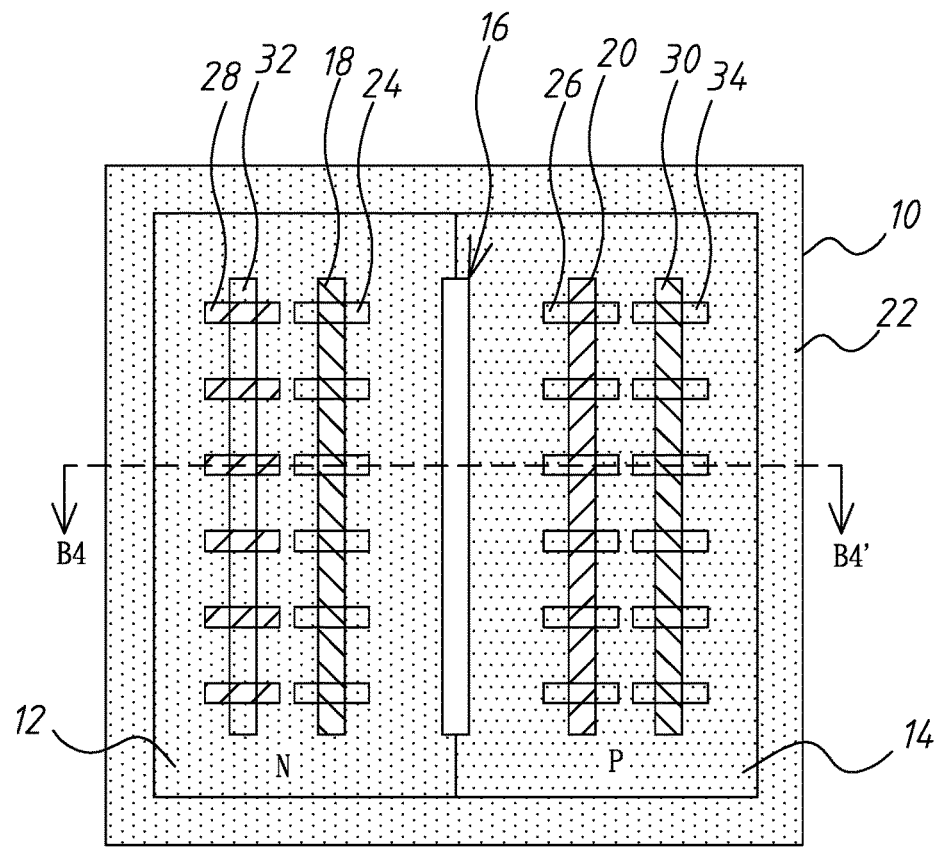
FIG. 15 is a layout schematically showing a self-balanced silicon-controlled rectification device according to the eighth embodiment of the present invention.
Figure 16:
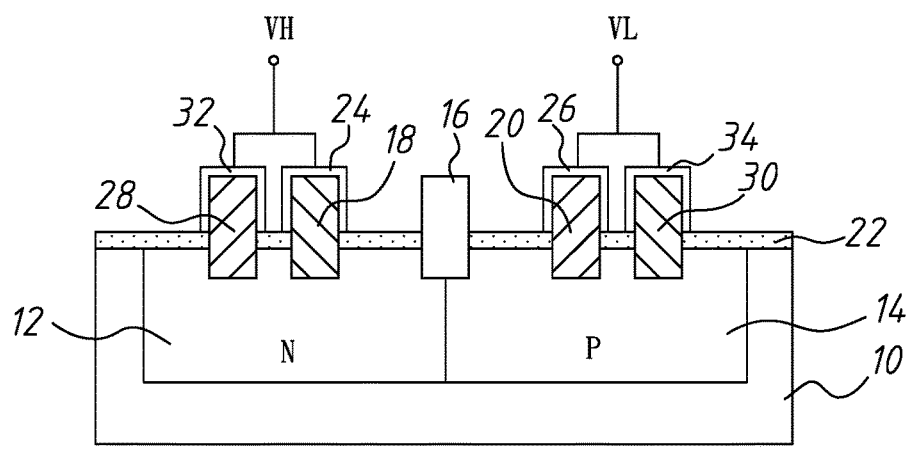
FIG. 16 is a sectional view taken along Line B4-B4' of FIG. 15.

Refer to FIG. 15 and FIG. 16. The eighth embodiment of the self-balanced silicon-controlled rectification device of the present invention is introduced as below. The eighth embodiment is different from the fifth embodiment in the direction and amount of the second P-type heavily doped fin 30 and the fourth contact 34. In the eighth embodiment, there are a plurality of second N-type heavily doped fins 28 arranged along the second direction, one second P-type heavily doped fin 30 arranged along the first direction, one third contact 32 arranged along the first direction, and a plurality of fourth contacts 34 arranged along the second direction, and the insulation layer 22 is arranged among the second N-type heavily doped fins 28. The third contact 32 is arranged on sidewalls and tops of the second N-type heavily doped fins 28 and the insulation layer 22, and the second N-type heavily doped fins 28 are coupled to the high voltage terminal VH via the third contact 32. The fourth contacts 34 are arranged on sidewalls and a top of the second P-type heavily doped fin 30 and the insulation layer 22, and the second P-type heavily doped fin 30 is coupled to the low voltage terminal VL via the fourth contacts 34.

Figure 17:
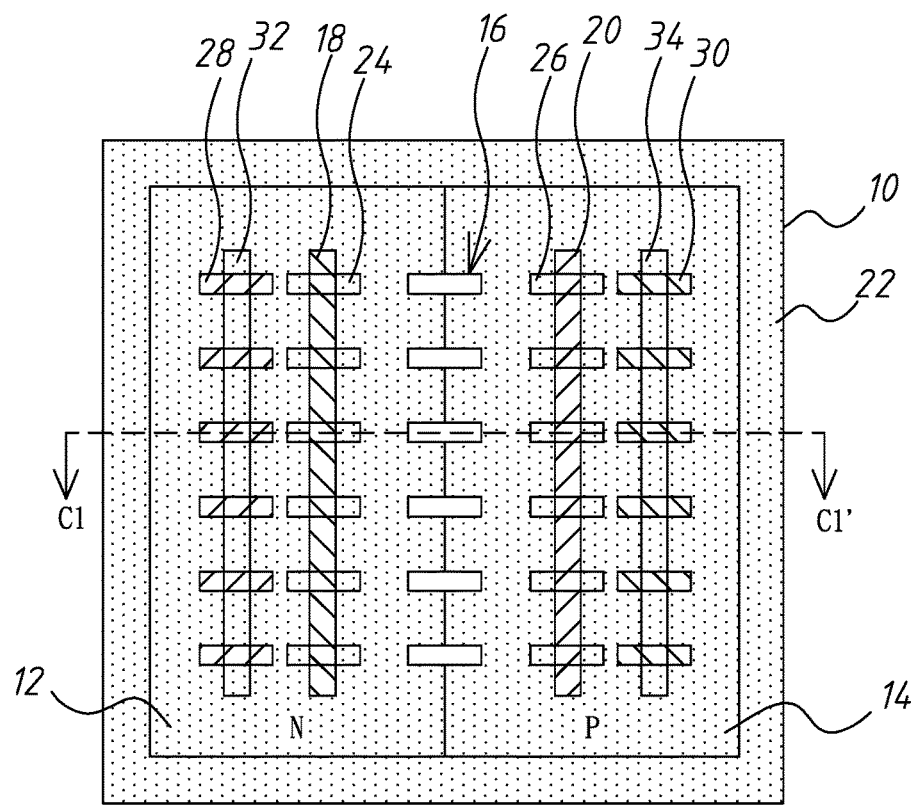
FIG. 17 is a layout schematically showing a self-balanced silicon-controlled rectification device according to the ninth embodiment of the present invention.
Figure 18:
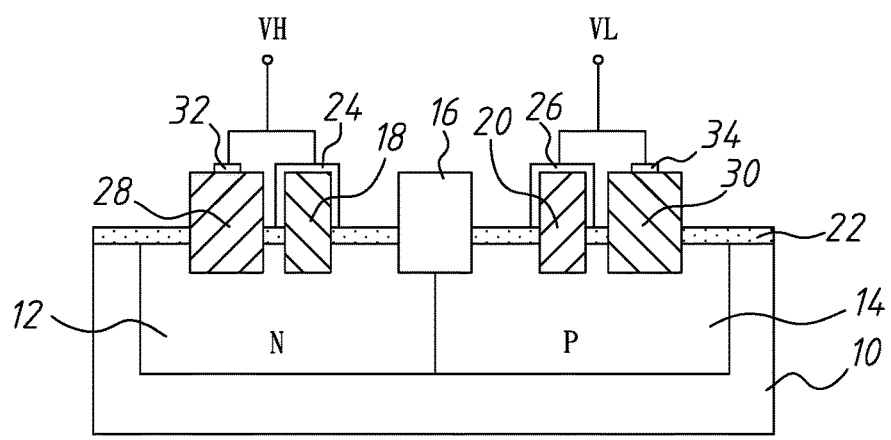
FIG. 18 is a sectional view taken along Line C1-C1' of FIG. 17.

Refer to FIG. 17 and FIG. 18. The ninth embodiment of the self-balanced silicon-controlled rectification device of the present invention is introduced as below. The ninth embodiment comprises a substrate 10, an N-type doped well 12, a P-type doped well 14, a plurality of heavily doped clamping fins 16, one first P-type heavily doped fin 18, one first N-type heavily doped fin 20, an insulation layer 22, a plurality of first contacts 24, a plurality of second contacts 26, a plurality of second N-type heavily doped fin 28, a plurality of second P-type heavily doped fin 30, one third contact 32 and one fourth contact 34, wherein the substrate 10 is a semiconductor substrate, and the heavily doped clamping fin 16 is a P-type heavily doped clamping fin or an N-type heavily doped clamping fin. Compared with a conventional fin-based silicon-controlled rectifier (SCR), the present invention adds the heavily doped clamping fins 16 to reduce the trigger voltage.

The N-type doped well 12 is arranged in the substrate 10. The P-type doped well 14 is arranged in the substrate 10 and arranged adjacent to the N-type doped well 12. The heavily doped clamping fins 16 are arranged in the N-type doped well 12 and the P-type well 14 and protruded up from a surface of the substrate 10. The first P-type heavily doped fin 18 and the first N-type heavily doped fin 20 are respectively arranged in the N-type doped well 12 and the P-type doped well 14, respectively arranged at two opposite sides of the heavily doped clamping fins 16, and protruded up from the surface of the substrate 10, and the heavily doped clamping fin 16 and each of the first P-type heavily doped fin 18 and the first N-type heavily doped fin 20 are spaced at a fixed interval, and the insulation layer 22 is arranged on the surface of the substrate 10 and arranged between the heavily doped clamping fin 16 and each of the first P-type heavily doped fin 18 and the first N-type heavily doped fin 20. The N-type doped well 12, the P-type doped well 14, the heavily doped clamping fins 16, the first P-type heavily doped fin 18 and the first N-type heavily doped fin 20 form a plurality of silicon-controlled rectifiers (SCRs), and the first P-type heavily doped fin 18 and the first N-type heavily doped fin 20 are respectively coupled to a high voltage terminal VH and a low voltage terminal VL, and voltages of the high voltage terminal VH and the low voltage terminal VL forward bias the SCRs to generate a plurality of uniform electrostatic discharge (ESD) currents through the SCRs, so as to reduce the semiconductor failures due to ESD and obtain a lower trigger voltage.

The heavily doped clamping fins 16 are arranged along a first direction, and the first P-type heavily doped fin 18 is arranged along a second direction intersecting the first direction, and the first N-type heavily doped fin 20 is arranged along the second direction, and the insulation layer 22 is arranged among the heavily doped clamping fins 16. For example, the first direction is perpendicular to the second direction. The first contacts 24 are arranged on sidewalls and a top of the first P-type heavily doped fin 18 and the insulation layer 22, and arranged along the first direction, and the first P-type heavily doped fin 18 is coupled to the high voltage terminal VH via the first contacts 24. The second contacts 26 are arranged on sidewalls and a top of the first N-type heavily doped fin 20 and the insulation layer 22, and arranged along the first direction, and the first N-type heavily doped fin 20 is coupled to the low voltage terminal VL via the second contacts 26.

The second N-type heavily doped fins 28 are arranged in the N-type doped well 12, protruded up from the surface of the substrate 10, arranged along the first direction and coupled to the high voltage terminal VH, and the insulation layer 22 is arranged between the second N-type heavily doped fin 28 and each of the first P-type heavily doped fin 18 and the heavily doped clamping fin 16. The second P-type heavily doped fins 30 are arranged in the P-type doped well 14, protruded up from the surface of the substrate 10, arranged along the first direction and coupled to the low voltage terminal VL, and the insulation layer 22 is arranged between the second P-type heavily doped fin 30 and each of the first N-type heavily doped fin 20 and the heavily doped clamping fin 16. The second N-type heavily doped fin 28 and the second P-type heavily doped fin 30 are used to stabilize the voltages of the N-type doped well 12 and the P-type doped well 14, whereby the breakdowns of the SCRs do not easily occur.

The insulation layer 22 is arranged among the second N-type heavily doped fins 28 and arranged among the second P-type heavily doped fins 30. The third contact 32 and the fourth contact 34 are arranged along the second direction. The third contact 32 is arranged on sidewalls and tops of the second N-type heavily doped fins 28 and the insulation layer 22, and the second N-type heavily doped fins 28 are coupled to the high voltage terminal VH via the third contact 32. The fourth contact 34 is arranged on sidewalls and tops of the second P-type heavily doped fins 30 and the insulation layer 22, and the second P-type heavily doped fins 30 are coupled to the low voltage terminal VL via the fourth contact 34.

Figure 19:
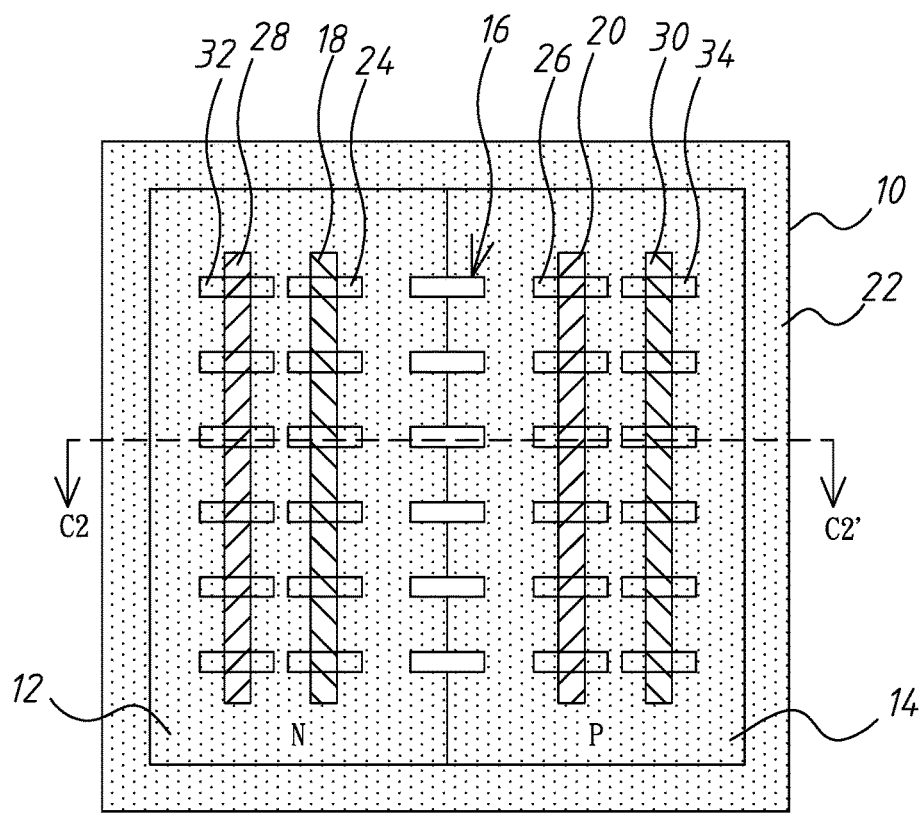
FIG. 19 is a layout schematically showing a self-balanced silicon-controlled rectification device according to the tenth embodiment of the present invention.
Figure 20:
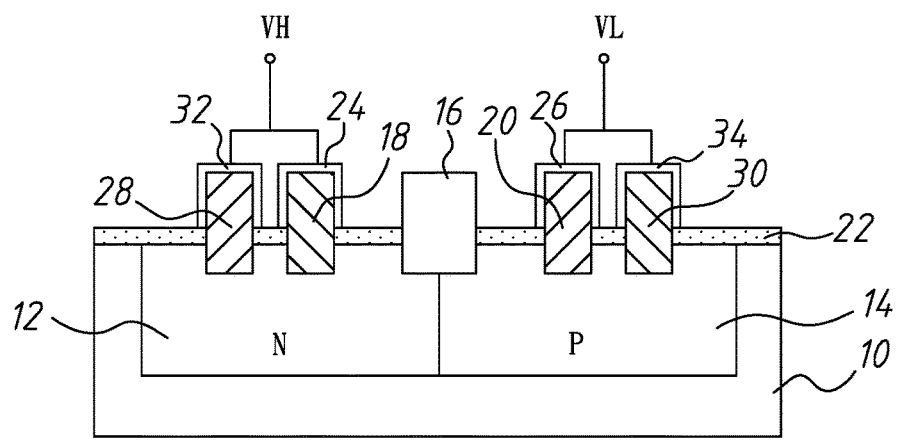
FIG. 20 is a sectional view taken along Line C2-C2' of FIG. 19.

Refer to FIG. 19 and FIG. 20. The tenth embodiment of the self-balanced silicon-controlled rectification device of the present invention is introduced as below. The tenth embodiment is different from the ninth embodiment in the direction and amount of the second N-type heavily doped fin 28, the second P-type heavily doped fin 30, the third contact 32 and the fourth contact 34. In the tenth embodiment, there are one second N-type heavily doped fin 28 arranged along the second direction, one second P-type heavily doped fin 30 arranged along the second direction, a plurality of third contacts 32 arranged along the first direction and a plurality of fourth contacts 34 arranged along the first direction. The third contacts 32 are arranged on sidewalls and a top of the second N-type heavily doped fin 28 and the insulation layer 22, and the second N-type heavily doped fin 28 is coupled to the high voltage terminal VH via the third contacts 32. The fourth contacts 34 are arranged on sidewalls and a top of the second P-type heavily doped fin 30 and the insulation layer 22, and the second P-type heavily doped fin 30 is coupled to the low voltage terminal VL via the fourth contacts 34.

Figure 21:
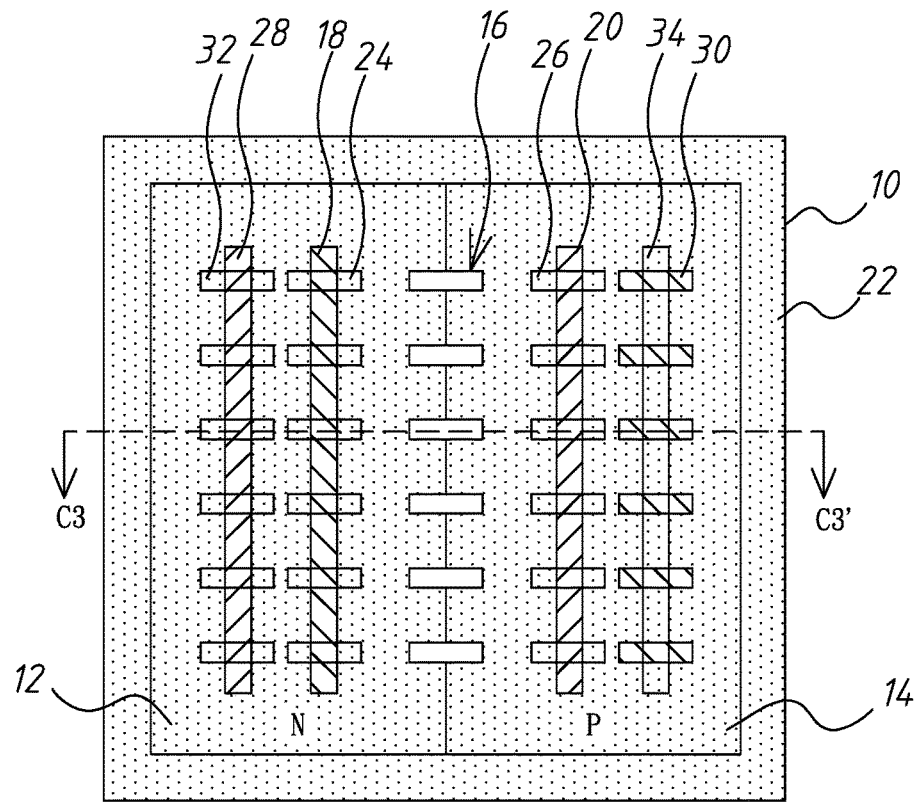
FIG. 21 is a layout schematically showing a self-balanced silicon-controlled rectification device according to the eleventh embodiment of the present invention.
Figure 22:
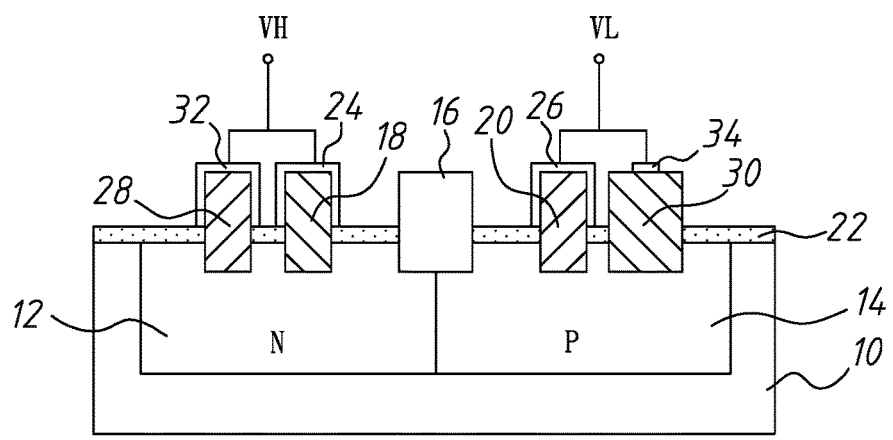
FIG. 22 is a sectional view taken along Line C3-C3' of FIG. 21.

Refer to FIG. 21 and FIG. 22. The eleventh embodiment of the self-balanced silicon-controlled rectification device of the present invention is introduced as below. The eleventh embodiment is different from the ninth embodiment in the direction and amount of the second N-type heavily doped fin 28 and the third contact 32. In the eleventh embodiment, there is one second N-type heavily doped fin 28 arranged along the second direction, a plurality of second P-type heavily doped fins 30 arranged along the first direction, a plurality of third contacts 32 arranged along the first direction, and a fourth contact 34 arranged along the second direction, and the insulation layer 22 is arranged among the second P-type heavily doped fins 30. The third contacts 32 are arranged on sidewalls and a top of the second N-type heavily doped fin 28 and the insulation layer 22, and the second N-type heavily doped fin 28 is coupled to the high voltage terminal VH via the third contacts 32. The fourth contact 34 is arranged on sidewalls and tops of the second P-type heavily doped fins 30 and the insulation layer 22, and the second P-type heavily doped fins 30 are coupled to the low voltage terminal VL via the fourth contact 34.

Figure 23:
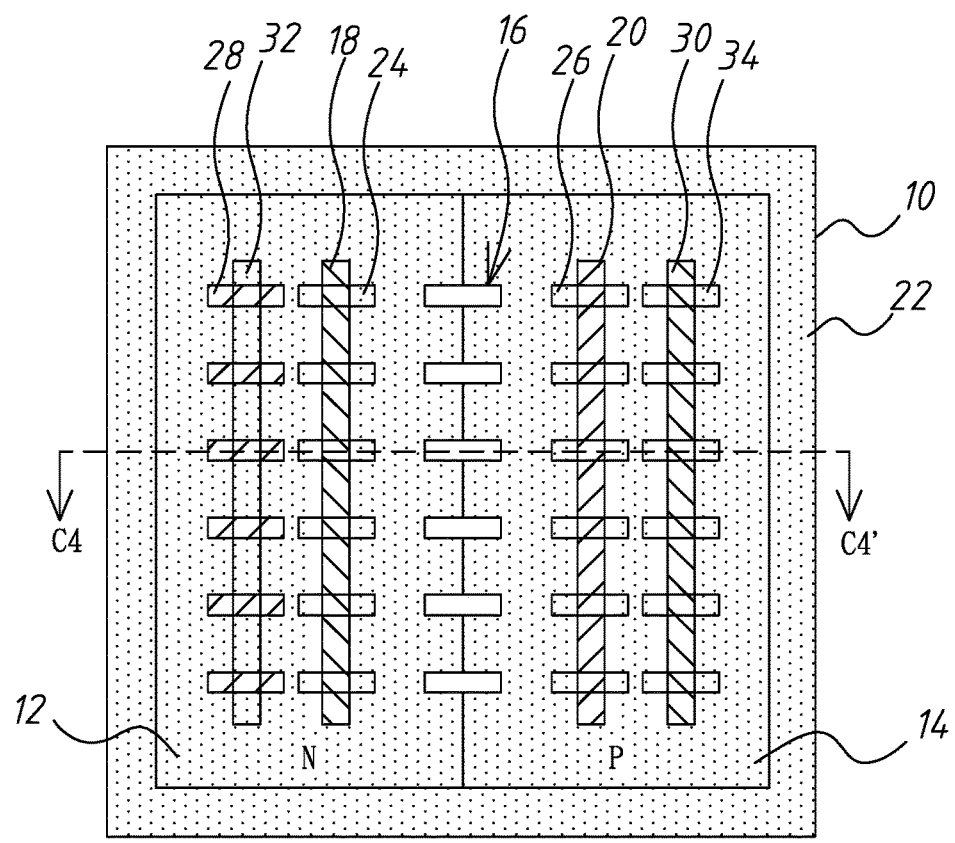
FIG. 23 is a layout schematically showing a self-balanced silicon-controlled rectification device according to the twelfth embodiment of the present invention.
Figure 24:
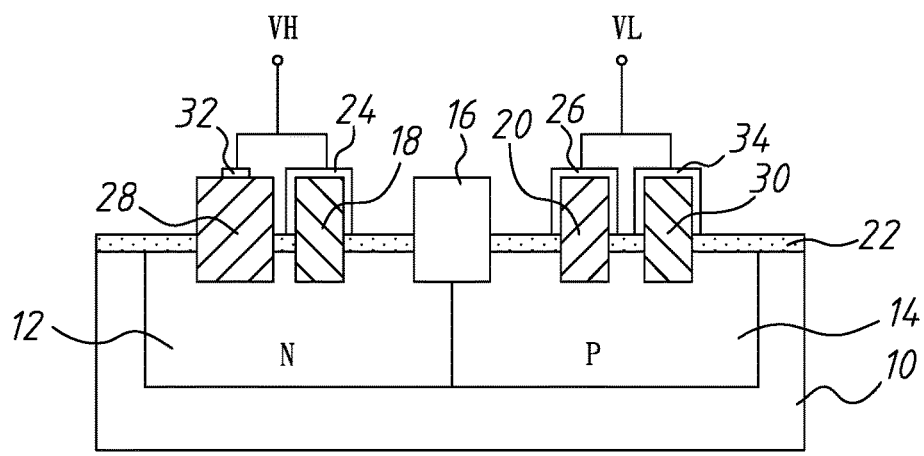
FIG. 24 is a sectional view taken along Line C4-C4' of FIG. 23.

Refer to FIG. 23 and FIG. 24. The twelfth embodiment of the self-balanced silicon-controlled rectification device of the present invention is introduced as below. The twelfth embodiment is different from the ninth embodiment in the direction and amount of the second P-type heavily doped fin 30 and the fourth contact 34. In the twelfth embodiment, there are a plurality of second N-type heavily doped fins 28 arranged along the first direction, one second P-type heavily doped fin 30 arranged along the second direction, one third contact 32 arranged along the second direction, and a plurality of fourth contacts 34 arranged along the first direction, and the insulation layer 22 is arranged among the second N-type heavily doped fins 28. The third contact 32 is arranged on sidewalls and tops of the second N-type heavily doped fins 28 and the insulation layer 22, and the second N-type heavily doped fins 28 are coupled to the high voltage terminal VH via the third contact 32. The fourth contacts 34 are arranged on sidewalls and a top of the second P-type heavily doped fin 30 and the insulation layer 22, and the second P-type heavily doped fin 30 is coupled to the low voltage terminal VL via the fourth contacts 34.

Figure 25:
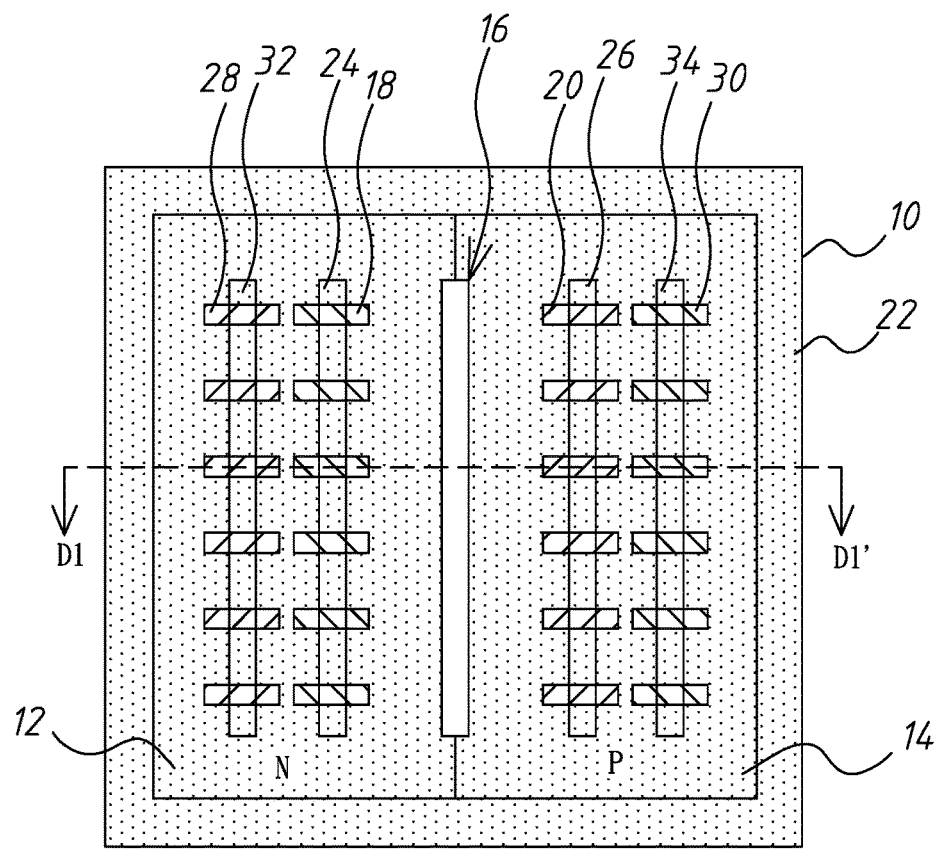
FIG. 25 is a layout schematically showing a self-balanced silicon-controlled rectification device according to the thirteenth embodiment of the present invention.
Figure 26:
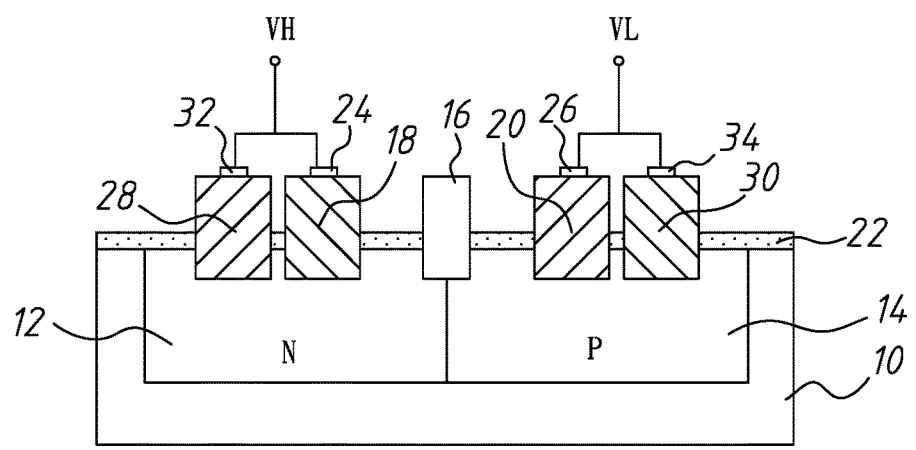
FIG. 26 is a sectional view taken along Line D1-D1' of FIG. 25.

Refer to FIG. 25 and FIG. 26. The thirteenth embodiment of the self-balanced silicon-controlled rectification device of the present invention is introduced as below. The thirteenth embodiment comprises a substrate 10, an N-type doped well 12, a P-type doped well 14, one heavily doped clamping fin 16, a plurality of first P-type heavily doped fins 18, a plurality of first N-type heavily doped fins 20, an insulation layer 22, one first contact 24, one second contact 26, a plurality of second N-type heavily doped fins 28, a plurality of second P-type heavily doped fins 30, one third contact 32 and one fourth contact 34, wherein the substrate 10 is a semiconductor substrate, and the heavily doped clamping fin 16 is a P-type heavily doped clamping fin or an N-type heavily doped clamping fin. Compared with a conventional fin-based silicon-controlled rectifier (SCR), the present invention adds the heavily doped clamping fins 16 to reduce the trigger voltage.

The N-type doped well 12 is arranged in the substrate 10. The P-type doped well 14 is arranged in the substrate 10 and arranged adjacent to the N-type doped well 12. The heavily doped clamping fin 16 is arranged in the N-type doped well 12 and the P-type well 14 and protruded up from a surface of the substrate 10. The first P-type heavily doped fins 18 and the first N-type heavily doped fins 20 are respectively arranged in the N-type doped well 12 and the P-type doped well 14, respectively arranged at two opposite sides of the heavily doped clamping fin 16, and protruded up from the surface of the substrate 10, and the heavily doped clamping fin 16 and each of the first P-type heavily doped fin 18 and the first N-type heavily doped fin 20 are spaced at a fixed interval, and the insulation layer 22 is arranged on the surface of the substrate 10 and arranged between the heavily doped clamping fin 16 and each of the first P-type heavily doped fin 18 and the first N-type heavily doped fin 20. The N-type doped well 12, the P-type doped well 14, the heavily doped clamping fin 16, the first P-type heavily doped fins 18 and the first N-type heavily doped fins 20 form a plurality of silicon-controlled rectifiers (SCRs), and the first P-type heavily doped fins 18 and the first N-type heavily doped fins 20 are respectively coupled to a high voltage terminal VH and a low voltage terminal VL, and voltages of the high voltage terminal VH and the low voltage terminal VL forward bias the SCRs to generate a plurality of uniform electrostatic discharge (ESD) currents through the SCRs, so as to reduce the semiconductor failures due to ESD and obtain a lower trigger voltage.

The heavily doped clamping fin 16 is arranged along a first direction, and the first P-type heavily doped fins 18 are arranged along a second direction intersecting the first direction, and the first N-type heavily doped fins 20 are arranged along the second direction, and the insulation layer 22 is arranged among the first P-type heavily doped fins 18 and arranged among the first N-type heavily doped fins 20. For example, the first direction is perpendicular to the second direction. The first contact 24 is arranged on sidewalls and tops of the first P-type heavily doped fins 18 and the insulation layer 22, and arranged along the first direction, and the first P-type heavily doped fins 18 are coupled to the high voltage terminal VH via the first contact 24. The second contact 26 is arranged on sidewalls and tops of the first N-type heavily doped fins 20 and the insulation layer 22, and arranged along the first direction, and the first N-type heavily doped fins 20 are coupled to the low voltage terminal VL via the second contact 26.

The second N-type heavily doped fins 28 are arranged in the N-type doped well 12, protruded up from the surface of the substrate 10, arranged along the second direction and coupled to the high voltage terminal VH, and the insulation layer 22 is arranged between the second N-type heavily doped fin 28 and each of the first P-type heavily doped fin 18 and the heavily doped clamping fin 16. The second P-type heavily doped fins 30 are arranged in the P-type doped well 14, protruded up from the surface of the substrate 10, arranged along the second direction and coupled to the low voltage terminal VL, and the insulation layer 22 is arranged between the second P-type heavily doped fin 30 and each of the first N-type heavily doped fin 20 and the heavily doped clamping fin 16. The second N-type heavily doped fin 28 and the second P-type heavily doped fin 30 are used to stabilize the voltages of the N-type doped well 12 and the P-type doped well 14, whereby the breakdowns of the SCRs do not easily occur.

The insulation layer 22 is arranged among the second N-type heavily doped fins 28 and arranged among the second P-type heavily doped fins 30. The third contact 32 and the fourth contact 34 are arranged along the first direction. The third contact 32 is arranged on sidewalls and tops of the second N-type heavily doped fins 28 and the insulation layer 22, and the second N-type heavily doped fins 28 are coupled to the high voltage terminal VH via the third contact 32. The fourth contact 34 is arranged on sidewalls and tops of the second P-type heavily doped fins 30 and the insulation layer 22, and the second P-type heavily doped fins 30 are coupled to the low voltage terminal VL via the fourth contact 34.

Figure 27:
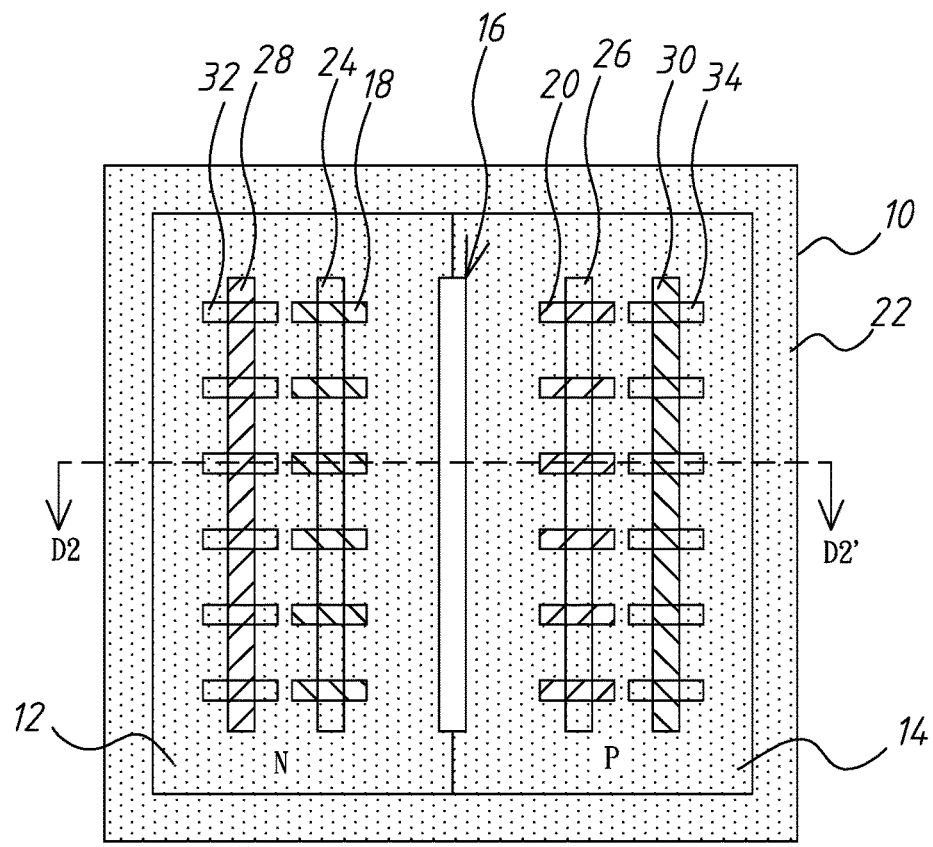
FIG. 27 is a layout schematically showing a self-balanced silicon-controlled rectification device according to the fourteenth embodiment of the present invention.
Figure 28:
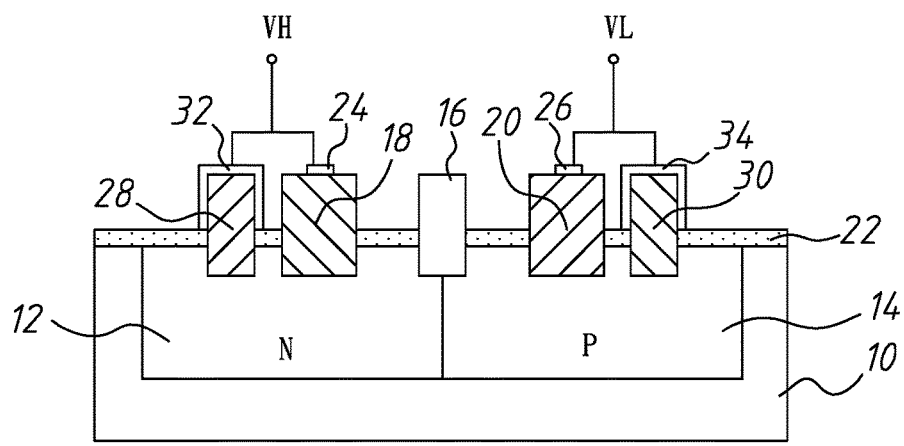
FIG. 28 is a sectional view taken along Line D2-D2' of FIG. 27.

Refer to FIG. 27 and FIG. 28. The fourteenth embodiment of the self-balanced silicon-controlled rectification device of the present invention is introduced as below. The fourteenth embodiment is different from the thirteenth embodiment in the direction and amount of the second N-type heavily doped fin 28, the second P-type heavily doped fin 30, the third contact 32 and the fourth contact 34. In the fourteenth embodiment, there are one second N-type heavily doped fin 28 arranged along the first direction, one second P-type heavily doped fin 30 arranged along the first direction, a plurality of third contacts 32 arranged along the second direction and a plurality of fourth contacts 34 arranged along the second direction. The third contacts 32 are arranged on sidewalls and a top of the second N-type heavily doped fin 28 and the insulation layer 22, and the second N-type heavily doped fin 28 is coupled to the high voltage terminal VH via the third contacts 32. The fourth contacts 34 are arranged on sidewalls and a top of the second P-type heavily doped fin 30 and the insulation layer 22, and the second P-type heavily doped fin 30 is coupled to the low voltage terminal VL via the fourth contacts 34.

Figure 29:
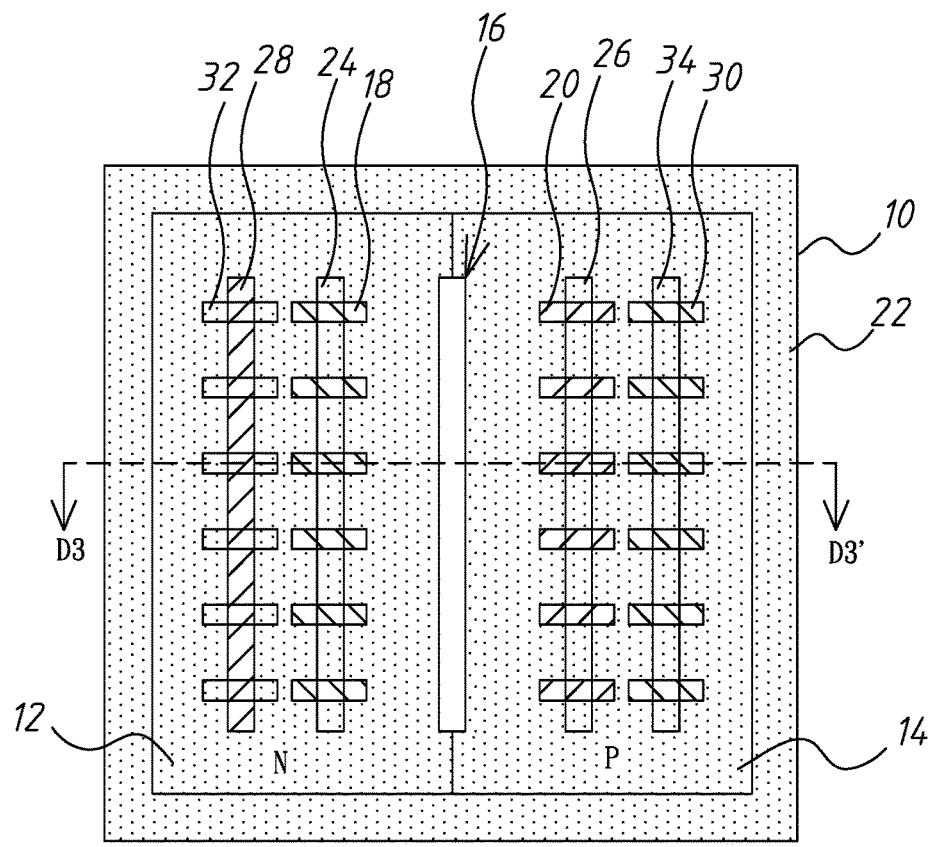
FIG. 29 is a layout schematically showing a self-balanced silicon-controlled rectification device according to the fifteenth embodiment of the present invention.
Figure 30:
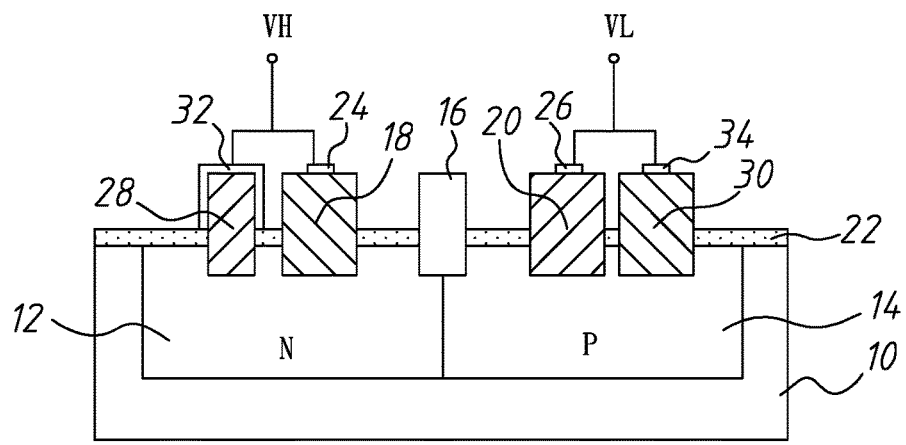
FIG. 30 is a sectional view taken along Line D3-D3' of FIG. 30.

Refer to FIG. 29 and FIG. 30. The fifteenth embodiment of the self-balanced silicon-controlled rectification device of the present invention is introduced as below. The fifteenth embodiment is different from the thirteenth embodiment in the direction and amount of the second N-type heavily doped fin 28 and the third contact 32. In the fifteenth embodiment, there is one second N-type heavily doped fin 28 arranged along the first direction, a plurality of second P-type heavily doped fins 30 arranged along the second direction, a plurality of third contacts 32 arranged along the second direction, and a fourth contact 34 arranged along the first direction, and the insulation layer 22 is arranged among the second P-type heavily doped fins 30. The third contacts 32 are arranged on sidewalls and a top of the second N-type heavily doped fin 28 and the insulation layer 22, and the second N-type heavily doped fin 28 is coupled to the high voltage terminal VH via the third contacts 32. The fourth contact 34 is arranged on sidewalls and tops of the second P-type heavily doped fins 30 and the insulation layer 22, and the second P-type heavily doped fins 30 are coupled to the low voltage terminal VL via the fourth contact 34.

Figure 31:
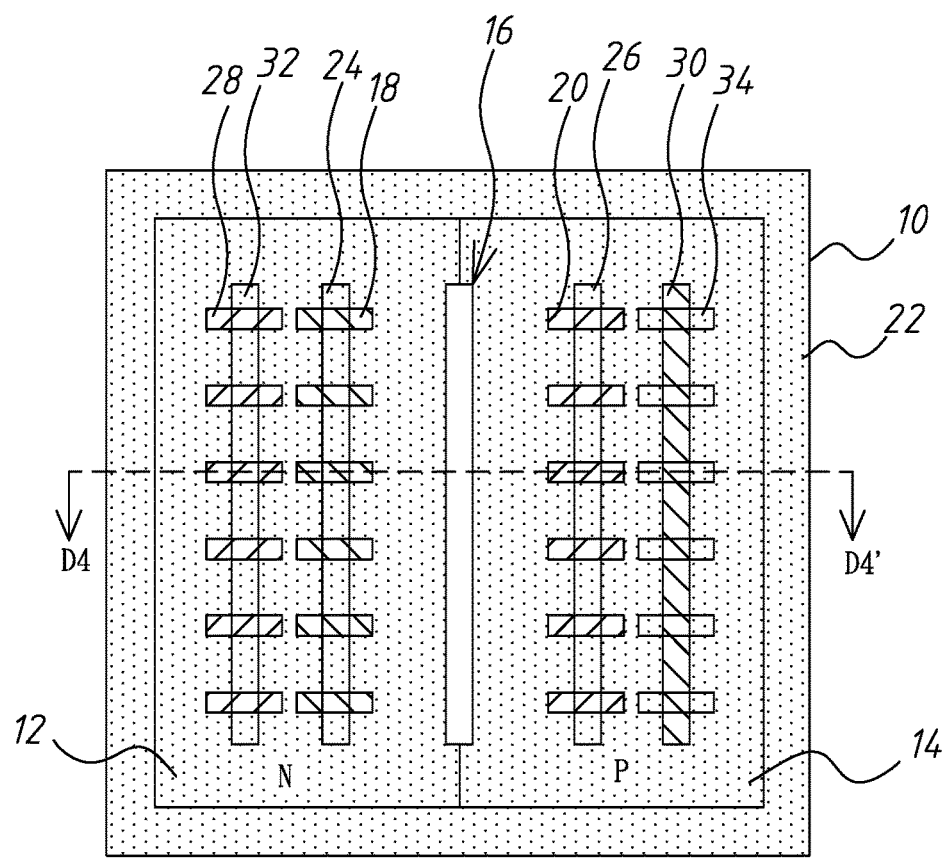
FIG. 31 is a layout schematically showing a self-balanced silicon-controlled rectification device according to the sixteenth embodiment of the present invention.
Figure 32:
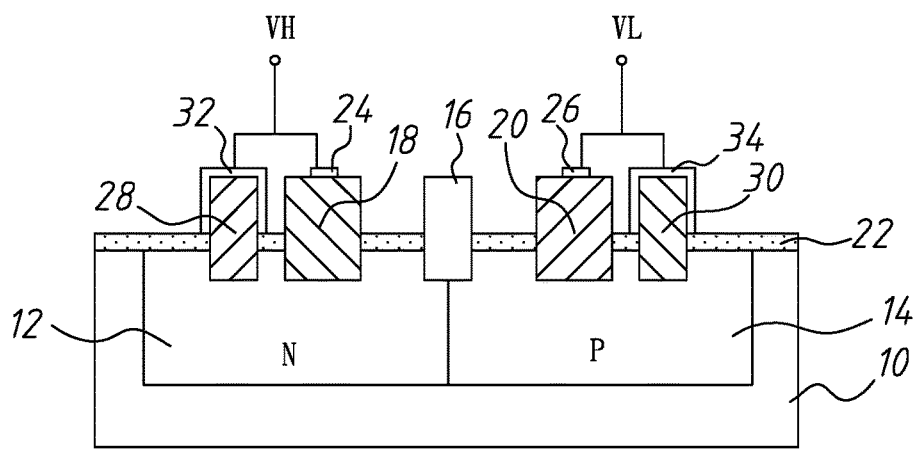
FIG. 32 is a sectional view taken along Line D4-D4' of FIG. 31.

Refer to FIG. 31 and FIG. 32. The sixteenth embodiment of the self-balanced silicon-controlled rectification device of the present invention is introduced as below. The sixteenth embodiment is different from the thirteenth embodiment in the direction and amount of the second P-type heavily doped fin 30 and the fourth contact 34. In the sixteenth embodiment, there are a plurality of second N-type heavily doped fins 28 arranged along the second direction, one second P-type heavily doped fin 30 arranged along the first direction, one third contact 32 arranged along the first direction, and a plurality of fourth contacts 34 arranged along the second direction, and the insulation layer 22 is arranged among the second N-type heavily doped fins 28. The third contact 32 is arranged on sidewalls and tops of the second N-type heavily doped fins 28 and the insulation layer 22, and the second N-type heavily doped fins 28 are coupled to the high voltage terminal VH via the third contact 32. The fourth contacts 34 are arranged on sidewalls and a top of the second P-type heavily doped fin 30 and the insulation layer 22, and the second P-type heavily doped fin 30 is coupled to the low voltage terminal VL via the fourth contacts 34.

In the first embodiment to the sixteenth embodiment, at least one heavily doped clamping fin is arranged in the N-type doped well 12 and the P-type well 14. Besides, at least one heavily doped clamping fin 16 further comprises at least one P-type heavily doped clamping fin and at least one N-type heavily doped clamping fin, as shown in the following embodiments.

Figure 33:
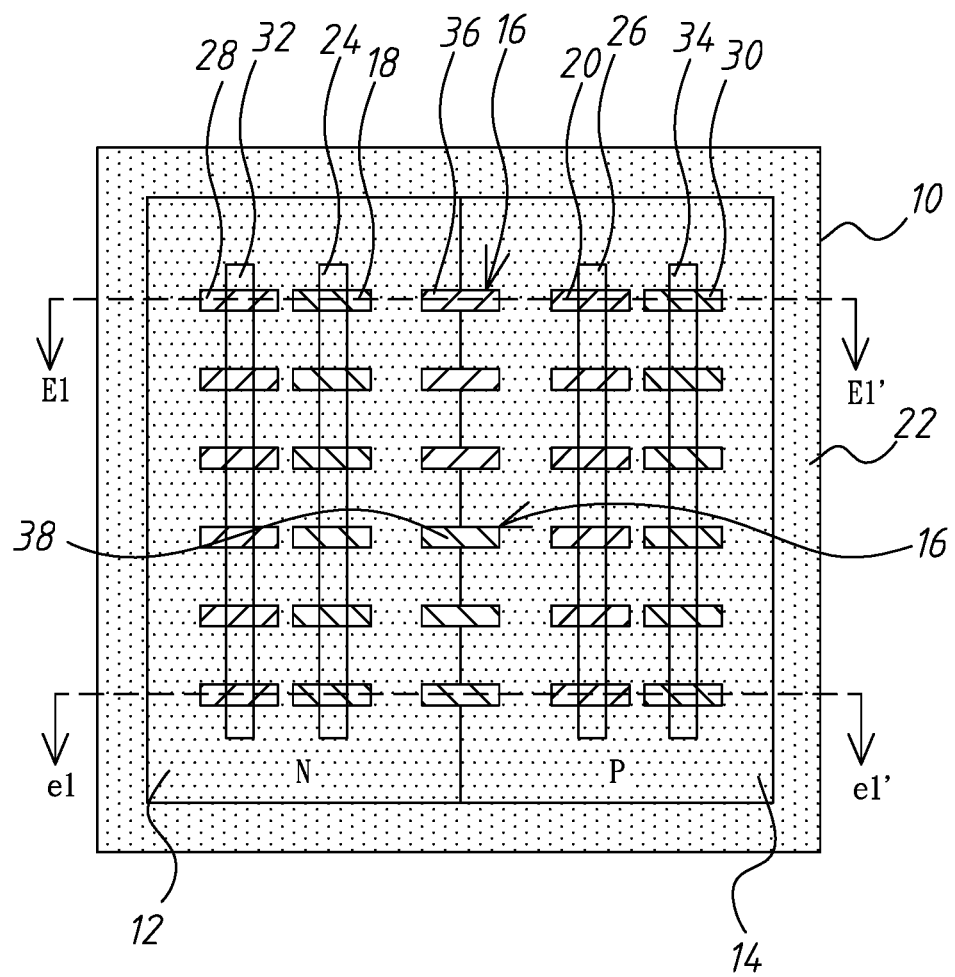
FIG. 33 is a layout schematically showing a self-balanced silicon-controlled rectification device according to the seventeenth embodiment of the present invention.
Figure 34:
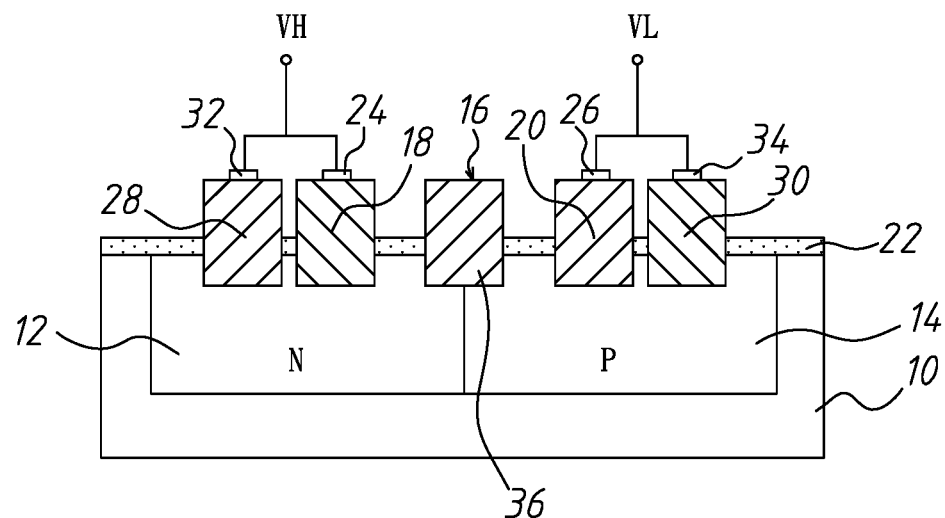
FIG. 34 is a sectional view taken along Line E1-E1' of FIG. 33.
Figure 35:
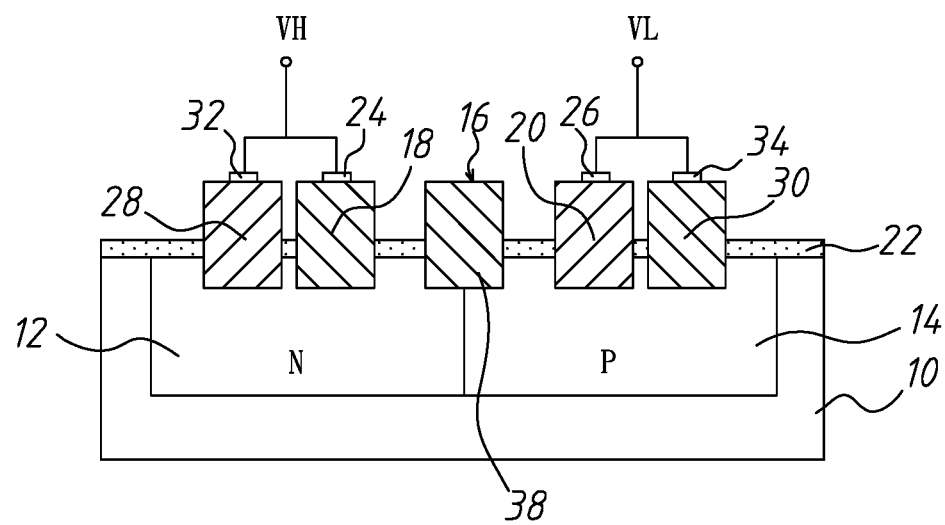
FIG. 35 is a sectional view taken along Line e1-e1' of FIG. 33.

Refer to FIG. 33, FIG. 34 and FIG. 35. The seventeenth embodiment of the self-balanced silicon-controlled rectification device of the present invention is introduced as below. The seventeenth embodiment is different from the first embodiment in the heavily doped clamping fins 16. In the seventeenth embodiment, the heavily doped clamping fins 16 are realized with a plurality of neighbored N-type heavily doped clamping fins 36 and a plurality of neighbored P-type heavily doped clamping fins 38, and the insulation layer 22 is arranged among the heavily doped clamping fins 16. The other structures of the seventeenth embodiment are the same to those of the first embodiment so will not be reiterated.

Figure 36:
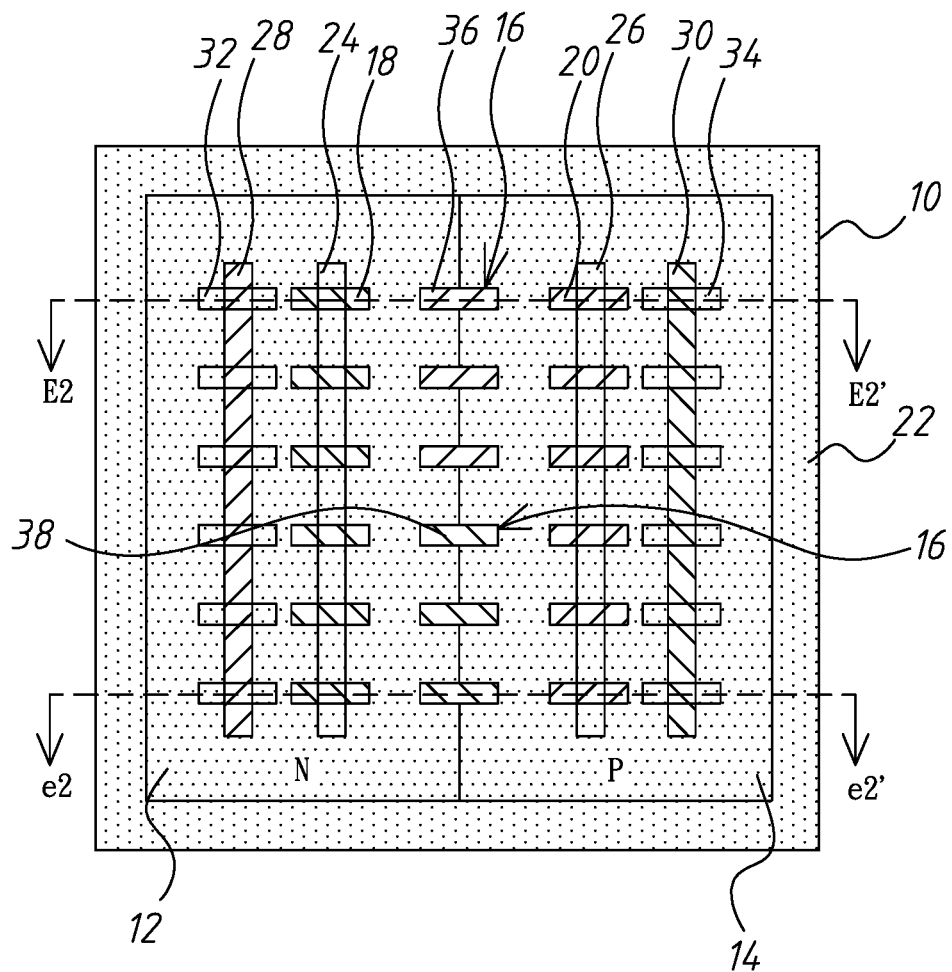
FIG. 36 is a layout schematically showing a self-balanced silicon-controlled rectification device according to the eighteenth embodiment of the present invention.
Figure 37:
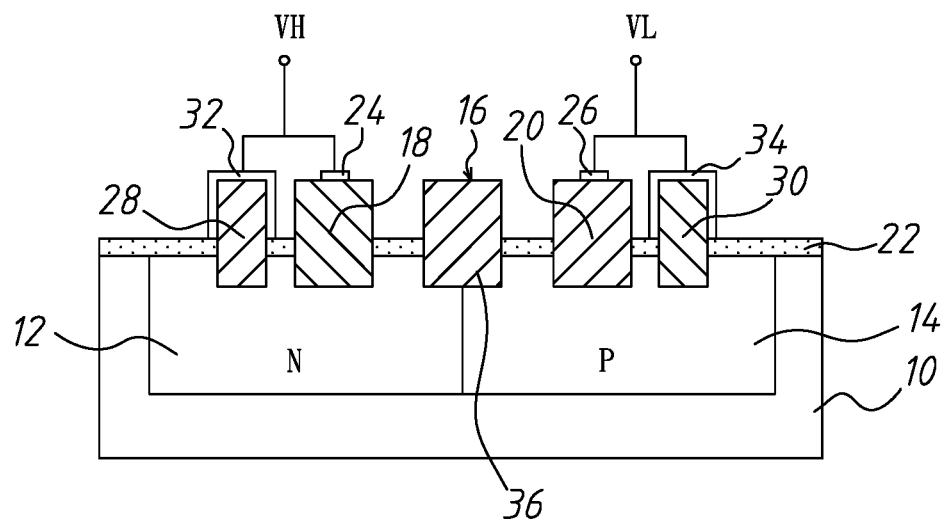
FIG. 37 is a sectional view taken along Line E2-E2' of FIG. 36.
Figure 38:
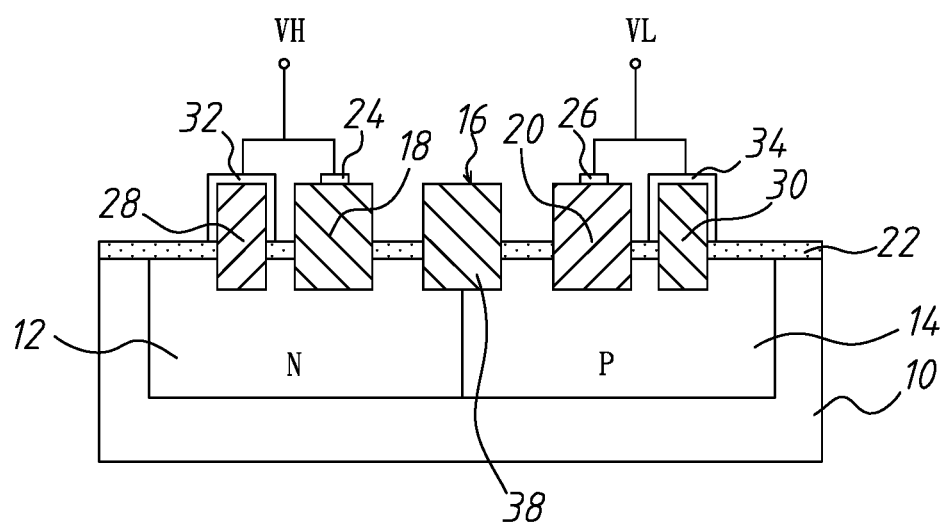
FIG. 38 is a sectional view taken along Line e2-e2' of FIG. 36.

Refer to FIG. 36, FIG. 37 and FIG. 38. The eighteenth embodiment of the self-balanced silicon-controlled rectification device of the present invention is introduced as below. The eighteenth embodiment is different from the second embodiment in the heavily doped clamping fins 16. In the eighteenth embodiment, the heavily doped clamping fins 16 are realized with a plurality of neighbored N-type heavily doped clamping fins 36 and a plurality of neighbored P-type heavily doped clamping fins 38, and the insulation layer 22 is arranged among the heavily doped clamping fins 16. The other structures of the eighteenth embodiment are the same to those of the second embodiment so will not be reiterated.

Figure 39:
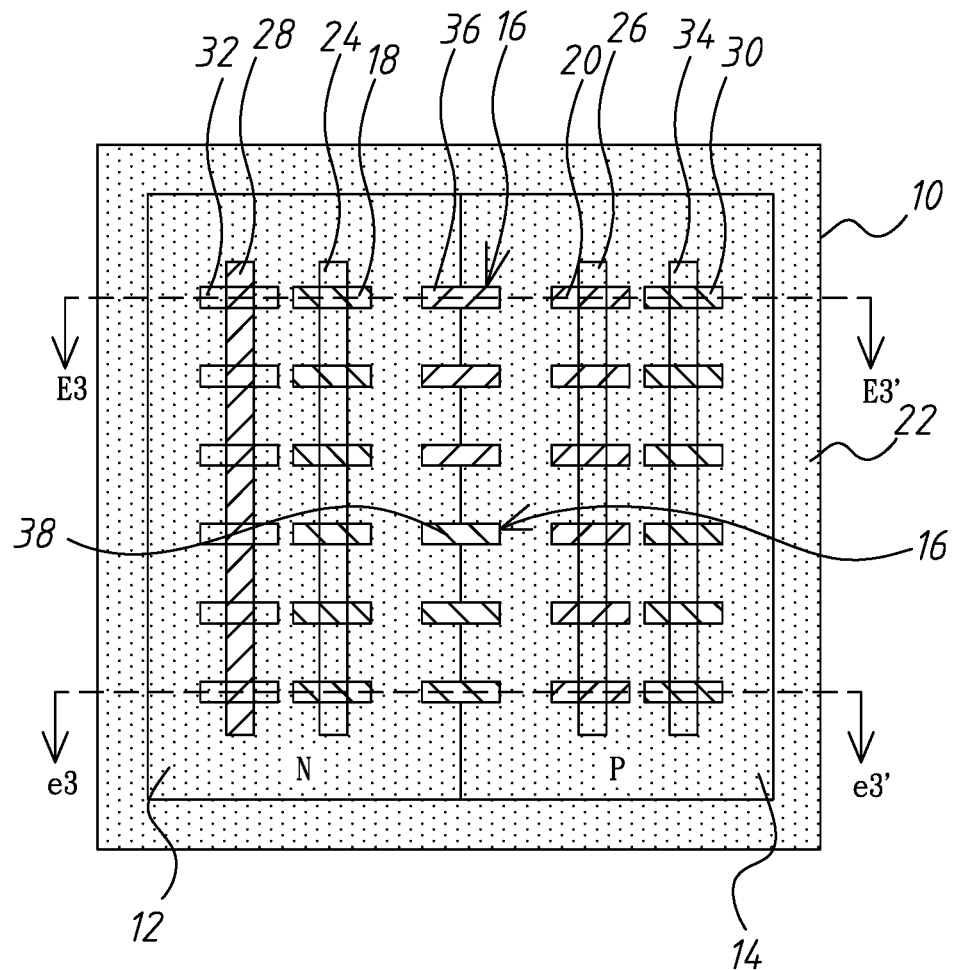
FIG. 39 is a layout schematically showing a self-balanced silicon-controlled rectification device according to the nineteenth embodiment of the present invention.
Figure 40:
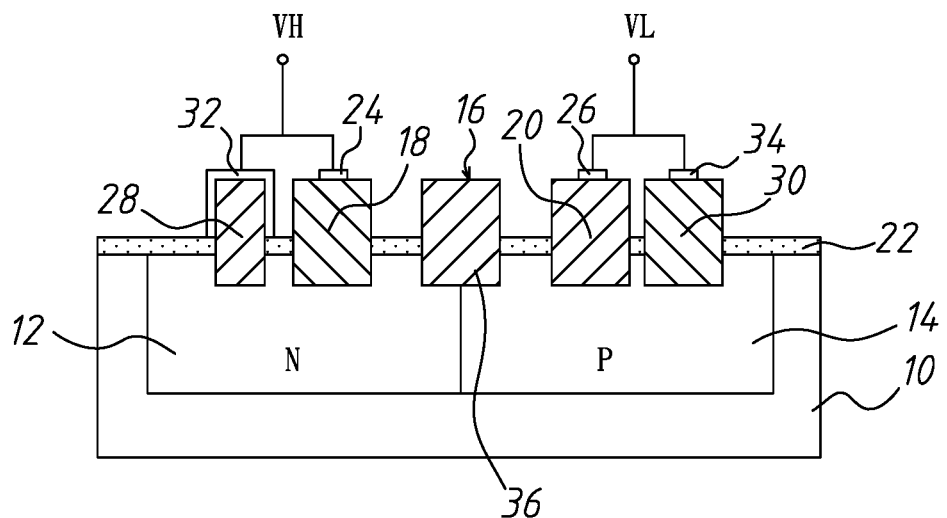
FIG. 40 is a sectional view taken along Line E3-E3' of FIG. 39.
Figure 41:
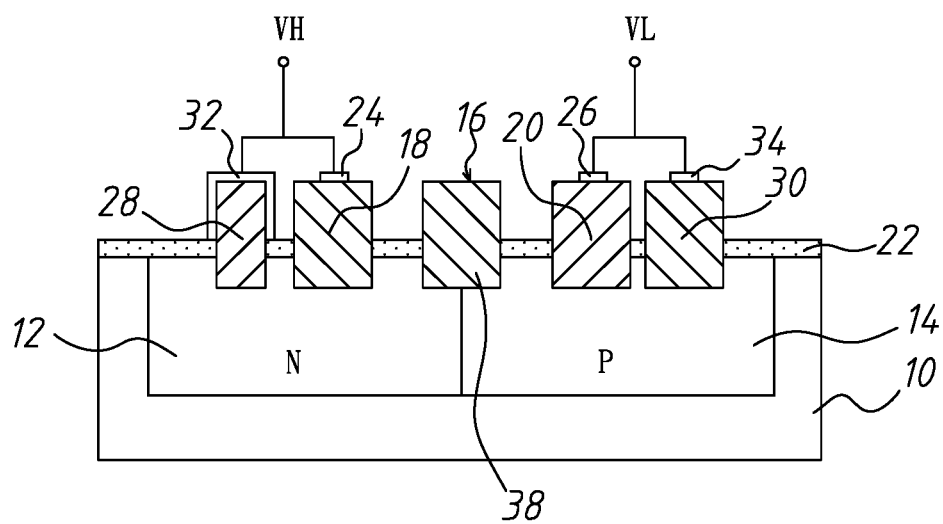
FIG. 41 is a sectional view taken along Line e3-e3' of FIG. 39.

Refer to FIG. 39, FIG. 40 and FIG. 41. The nineteenth embodiment of the self-balanced silicon-controlled rectification device of the present invention is introduced as below. The nineteenth embodiment is different from the third embodiment in the heavily doped clamping fins 16. In the nineteenth embodiment, the heavily doped clamping fins 16 are realized with a plurality of neighbored N-type heavily doped clamping fins 36 and a plurality of neighbored P-type heavily doped clamping fins 38, and the insulation layer 22 is arranged among the heavily doped clamping fins 16. The other structures of the nineteenth embodiment are the same to those of the third embodiment so will not be reiterated.

Figure 42:
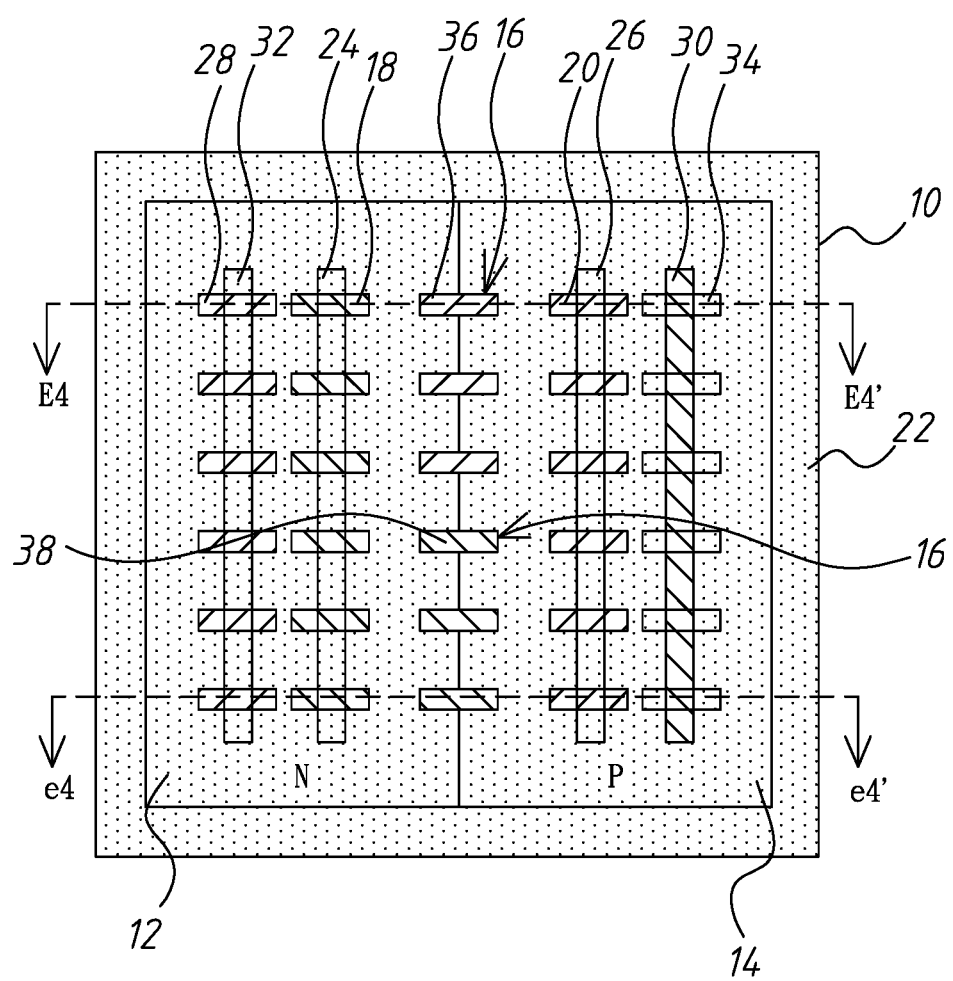
FIG. 42 is a layout schematically showing a self-balanced silicon-controlled rectification device according to the twentieth embodiment of the present invention.
Figure 43:
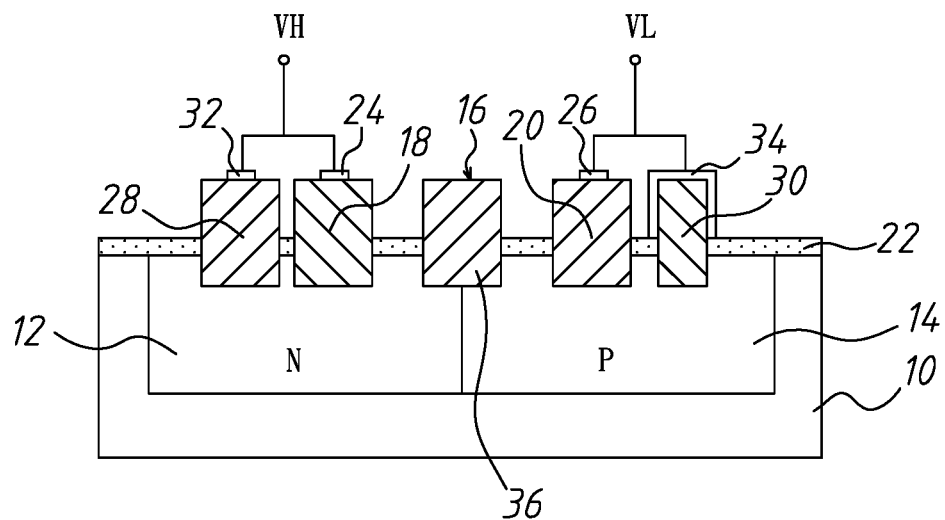
FIG. 43 is a sectional view taken along Line E4-E4' of FIG. 42.
Figure 44:
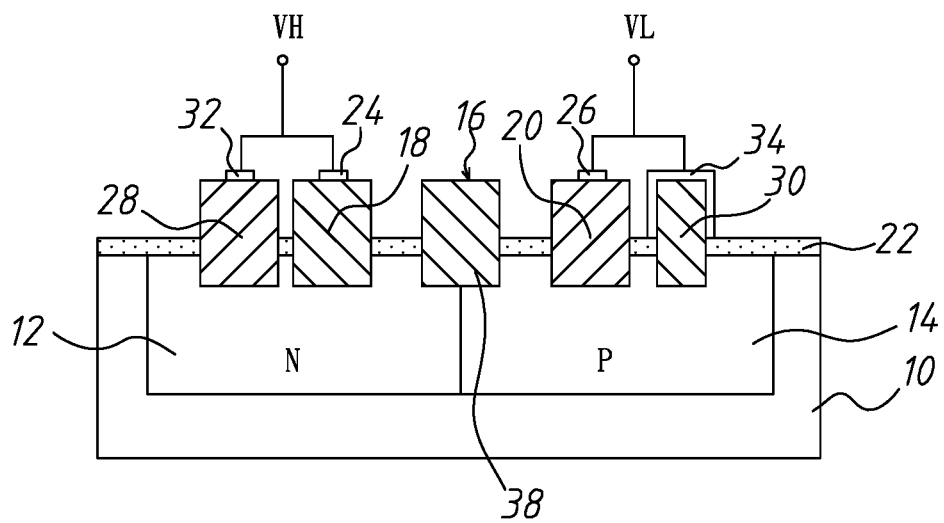
FIG. 44 is a sectional view taken along Line e4-e4' of FIG. 42.

Refer to FIG. 42, FIG. 43 and FIG. 44. The twentieth embodiment of the self-balanced silicon-controlled rectification device of the present invention is introduced as below. The twentieth embodiment is different from the fourth embodiment in the heavily doped clamping fins 16. In the twentieth embodiment, the heavily doped clamping fins 16 are realized with a plurality of neighbored N-type heavily doped clamping fins 36 and a plurality of neighbored P-type heavily doped clamping fins 38, and the insulation layer 22 is arranged among the heavily doped clamping fins 16. The other structures of the twentieth embodiment are the same to those of the fourth embodiment so will not be reiterated.

Figure 45:
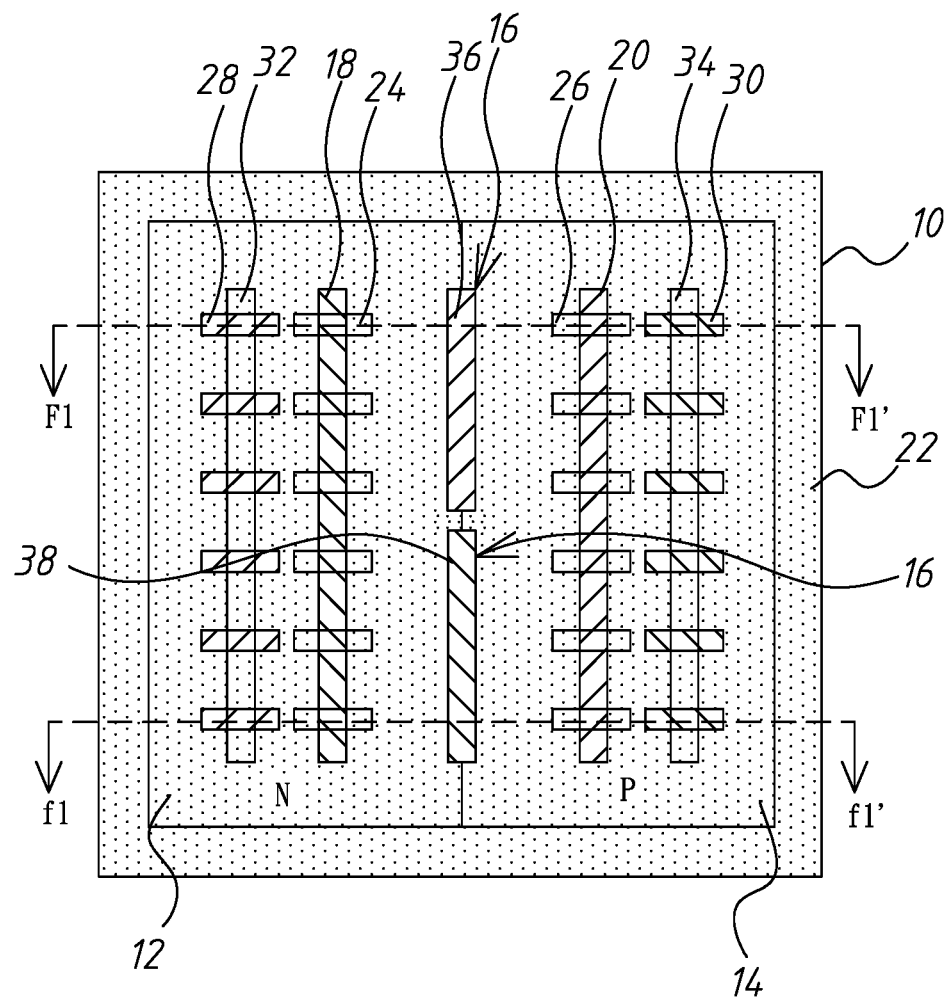
FIG. 45 is a layout schematically showing a self-balanced silicon-controlled rectification device according to the twenty-first embodiment of the present invention.
Figure 46:
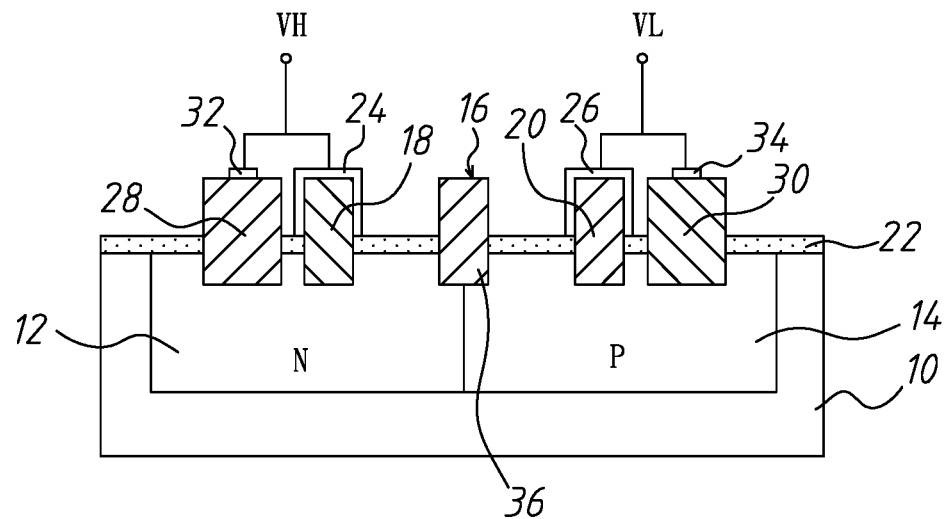
FIG. 46 is a sectional view taken along Line F1-F1' of FIG. 45.
Figure 47:
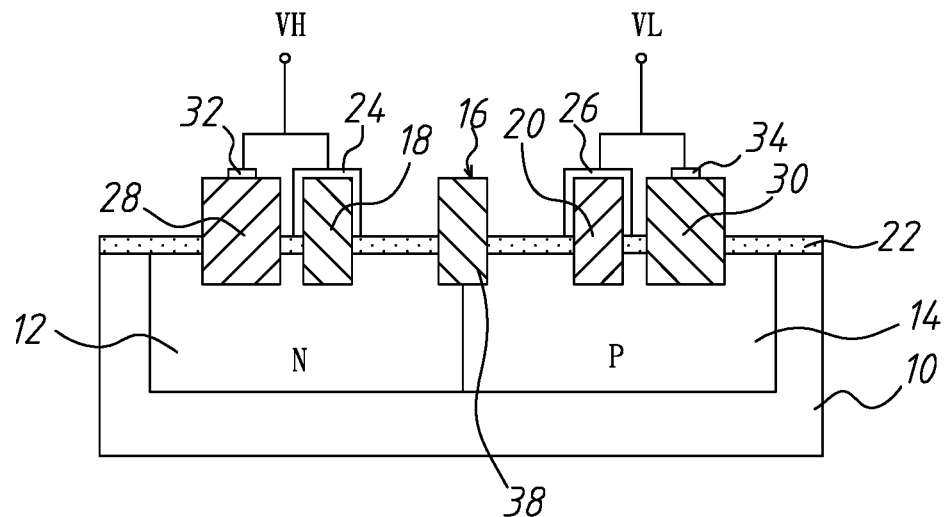
FIG. 47 is a sectional view taken along Line f1-f1' of FIG. 45.

Refer to FIG. 45, FIG. 46 and FIG. 47. The twenty-first embodiment of the self-balanced silicon-controlled rectification device of the present invention is introduced as below. The twenty-first embodiment is different from the fifth embodiment in the heavily doped clamping fins 16. In the twenty-first embodiment, the heavily doped clamping fins 16 are realized with one N-type heavily doped clamping fin 36 and one P-type heavily doped clamping fin 38, and the insulation layer 22 is arranged among the heavily doped clamping fins 16. The other structures of the twenty-first embodiment are the same to those of the fifth embodiment so will not be reiterated.

Figure 48:
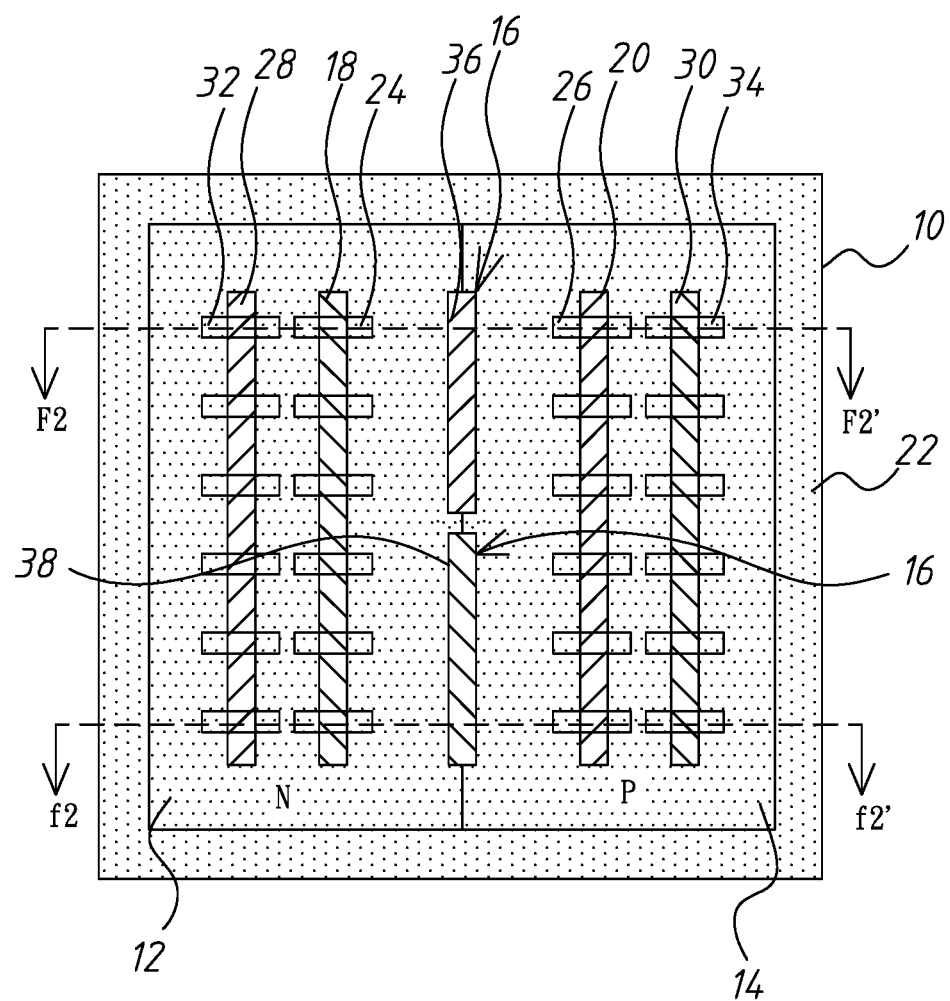
FIG. 48 is a layout schematically showing a self-balanced silicon-controlled rectification device according to the twenty-second embodiment of the present invention.
Figure 49:
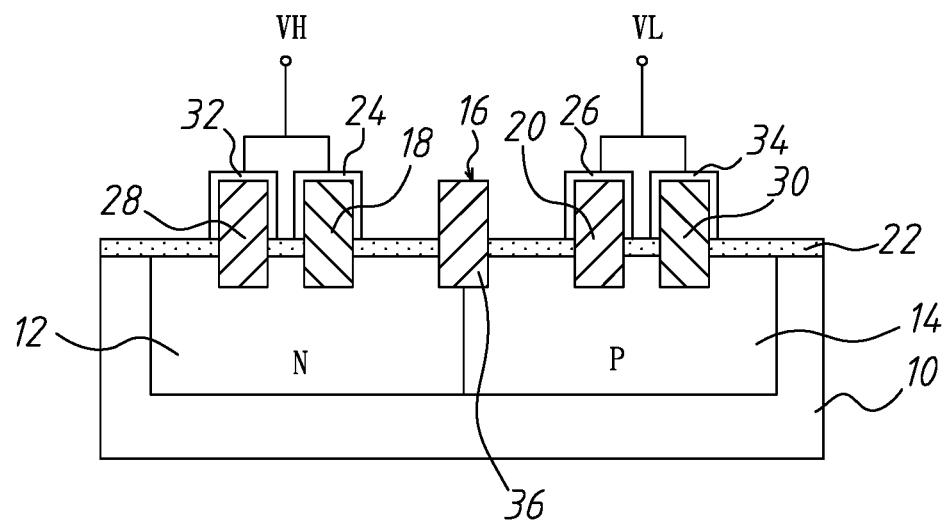
FIG. 49 is a sectional view taken along Line F2-F2' of FIG. 48.
Figure 50:
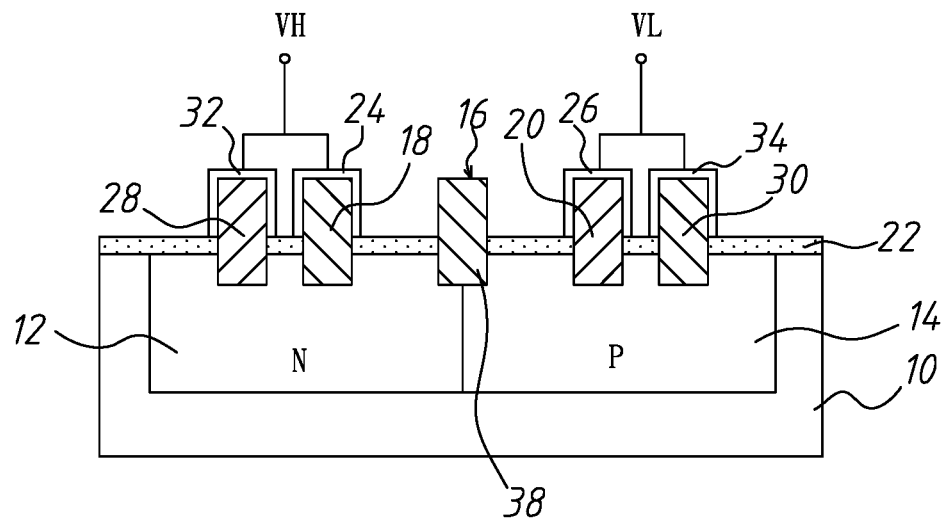
FIG. 50 is a sectional view taken along Line f2-f2' of FIG. 48.

Refer to FIG. 48, FIG. 49 and FIG. 50. The twenty-second embodiment of the self-balanced silicon-controlled rectification device of the present invention is introduced as below. The twenty-second embodiment is different from the sixth embodiment in the heavily doped clamping fins 16. In the twenty-second embodiment, the heavily doped clamping fins 16 are realized with one N-type heavily doped clamping fin 36 and one P-type heavily doped clamping fin 38, and the insulation layer 22 is arranged among the heavily doped clamping fins 16. The other structures of the twenty-second embodiment are the same to those of the sixth embodiment so will not be reiterated.

Figure 51:
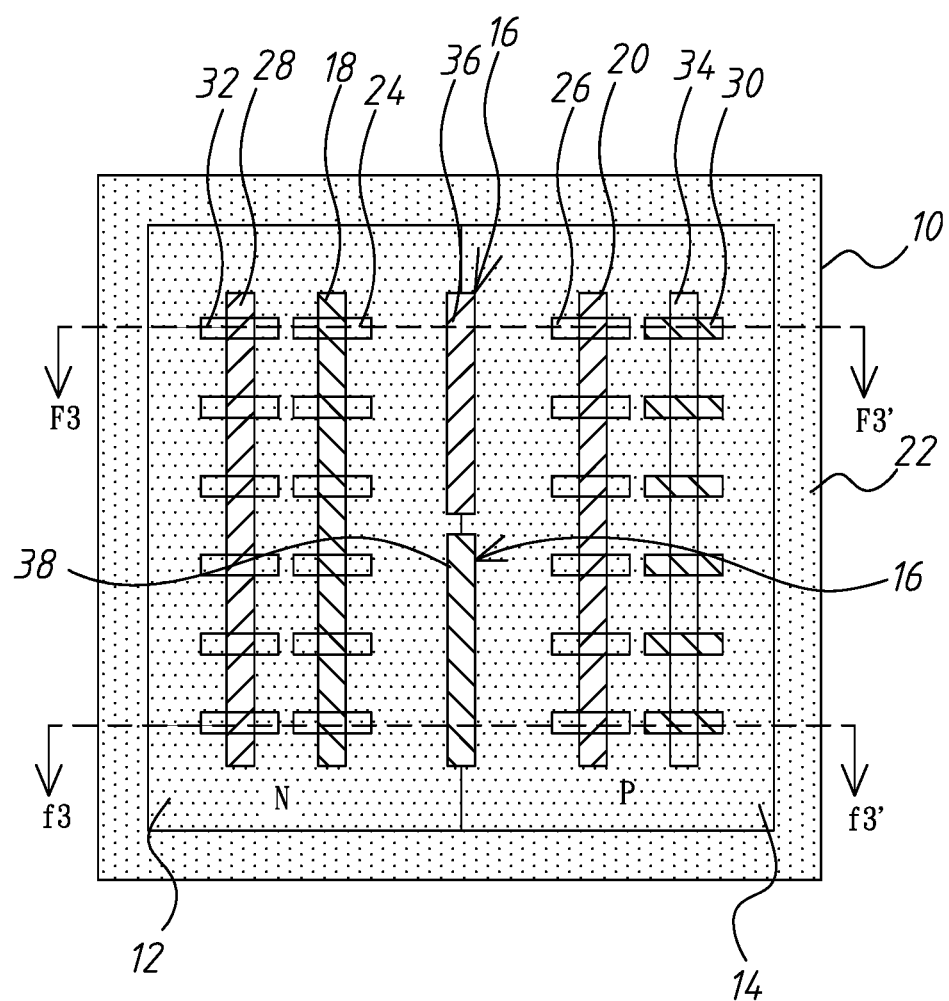
FIG. 51 is a layout schematically showing a self-balanced silicon-controlled rectification device according to the twenty-third embodiment of the present invention.
Figure 52:
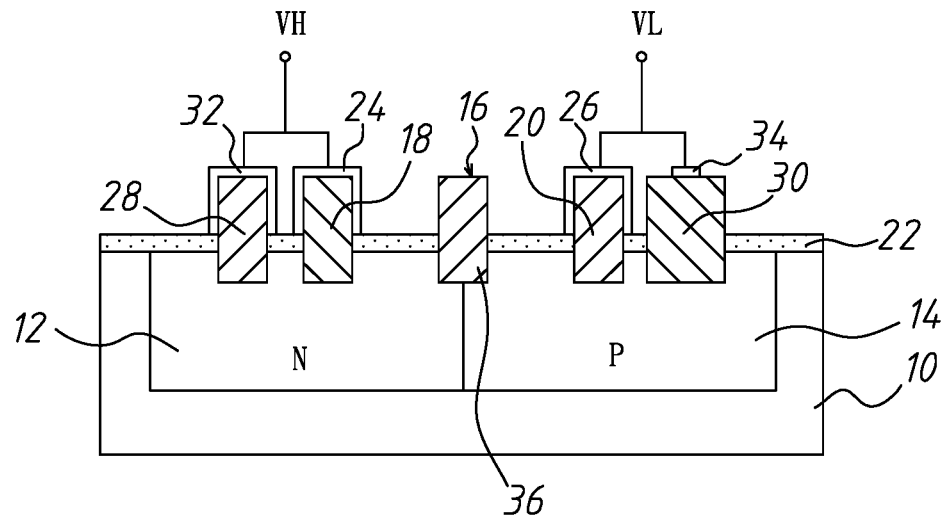
FIG. 52 is a sectional view taken along Line F3-F3' of FIG. 51.
Figure 53:
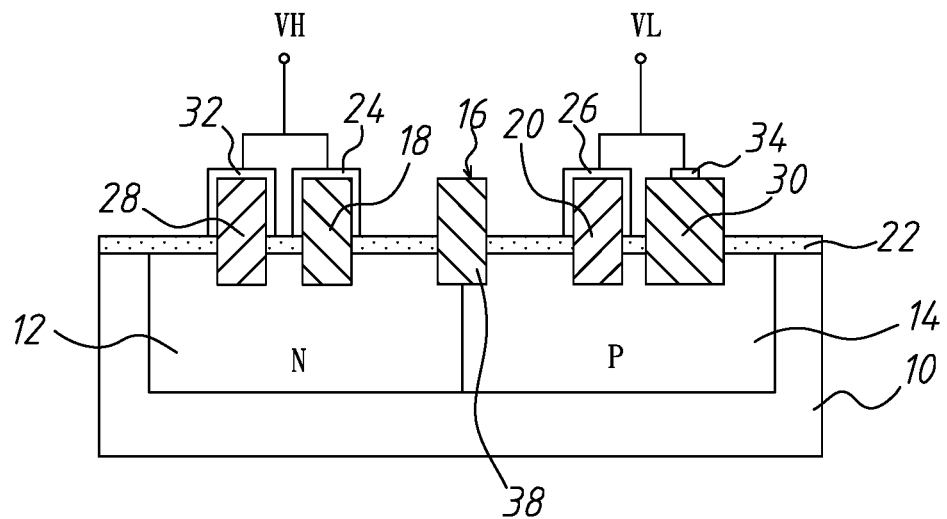
FIG. 53 is a sectional view taken along Line f3-f3' of FIG. 51.

Refer to FIG. 51, FIG. 52 and FIG. 53. The twenty-third embodiment of the self-balanced silicon-controlled rectification device of the present invention is introduced as below. The twenty-third embodiment is different from the seventh embodiment in the heavily doped clamping fins 16. In the twenty-third embodiment, the heavily doped clamping fins 16 are realized with one N-type heavily doped clamping fin 36 and one P-type heavily doped clamping fin 38, and the insulation layer 22 is arranged among the heavily doped clamping fins 16. The other structures of the twenty-third embodiment are the same to those of the seventh embodiment so will not be reiterated.

Figure 54:
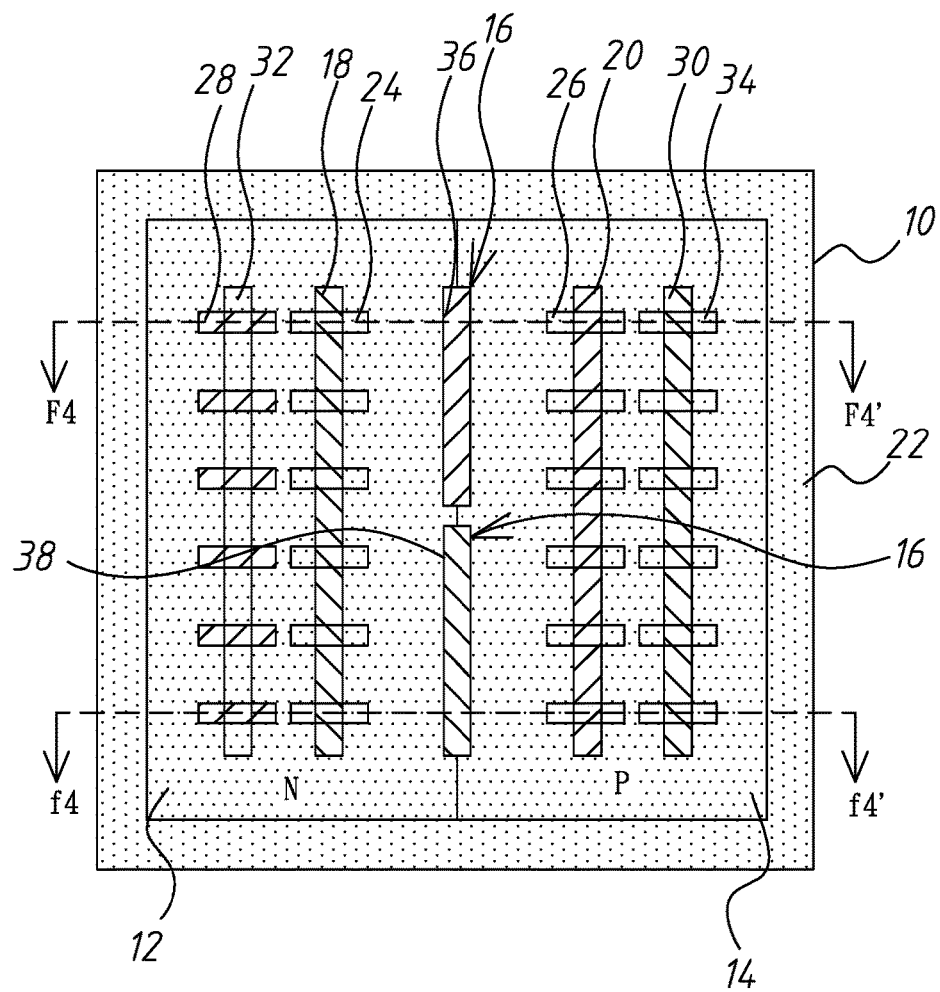
FIG. 54 is a layout schematically showing a self-balanced silicon-controlled rectification device according to the twenty-fourth embodiment of the present invention.
Figure 55:
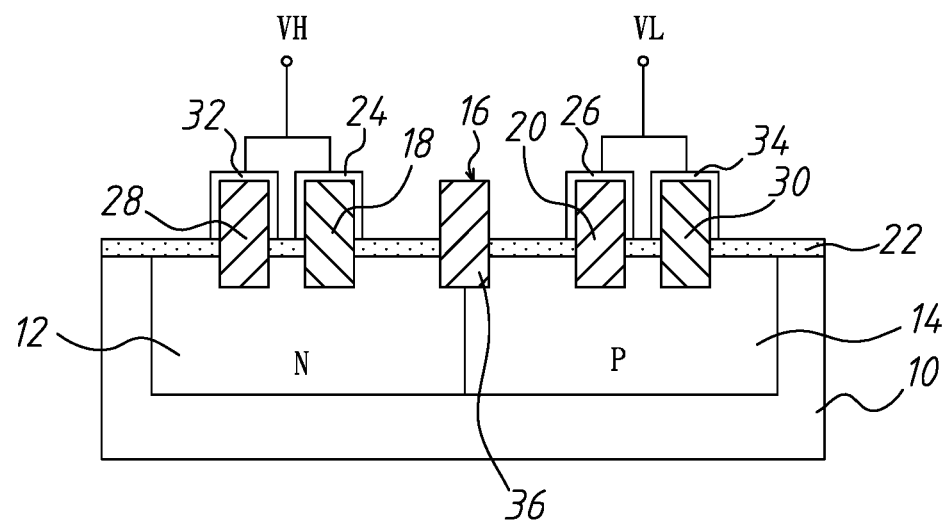
FIG. 55 is a sectional view taken along Line F4-F4' of FIG. 54.
Figure 56:
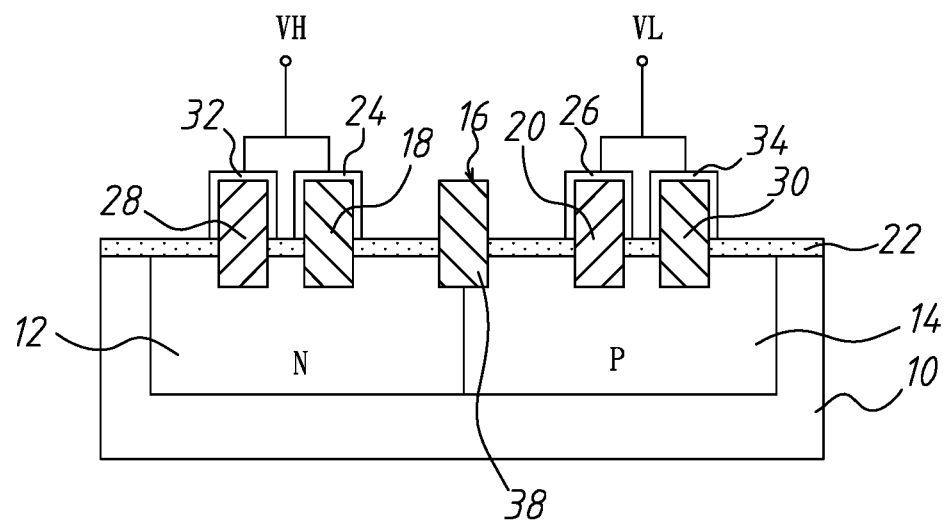
FIG. 56 is a sectional view taken along Line f4-f4' of FIG. 54.

Refer to FIG. 54, FIG. 55 and FIG. 56. The twenty-fourth embodiment of the self-balanced silicon-controlled rectification device of the present invention is introduced as below. The twenty-fourth embodiment is different from the eighth embodiment in the heavily doped clamping fins 16. In the twenty-fourth embodiment, the heavily doped clamping fins 16 are realized with one N-type heavily doped clamping fin 36 and one P-type heavily doped clamping fin 38, and the insulation layer 22 is arranged among the heavily doped clamping fins 16. The other structures of the twenty-fourth embodiment are the same to those of the eighth embodiment so will not be reiterated.

Figure 57:
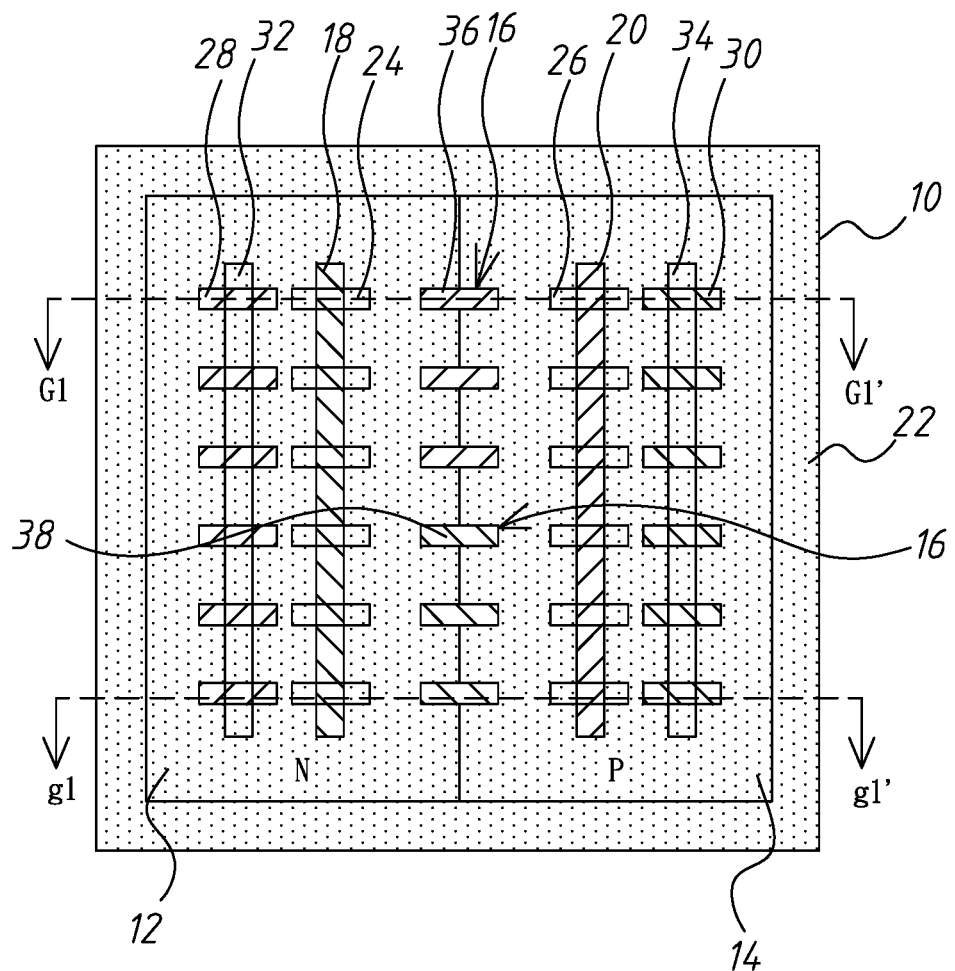
FIG. 57 is a layout schematically showing a self-balanced silicon-controlled rectification device according to the twenty-fifth embodiment of the present invention.
Figure 58:
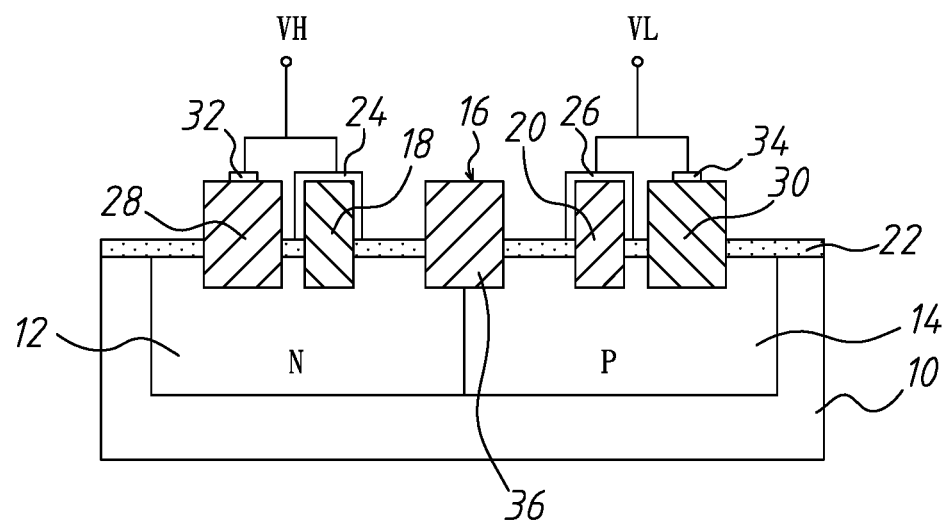
FIG. 58 is a sectional view taken along Line G1-G1' of FIG. 57.
Figure 59:
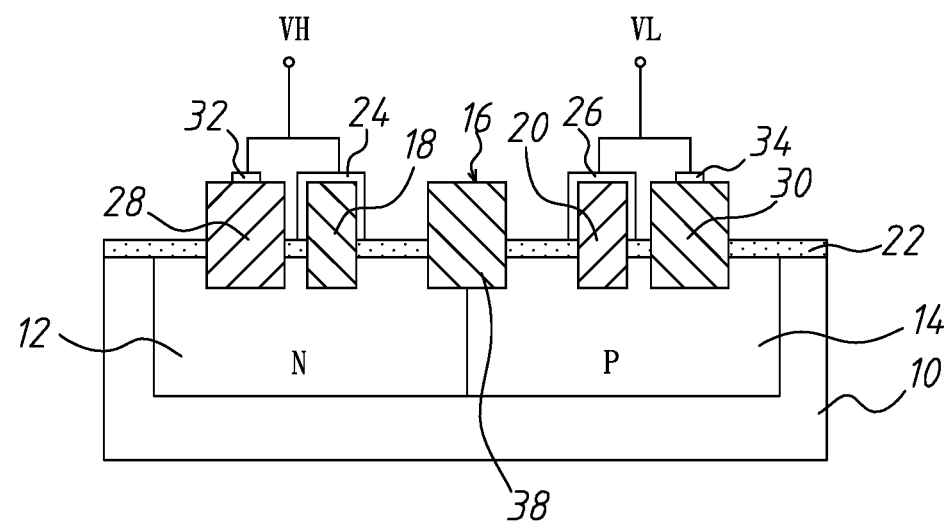
FIG. 59 is a sectional view taken along Line g1-g1' of FIG. 57.

Refer to FIG. 57, FIG. 58 and FIG. 59. The twenty-fifth embodiment of the self-balanced silicon-controlled rectification device of the present invention is introduced as below. The twenty-fifth embodiment is different from the ninth embodiment in the heavily doped clamping fins 16. In the twenty-fifth embodiment, the heavily doped clamping fins 16 are realized with a plurality of neighbored N-type heavily doped clamping fins 36 and a plurality of neighbored P-type heavily doped clamping fins 38, and the insulation layer 22 is arranged among the heavily doped clamping fins 16. The other structures of the twenty-fifth embodiment are the same to those of the ninth embodiment so will not be reiterated.

Figure 60:
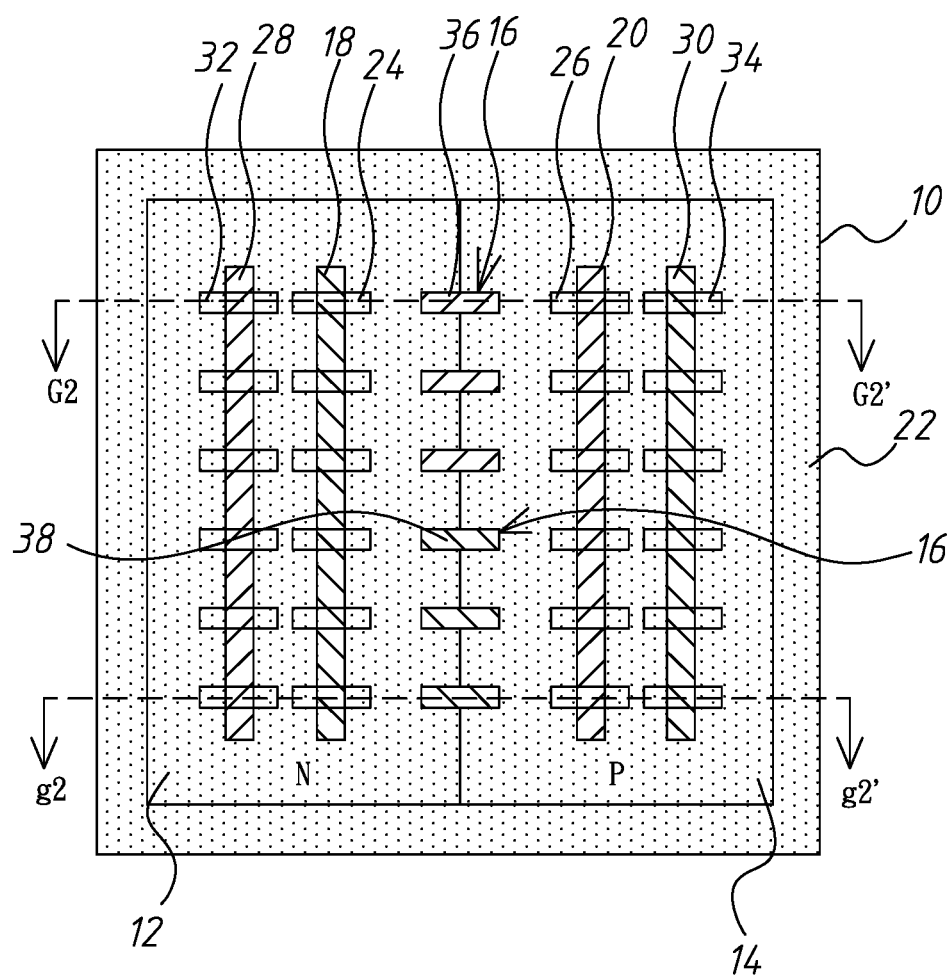
FIG. 60 is a layout schematically showing a self-balanced silicon-controlled rectification device according to the twenty-sixth embodiment of the present invention.
Figure 61:
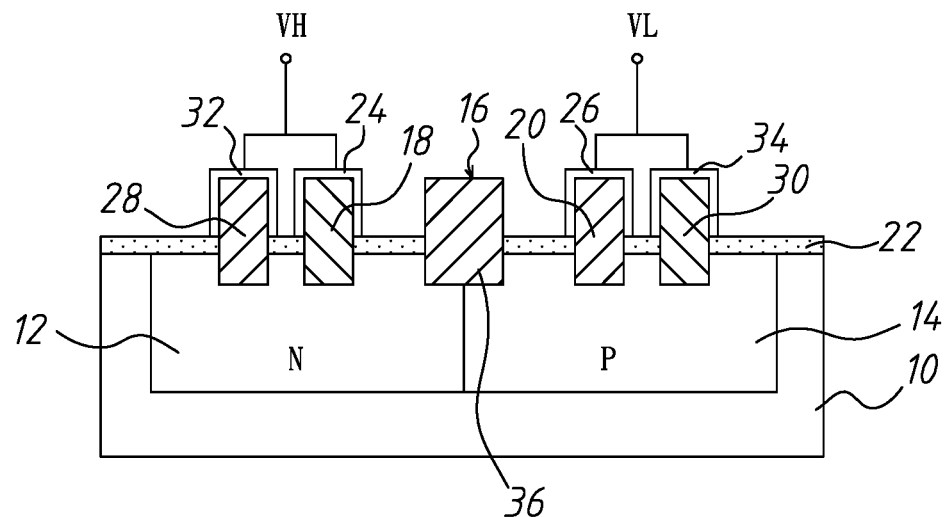
FIG. 61 is a sectional view taken along Line G2-G2' of FIG. 60.
Figure 62:
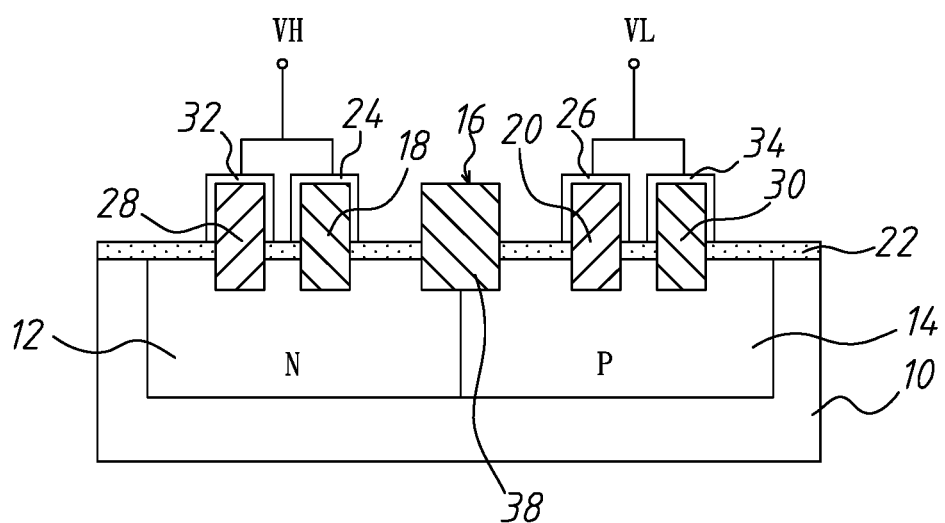
FIG. 62 is a sectional view taken along Line g2-g2' of FIG. 60.

Refer to FIG. 60, FIG. 61 and FIG. 62. The twenty-sixth embodiment of the self-balanced silicon-controlled rectification device of the present invention is introduced as below. The twenty-sixth embodiment is different from the tenth embodiment in the heavily doped clamping fins 16. In the twenty-sixth embodiment, the heavily doped clamping fins 16 are realized with a plurality of neighbored N-type heavily doped clamping fins 36 and a plurality of neighbored P-type heavily doped clamping fins 38, and the insulation layer 22 is arranged among the heavily doped clamping fins 16. The other structures of the twenty-sixth embodiment are the same to those of the tenth embodiment so will not be reiterated.

Figure 63:
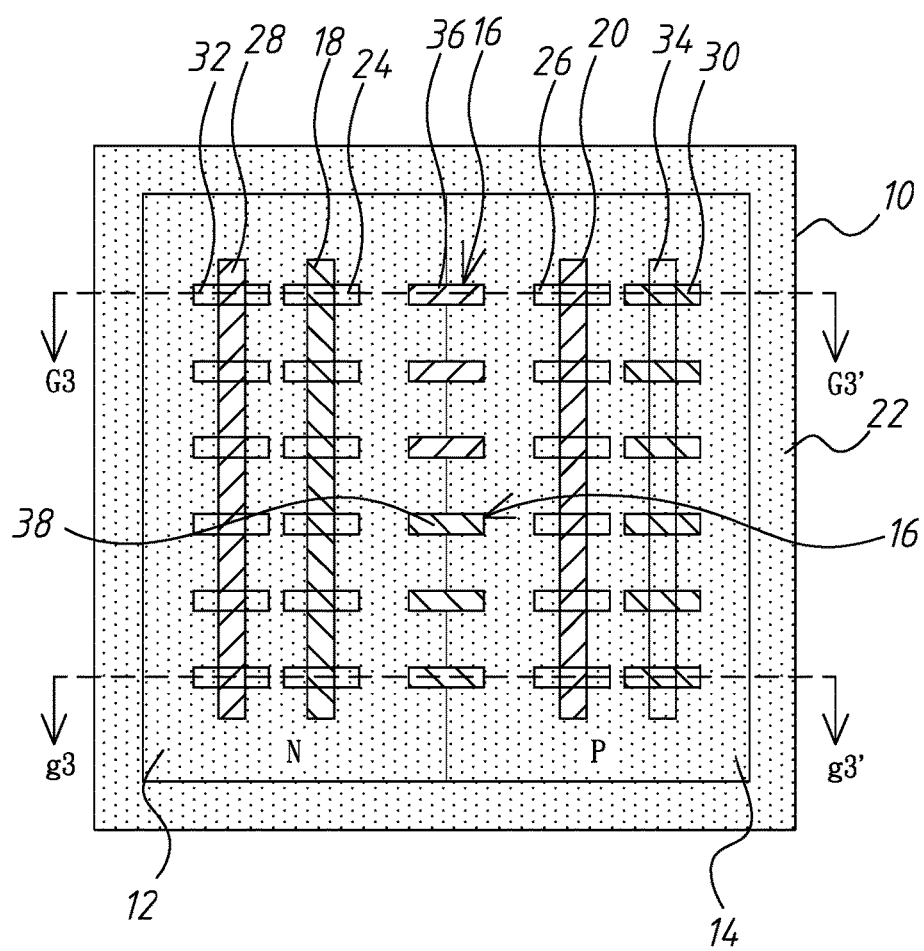
FIG. 63 is a layout schematically showing a self-balanced silicon-controlled rectification device according to the twenty-seventh embodiment of the present invention.
Figure 64:
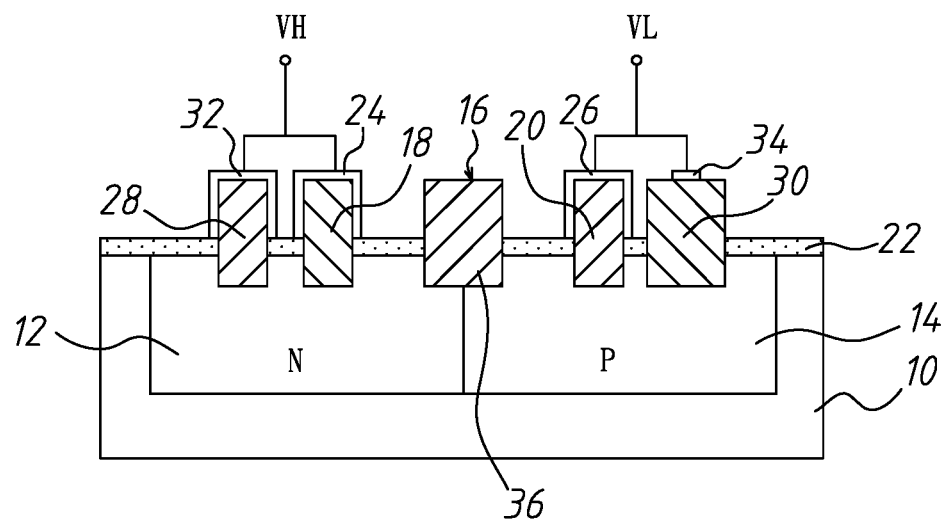
FIG. 64 is a sectional view taken along Line G3-G3' of FIG. 63.
Figure 65:
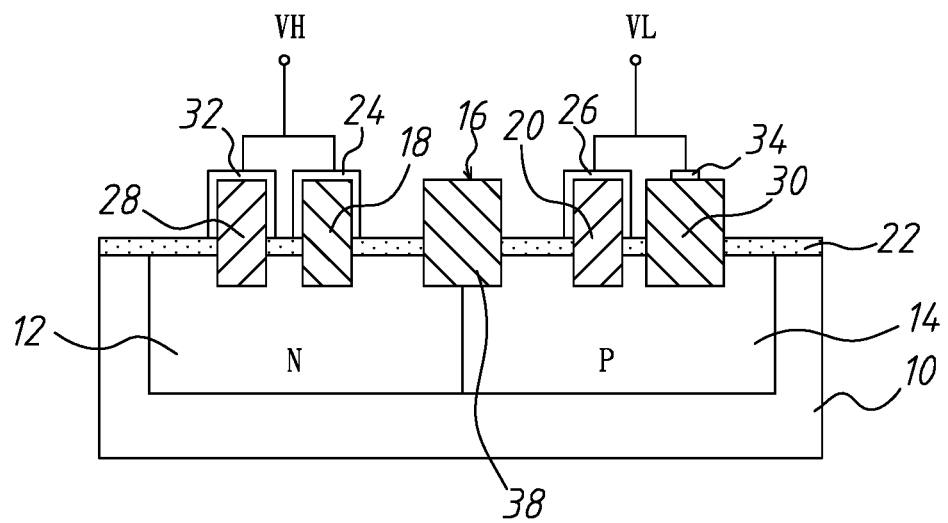
FIG. 65 is a sectional view taken along Line g3-g3' of FIG. 63.

Refer to FIG. 63, FIG. 64 and FIG. 65. The twenty-seventh embodiment of the self-balanced silicon-controlled rectification device of the present invention is introduced as below. The twenty-seventh embodiment is different from the eleventh embodiment in the heavily doped clamping fins 16. In the twenty-seventh embodiment, the heavily doped clamping fins 16 are realized with a plurality of neighbored N-type heavily doped clamping fins 36 and a plurality of neighbored P-type heavily doped clamping fins 38, and the insulation layer 22 is arranged among the heavily doped clamping fins 16. The other structures of the twenty-seventh embodiment are the same to those of the eleventh embodiment so will not be reiterated.

Figure 66:
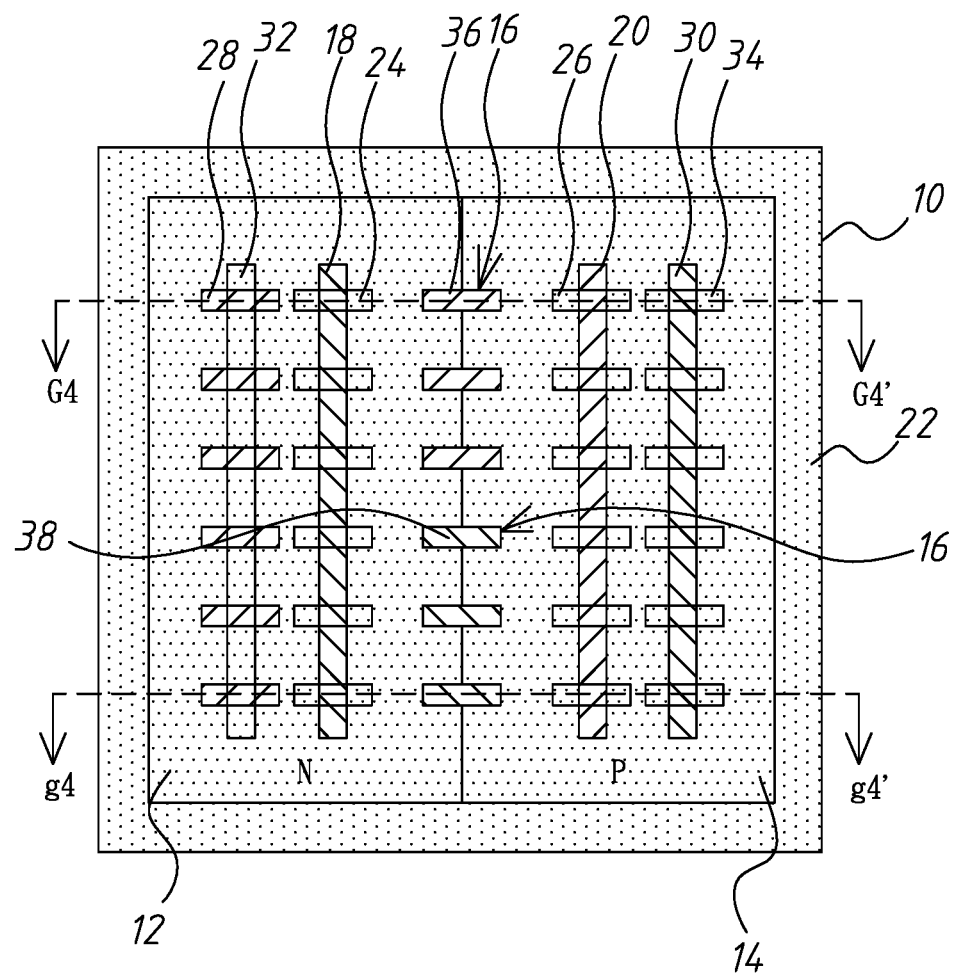
FIG. 66 is a layout schematically showing a self-balanced silicon-controlled rectification device according to the twenty-eighth embodiment of the present invention.
Figure 67:
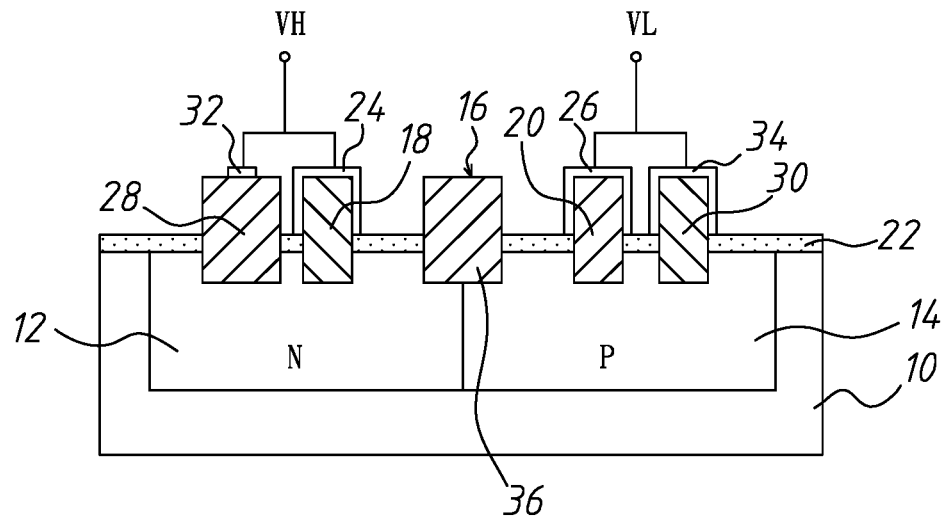
FIG. 67 is a sectional view taken along Line G4-G4' of FIG. 66.
Figure 68:
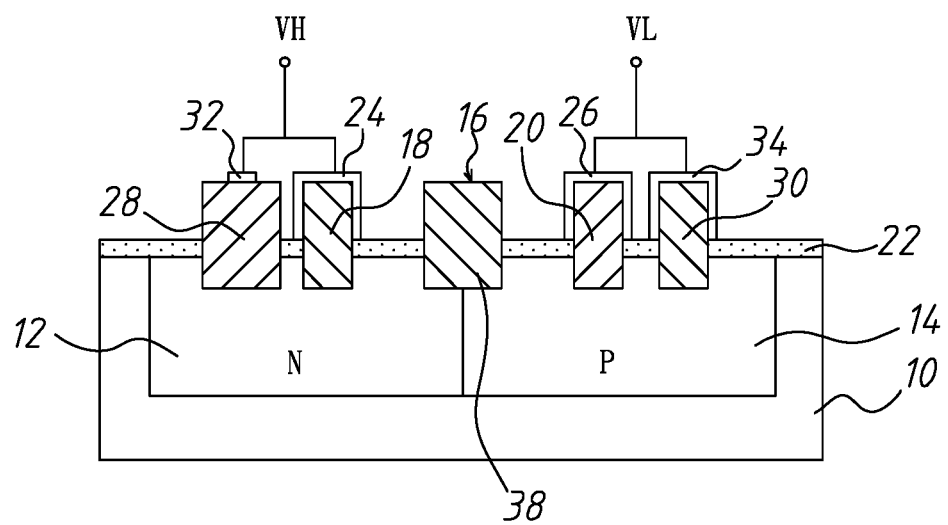
FIG. 68 is a sectional view taken along Line g4-g4' of FIG. 66.

Refer to FIG. 66, FIG. 67 and FIG. 68. The twenty-eighth embodiment of the self-balanced silicon-controlled rectification device of the present invention is introduced as below. The twenty-eighth embodiment is different from the twelfth embodiment in the heavily doped clamping fins 16. In the twenty-eighth embodiment, the heavily doped clamping fins 16 are realized with a plurality of neighbored N-type heavily doped clamping fins 36 and a plurality of neighbored P-type heavily doped clamping fins 38, and the insulation layer 22 is arranged among the heavily doped clamping fins 16. The other structures of the twenty-eighth embodiment are the same to those of the twelfth embodiment so will not be reiterated.

Figure 69:
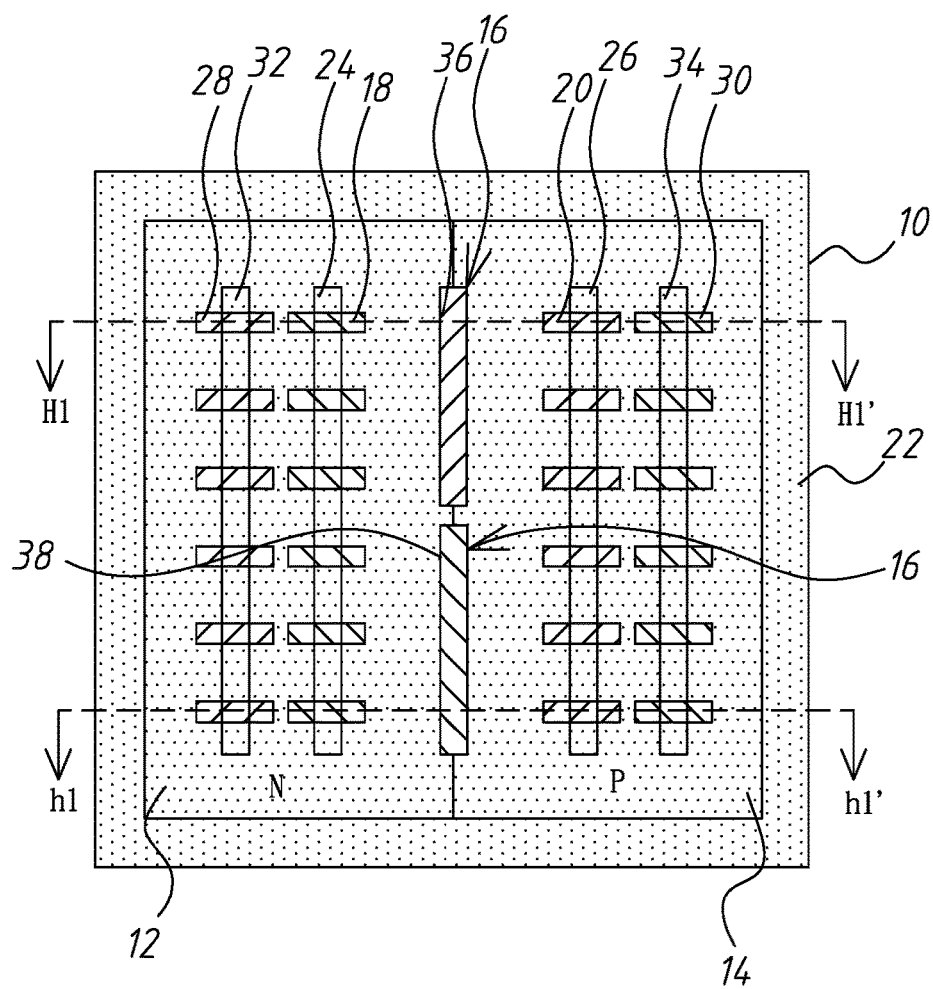
FIG. 69 is a layout schematically showing a self-balanced silicon-controlled rectification device according to the twenty-ninth embodiment of the present invention.
Figure 70:
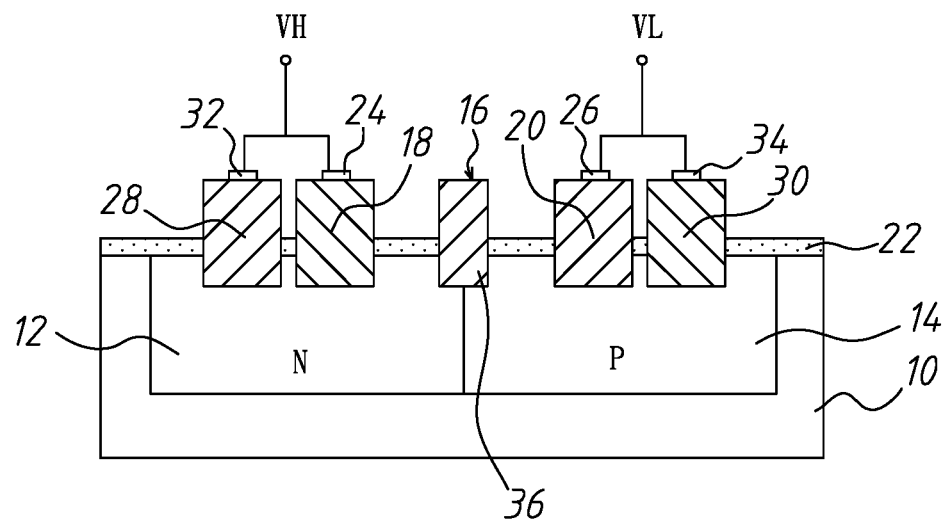
FIG. 70 is a sectional view taken along Line H1-H1' of FIG. 69.
Figure 71:
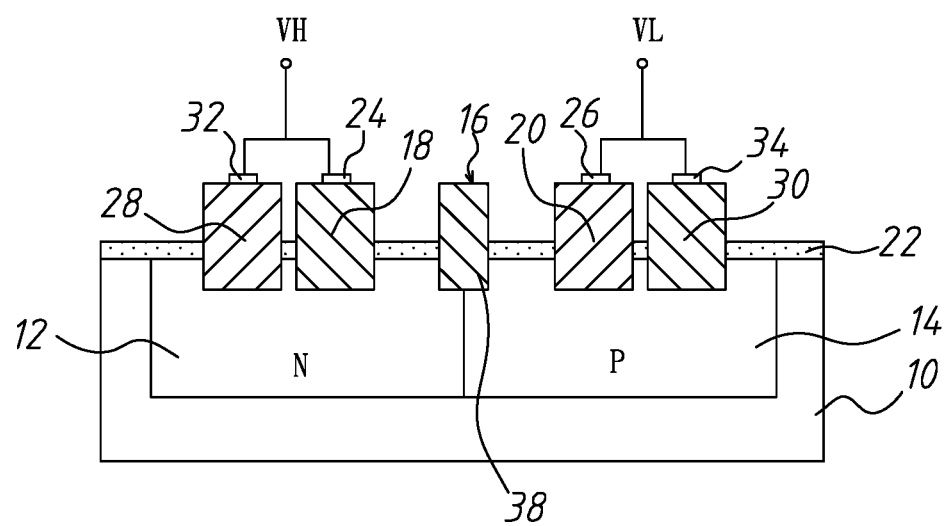
FIG. 71 is a sectional view taken along Line h1-h1' of FIG. 69.

Refer to FIG. 69, FIG. 70 and FIG. 71. The twenty-ninth embodiment of the self-balanced silicon-controlled rectification device of the present invention is introduced as below. The twenty-ninth embodiment is different from the thirteenth embodiment in the heavily doped clamping fins 16. In the twenty-ninth embodiment, the heavily doped clamping fins 16 are realized with one N-type heavily doped clamping fin 36 and one P-type heavily doped clamping fin 38, and the insulation layer 22 is arranged among the heavily doped clamping fins 16. The other structures of the twenty-ninth embodiment are the same to those of the thirteenth embodiment so will not be reiterated.

Figure 72:
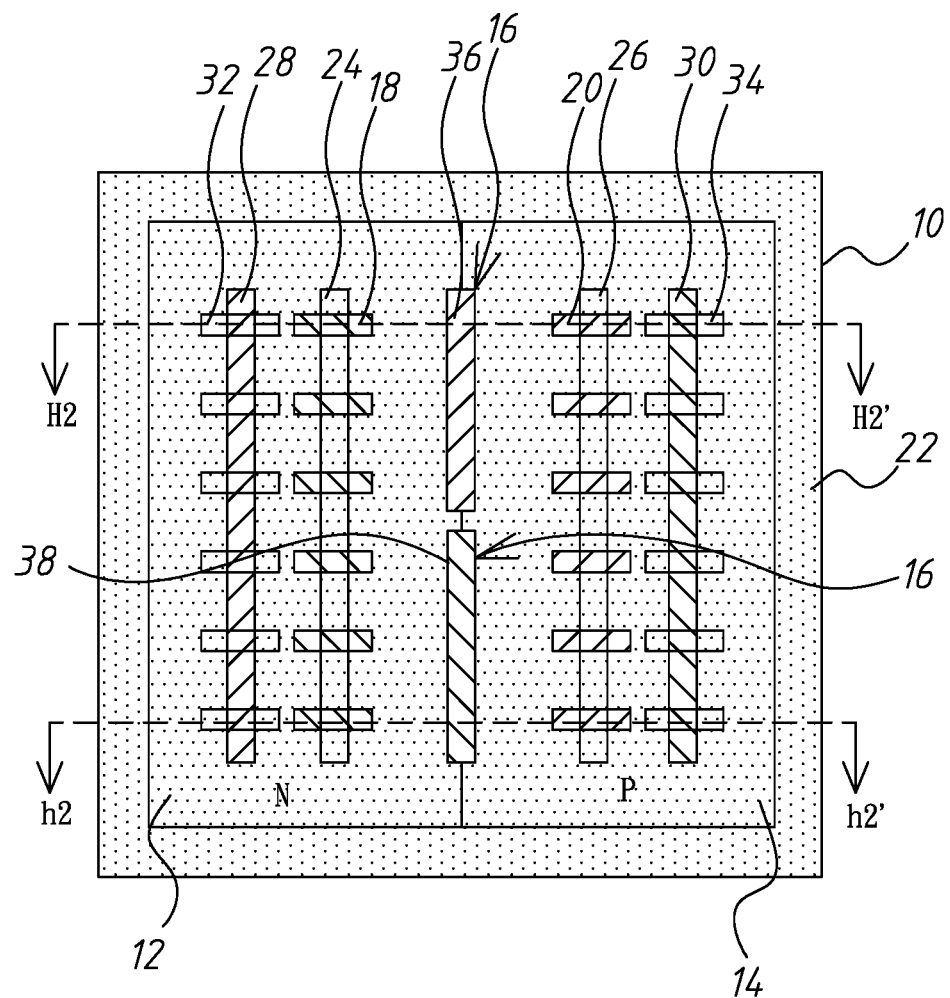
FIG. 72 is a layout schematically showing a self-balanced silicon-controlled rectification device according to the thirtieth embodiment of the present invention.
Figure 73:
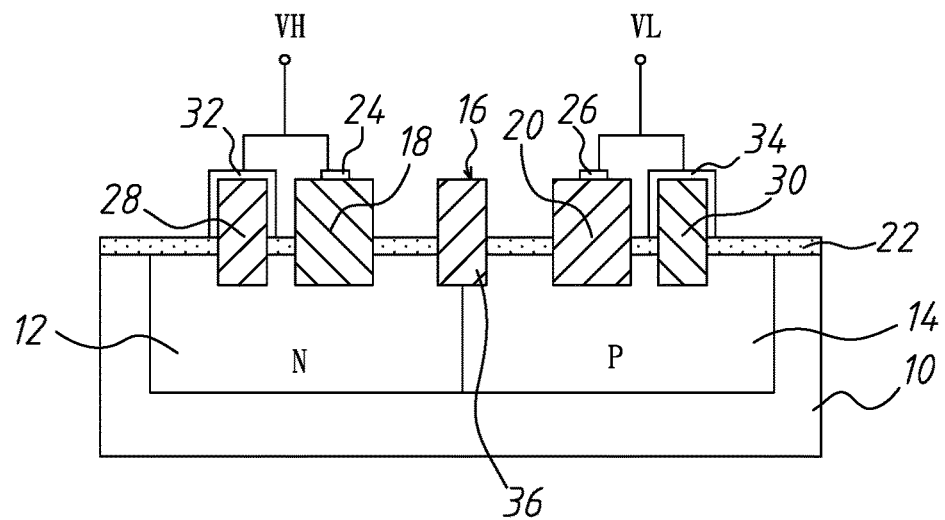
FIG. 73 is a sectional view taken along Line H2-H2' of FIG. 72.
Figure 74:
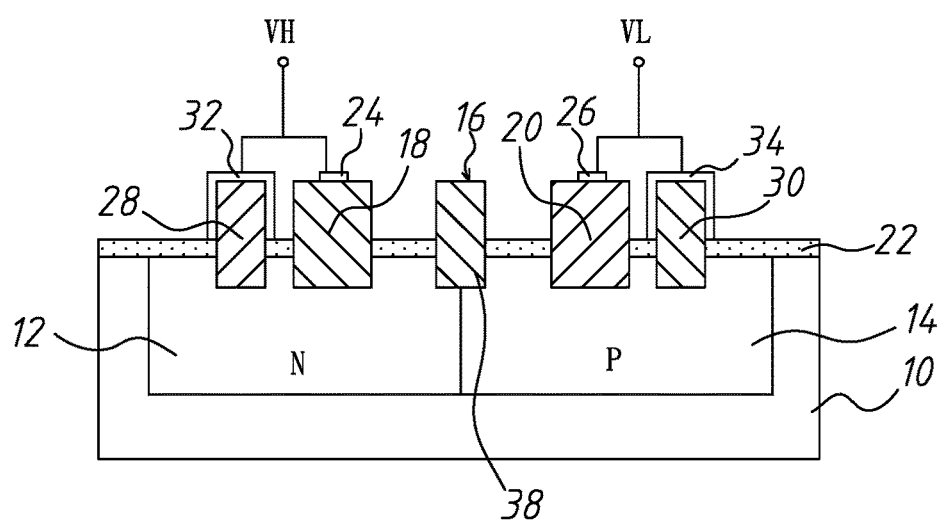
FIG. 74 is a sectional view taken along Line h2-h2' of FIG. 72.

Refer to FIG. 72, FIG. 73 and FIG. 74. The thirtieth embodiment of the self-balanced silicon-controlled rectification device of the present invention is introduced as below. The thirtieth embodiment is different from the fourteenth embodiment in the heavily doped clamping fins 16. In the thirtieth embodiment, the heavily doped clamping fins 16 are realized with one N-type heavily doped clamping fin 36 and one P-type heavily doped clamping fin 38, and the insulation layer 22 is arranged among the heavily doped clamping fins 16. The other structures of the thirtieth embodiment are the same to those of the fourteenth embodiment so will not be reiterated.

Figure 75:
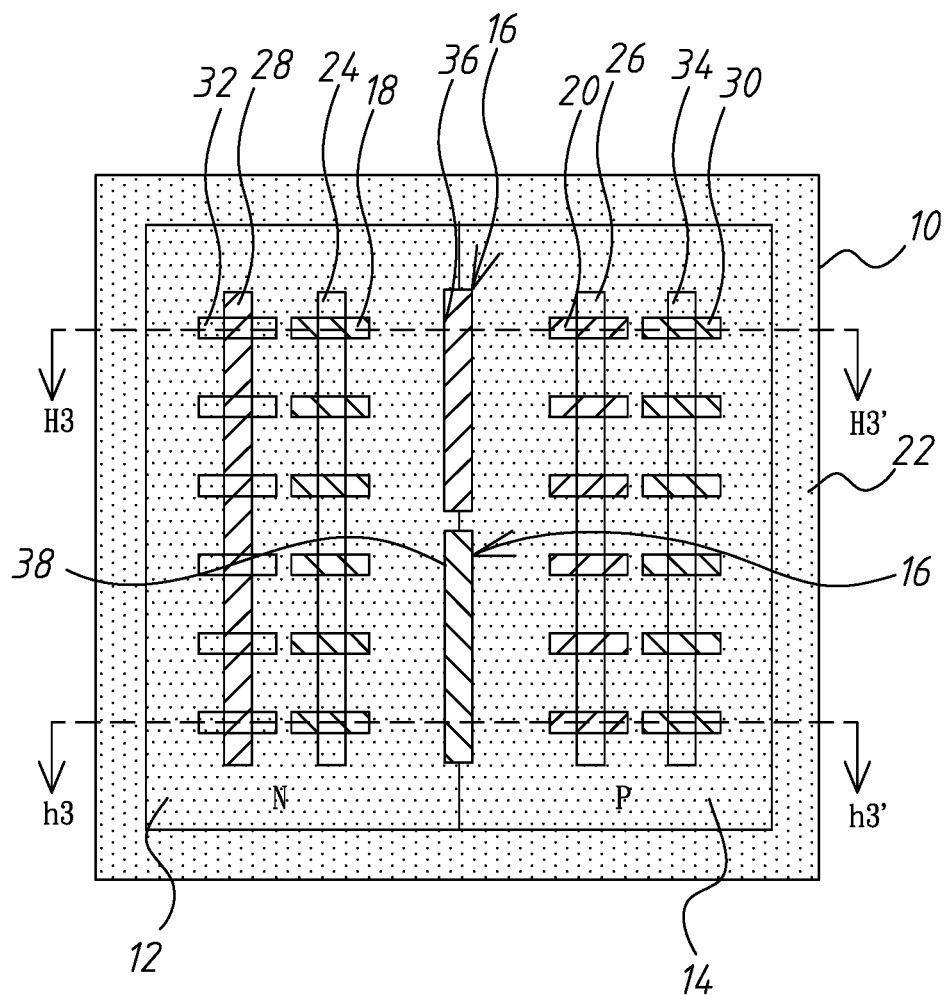
FIG. 75 is a layout schematically showing a self-balanced silicon-controlled rectification device according to the thirty-first embodiment of the present invention.
Figure 76:
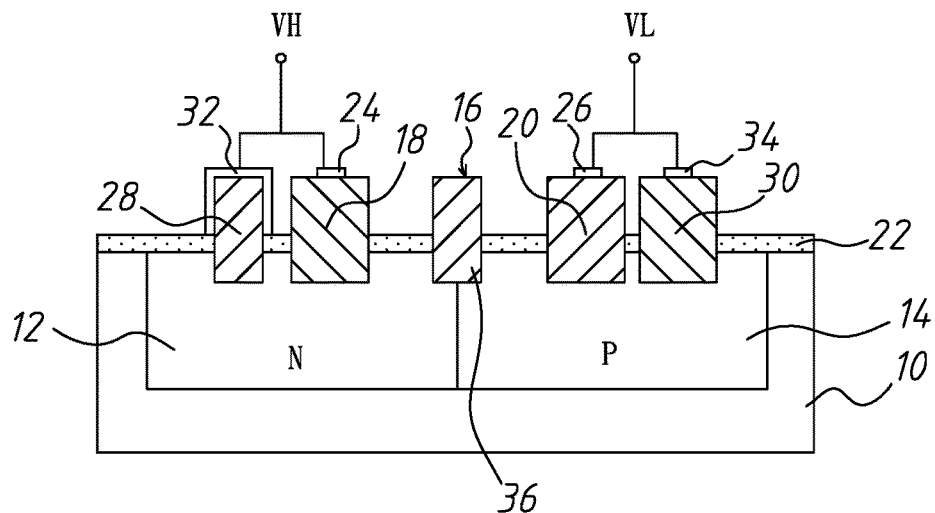
FIG. 76 is a sectional view taken along Line H3-H3' of FIG. 75.
Figure 77:
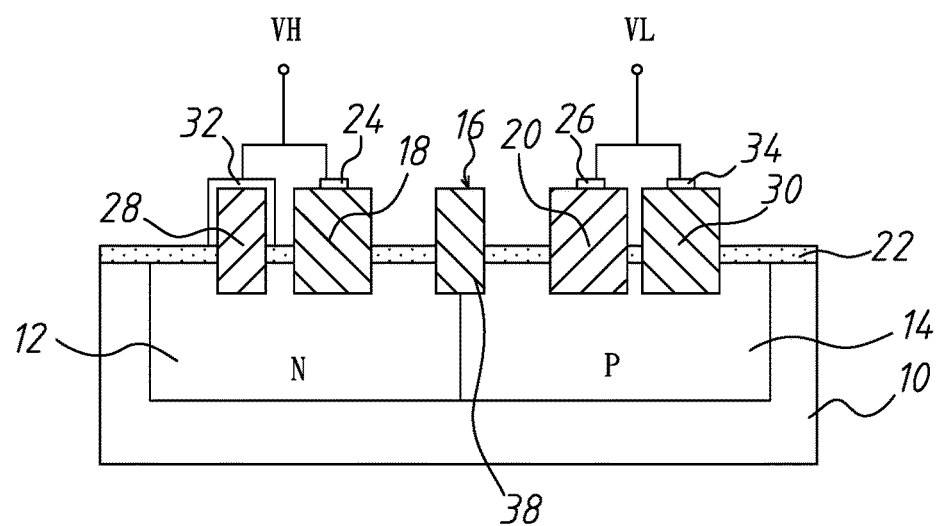
FIG. 77 is a sectional view taken along Line h3-h3' of FIG. 75.

Refer to FIG. 75, FIG. 76 and FIG. 77. The thirty-first embodiment of the self-balanced silicon-controlled rectification device of the present invention is introduced as below. The thirty-first embodiment is different from the fifteenth embodiment in the heavily doped clamping fins 16. In the thirty-first embodiment, the heavily doped clamping fins 16 are realized with one N-type heavily doped clamping fin 36 and one P-type heavily doped clamping fin 38, and the insulation layer 22 is arranged among the heavily doped clamping fins 16. The other structures of the thirty-first embodiment are the same to those of the fifteenth embodiment so will not be reiterated.

Figure 78:
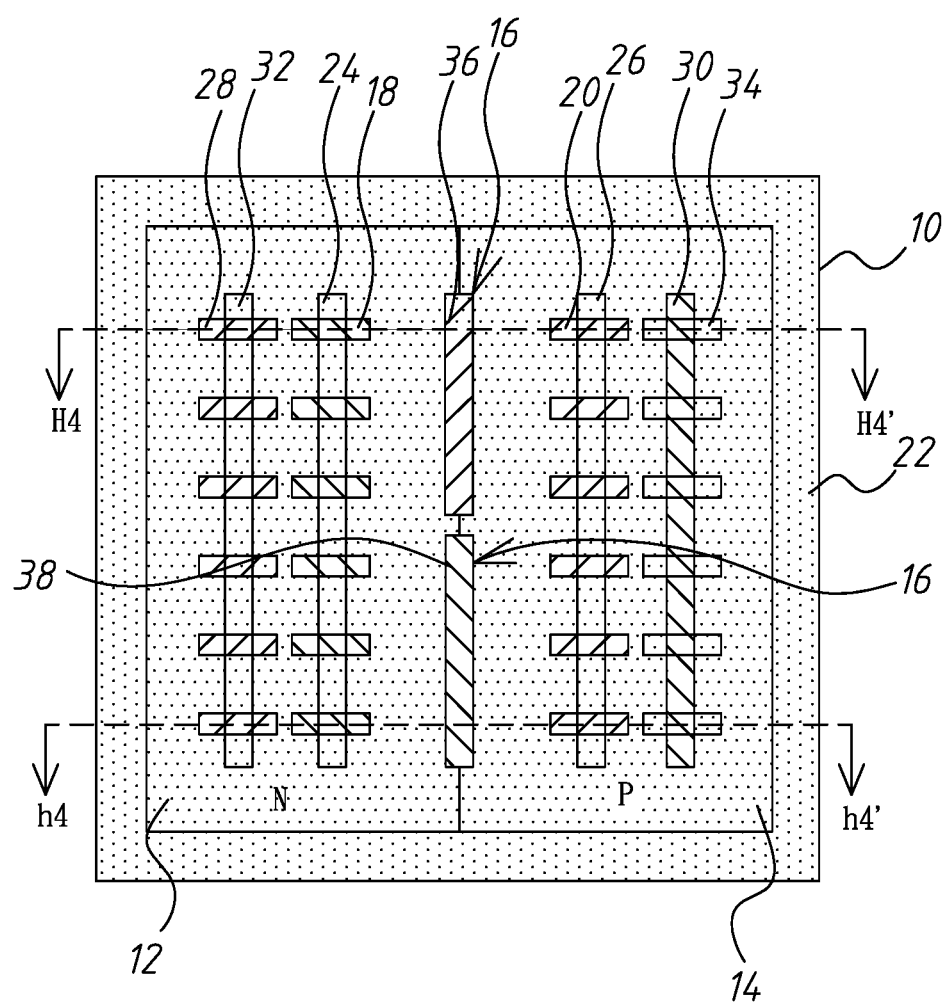
FIG. 78 is a layout schematically showing a self-balanced silicon-controlled rectification device according to the thirty-second embodiment of the present invention.
Figure 79:
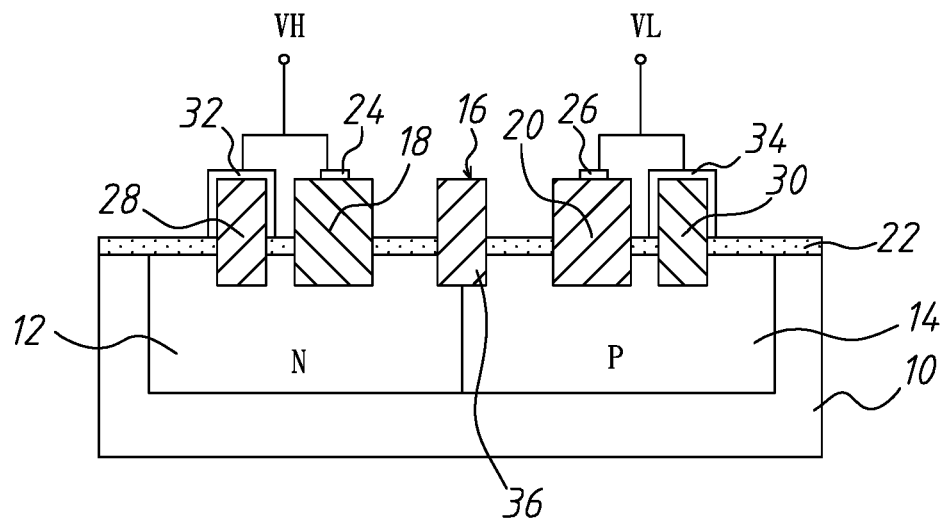
FIG. 79 is a sectional view taken along Line H4-H4' of FIG. 78.
Figure 80:
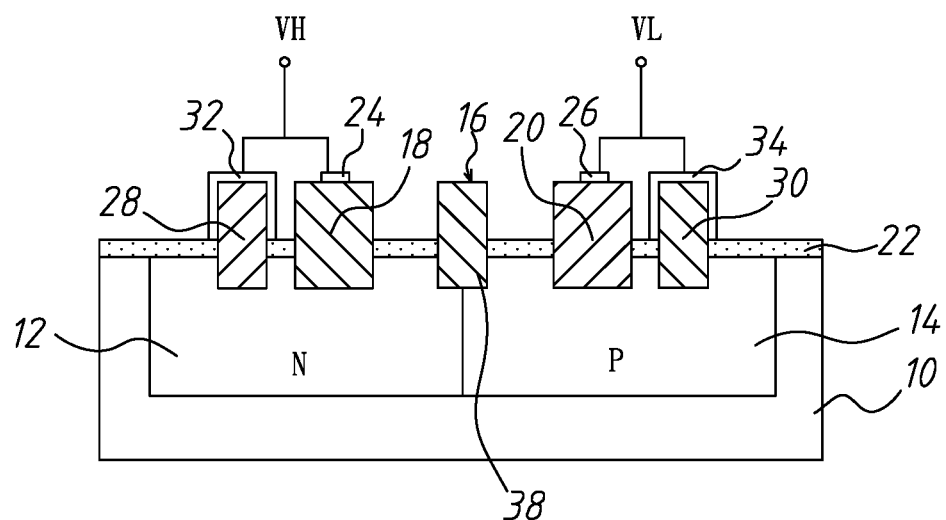
FIG. 80 is a sectional view taken along Line h4-h4' of FIG. 78.

Refer to FIG. 78, FIG. 79 and FIG. 80. The thirty-second embodiment of the self-balanced silicon-controlled rectification device of the present invention is introduced as below. The thirty-second embodiment is different from the sixteenth embodiment in the heavily doped clamping fins 16. In the thirty-second embodiment, the heavily doped clamping fins 16 are realized with one N-type heavily doped clamping fin 36 and one P-type heavily doped clamping fin 38, and the insulation layer 22 is arranged among the heavily doped clamping fins 16. The other structures of the thirty-second embodiment are the same to those of the sixteenth embodiment so will not be reiterated.

In the first embodiment to the sixteenth embodiment, at least one heavily doped clamping fin is arranged in the N-type doped well 12 and the P-type well 14. Besides, at least one heavily doped clamping fin 16 further comprises a plurality of P-type heavily doped clamping fins and a plurality of N-type heavily doped clamping fins arranged in an alternative way, as shown in the following embodiments.

Figure 81:
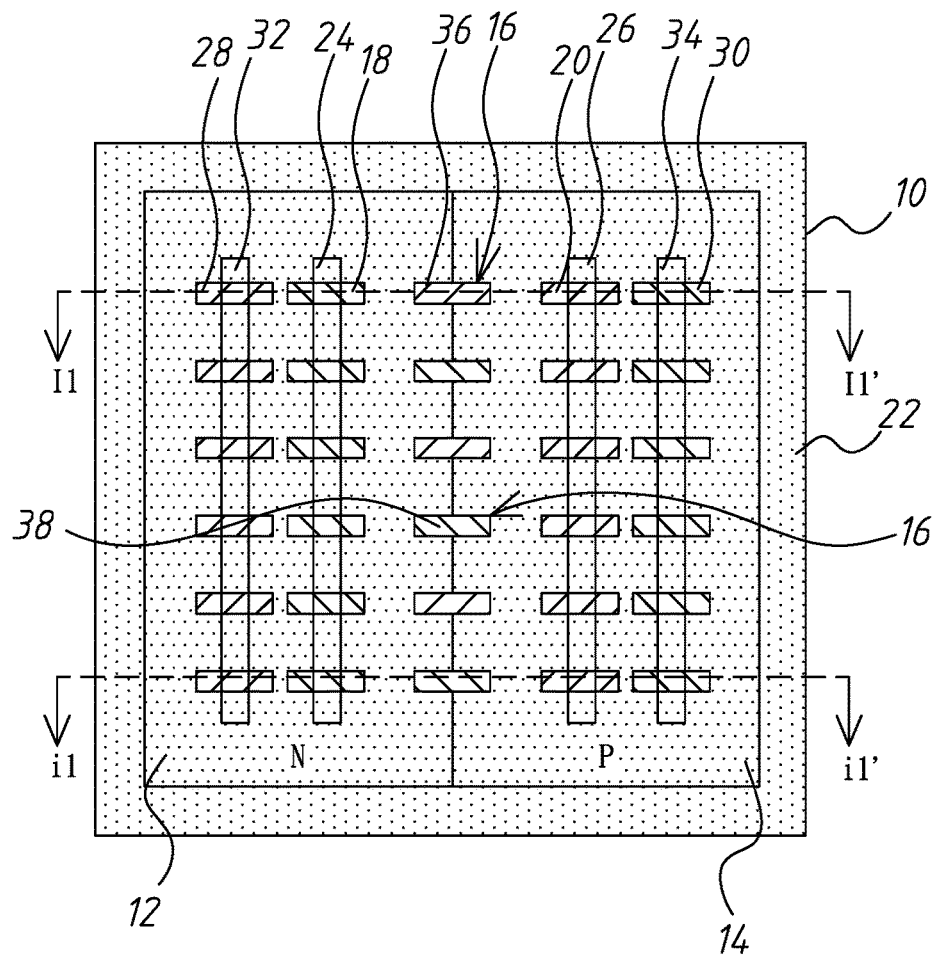
FIG. 81 is a layout schematically showing a self-balanced silicon-controlled rectification device according to the thirty-third embodiment of the present invention.
Figure 82:
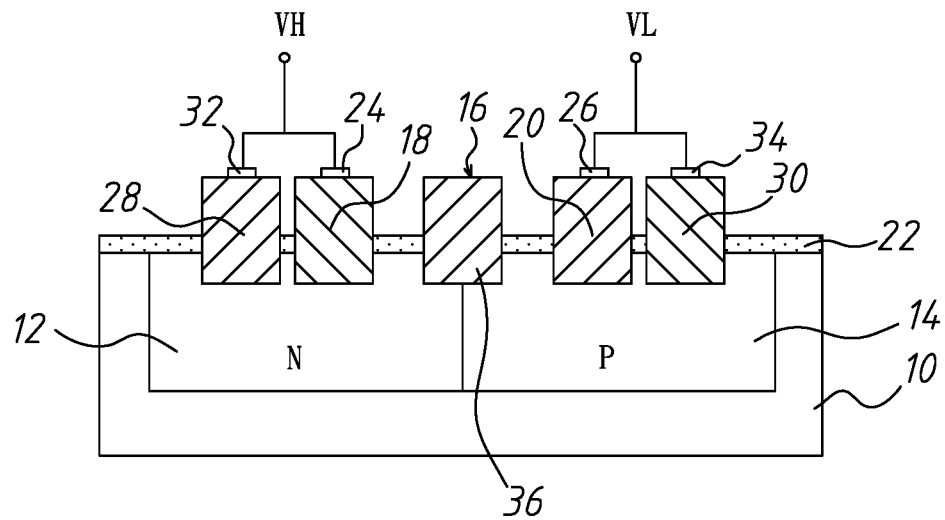
FIG. 82 is a sectional view taken along Line I1-I1' of FIG. 81.
Figure 83:
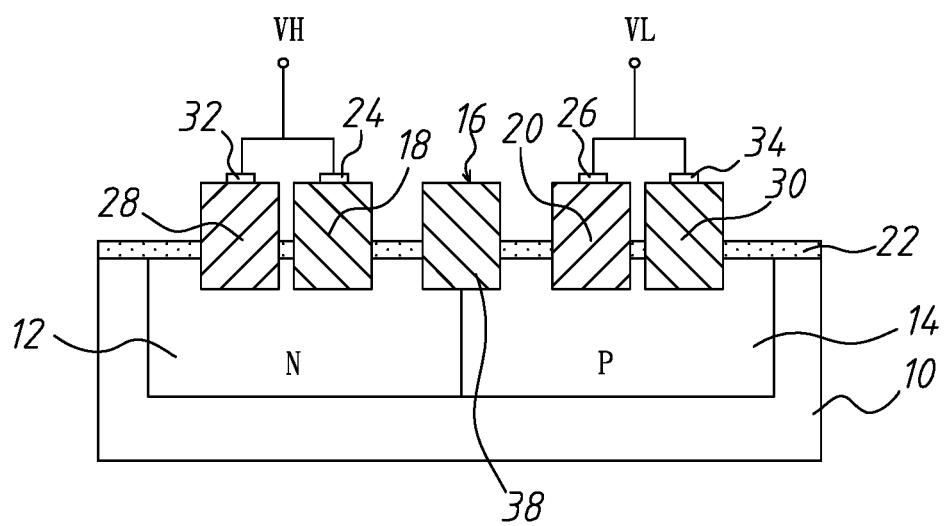
FIG. 83 is a sectional view taken along Line i1-i1' of FIG. 81.

Refer to FIG. 81, FIG. 82 and FIG. 83. The thirty-third embodiment of the self-balanced silicon-controlled rectification device of the present invention is introduced as below. The thirty-third embodiment is different from the first embodiment in the heavily doped clamping fins 16. In the thirty-third embodiment, the heavily doped clamping fins 16 are realized with a plurality of N-type heavily doped clamping fins 36 and a plurality of P-type heavily doped clamping fins 38 arranged in an alternative way, and the insulation layer 22 is arranged among the heavily doped clamping fins 16. The other structures of the thirty-third embodiment are the same to those of the first embodiment so will not be reiterated.

Figure 84:
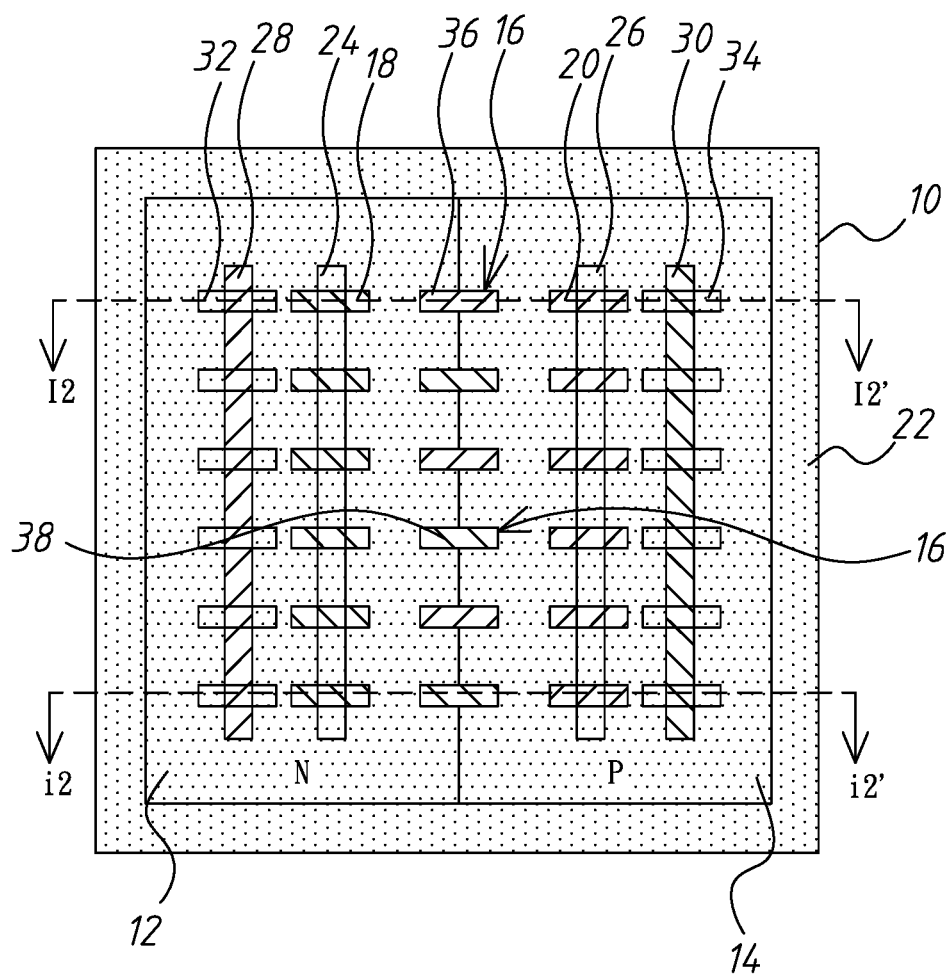
FIG. 84 is a layout schematically showing a self-balanced silicon-controlled rectification device according to the thirty-fourth embodiment of the present invention.
Figure 85:
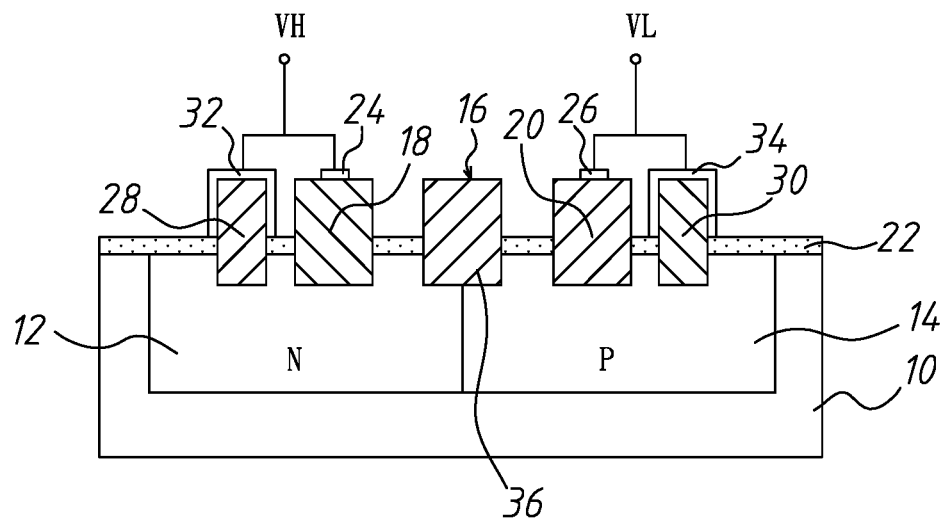
FIG. 85 is a sectional view taken along Line I2-I2' of FIG. 84.
Figure 86:
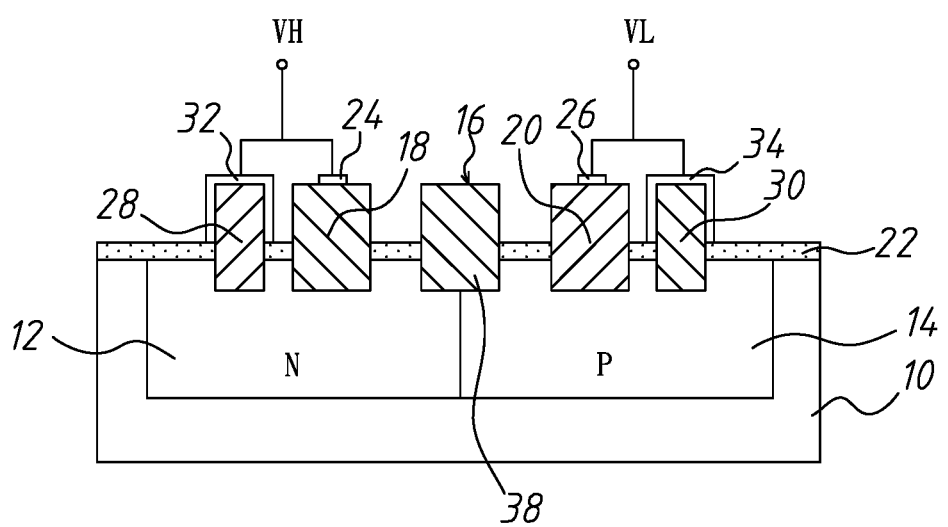
FIG. 86 is a sectional view taken along Line i2-i2' of FIG. 84.

Refer to FIG. 84, FIG. 85 and FIG. 86. The thirty-fourth embodiment of the self-balanced silicon-controlled rectification device of the present invention is introduced as below. The thirty-fourth embodiment is different from the second embodiment in the heavily doped clamping fins 16. In the thirty-fourth embodiment, the heavily doped clamping fins 16 are realized with a plurality of N-type heavily doped clamping fins 36 and a plurality of P-type heavily doped clamping fins 38 arranged in an alternative way, and the insulation layer 22 is arranged among the heavily doped clamping fins 16. The other structures of the thirty-fourth embodiment are the same to those of the second embodiment so will not be reiterated.

Figure 87:
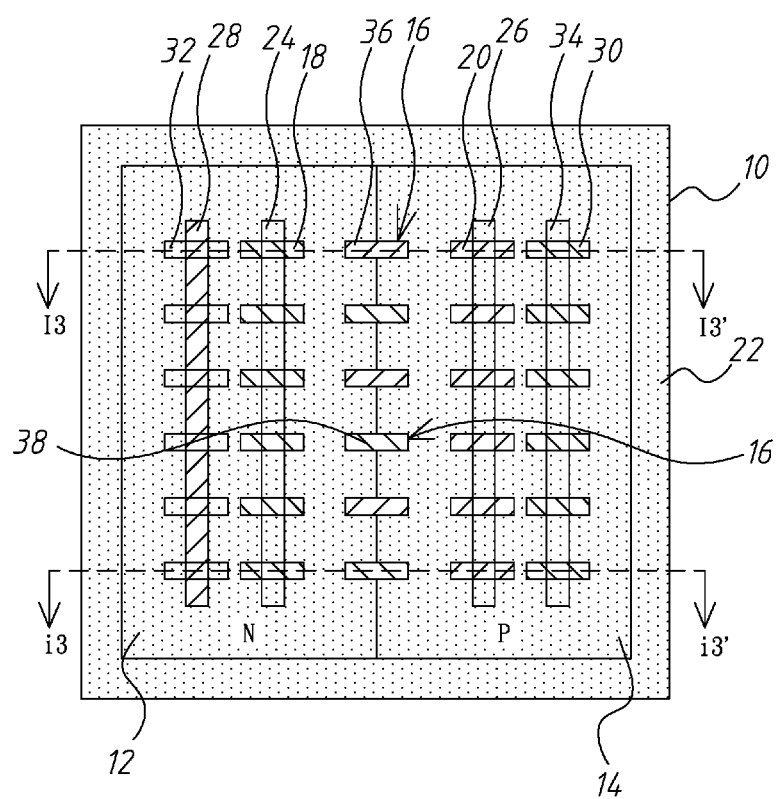
FIG. 87 is a layout schematically showing a self-balanced silicon-controlled rectification device according to the thirty-fifth embodiment of the present invention.
Figure 88:
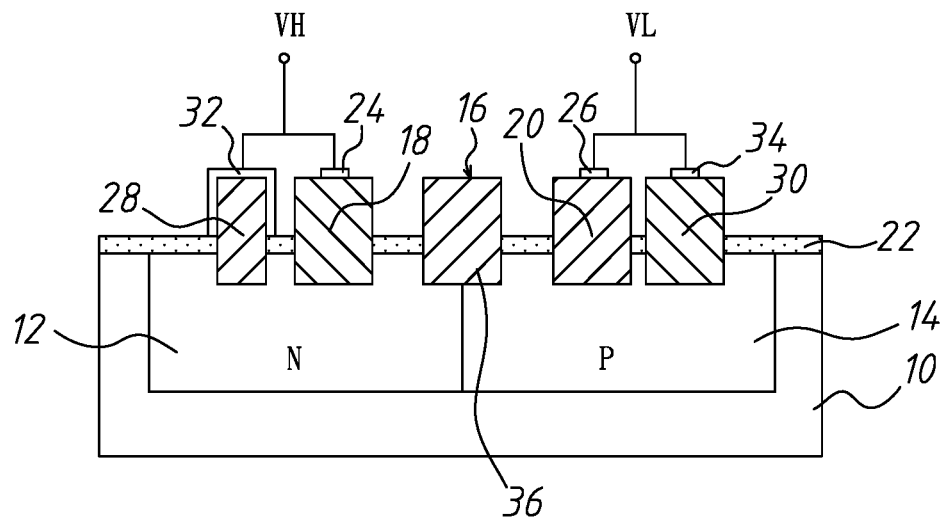
FIG. 88 is a sectional view taken along Line I3-I3' of FIG. 87.
Figure 89:
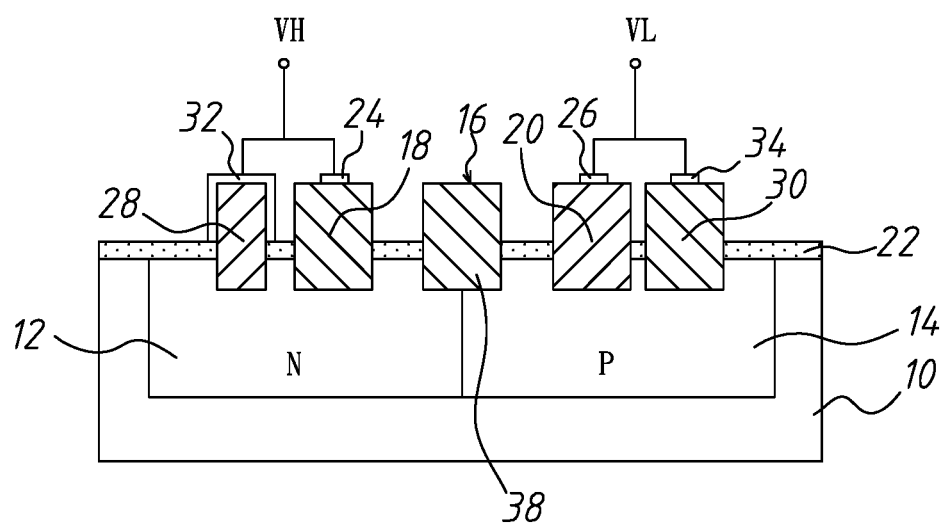
FIG. 89 is a sectional view taken along Line i3-i3' of FIG. 87.

Refer to FIG. 87, FIG. 88 and FIG. 89. The thirty-fifth embodiment of the self-balanced silicon-controlled rectification device of the present invention is introduced as below. The thirty-fifth embodiment is different from the third embodiment in the heavily doped clamping fins 16. In the thirty-fifth embodiment, the heavily doped clamping fins 16 are realized with a plurality of N-type heavily doped clamping fins 36 and a plurality of P-type heavily doped clamping fins 38 arranged in an alternative way, and the insulation layer 22 is arranged among the heavily doped clamping fins 16. The other structures of the thirty-fifth embodiment are the same to those of the third embodiment so will not be reiterated.

Figure 90:
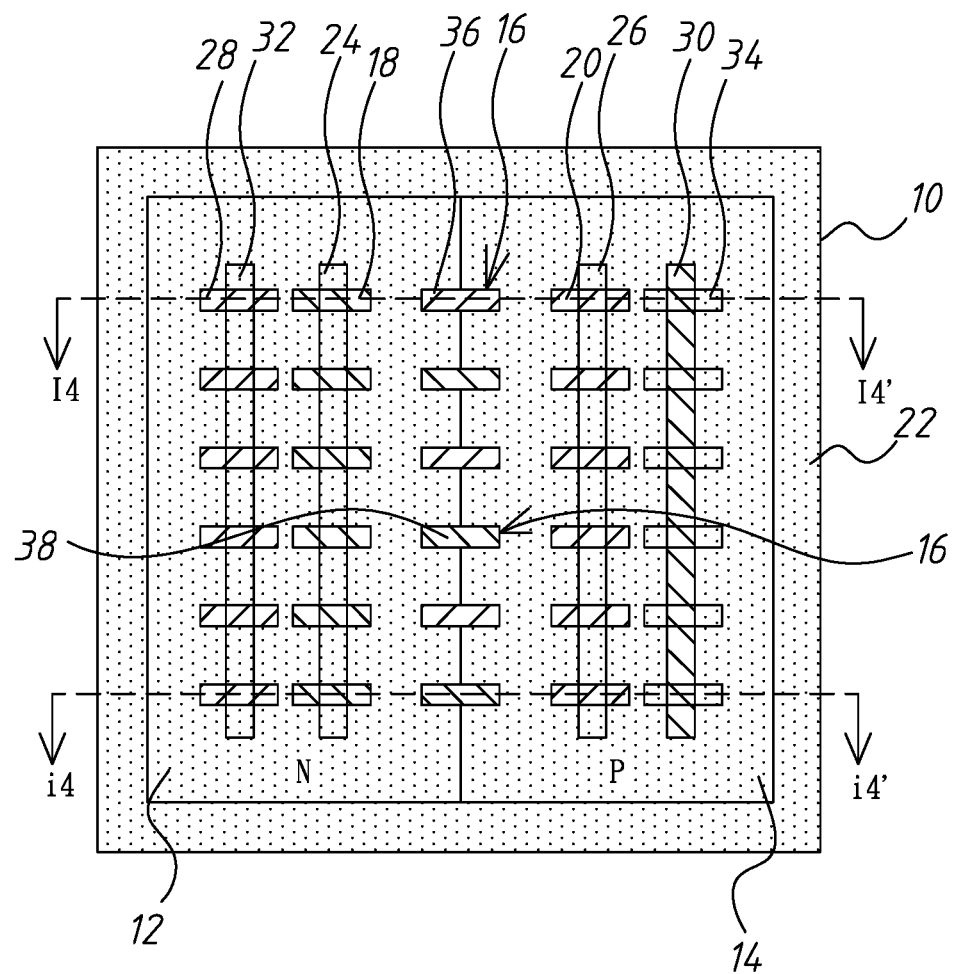
FIG. 90 is a layout schematically showing a self-balanced silicon-controlled rectification device according to the thirty-sixth embodiment of the present invention.
Figure 91:
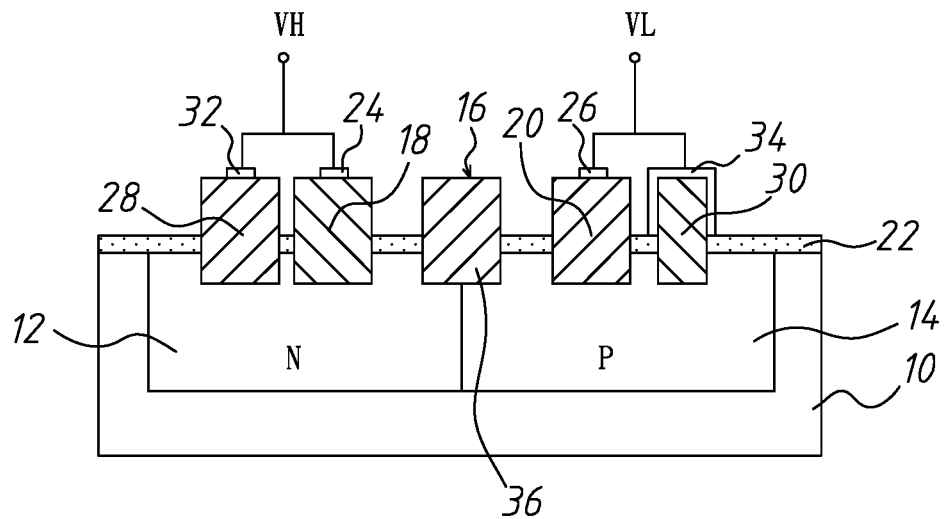
FIG. 91 is a sectional view taken along Line I4-I4' of FIG. 90.
Figure 92:
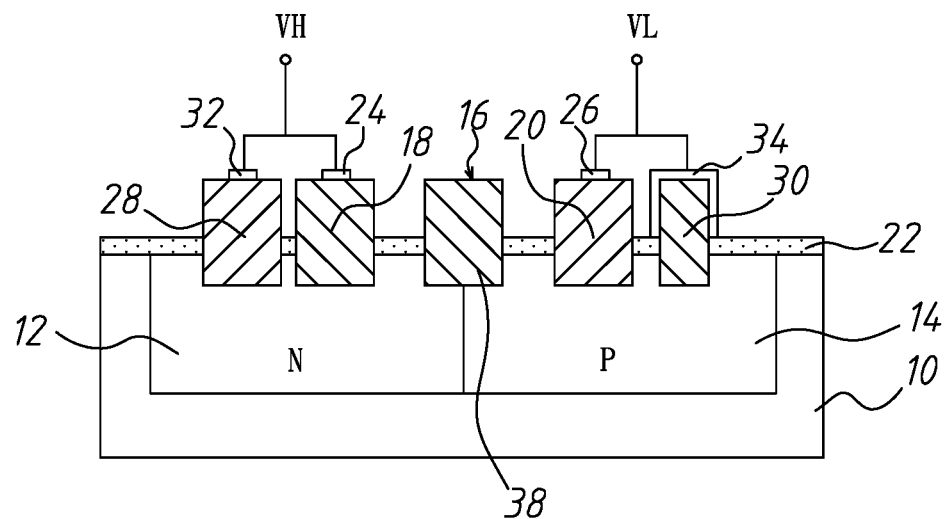
FIG. 92 is a sectional view taken along Line i4-i4' of FIG. 91.

Refer to FIG. 90, FIG. 91 and FIG. 92. The thirty-sixth embodiment of the self-balanced silicon-controlled rectification device of the present invention is introduced as below. The thirty-sixth embodiment is different from the fourth embodiment in the heavily doped clamping fins 16. In the thirty-sixth embodiment, the heavily doped clamping fins 16 are realized with a plurality of N-type heavily doped clamping fins 36 and a plurality of P-type heavily doped clamping fins 38 arranged in an alternative way, and the insulation layer 22 is arranged among the heavily doped clamping fins 16. The other structures of the thirty-sixth embodiment are the same to those of the fourth embodiment so will not be reiterated.

Figure 93:
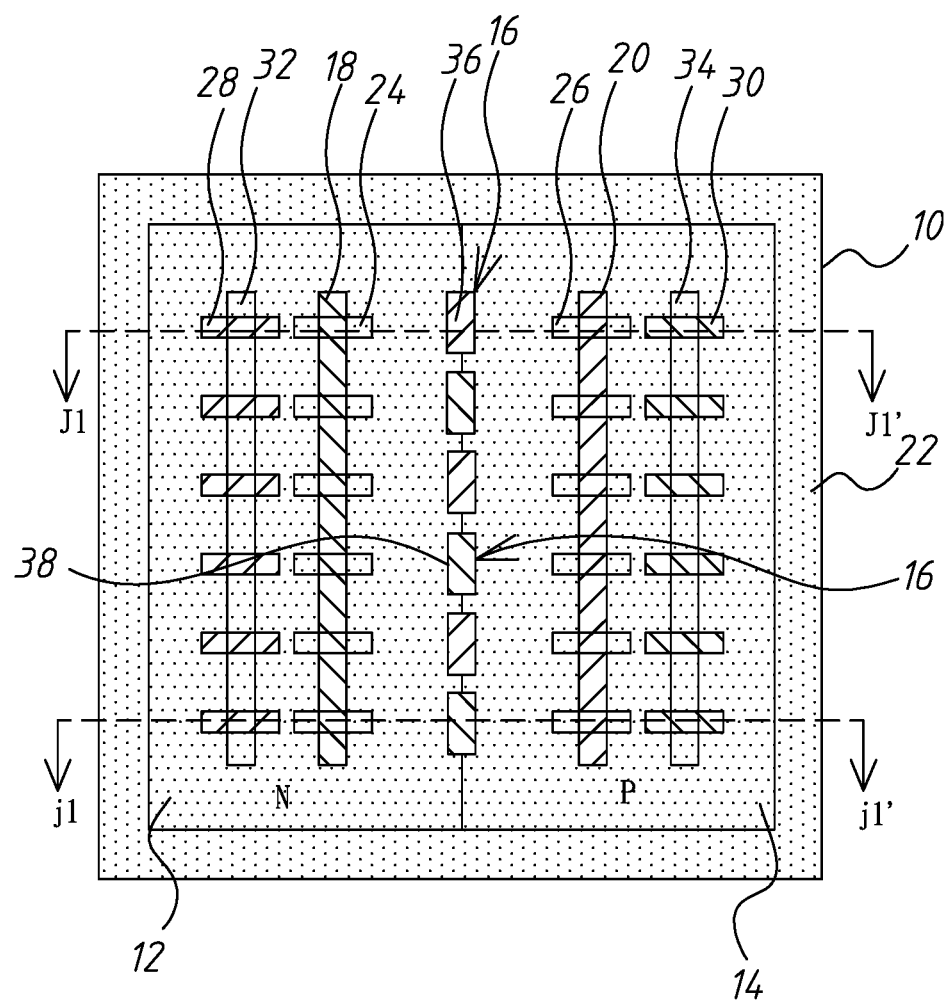
FIG. 93 is a layout schematically showing a self-balanced silicon-controlled rectification device according to the thirty-seventh embodiment of the present invention.
Figure 94:
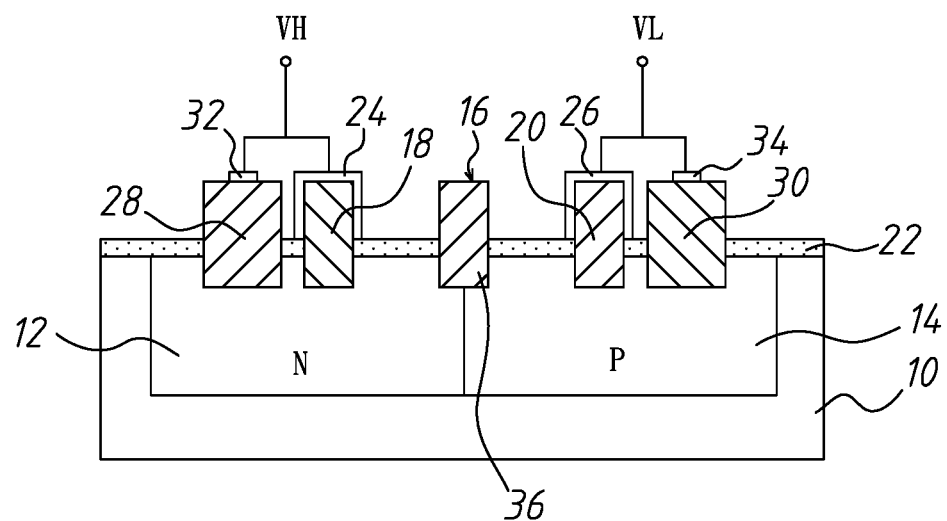
FIG. 94 is a sectional view taken along Line J1-J1' of FIG. 93.
Figure 95:
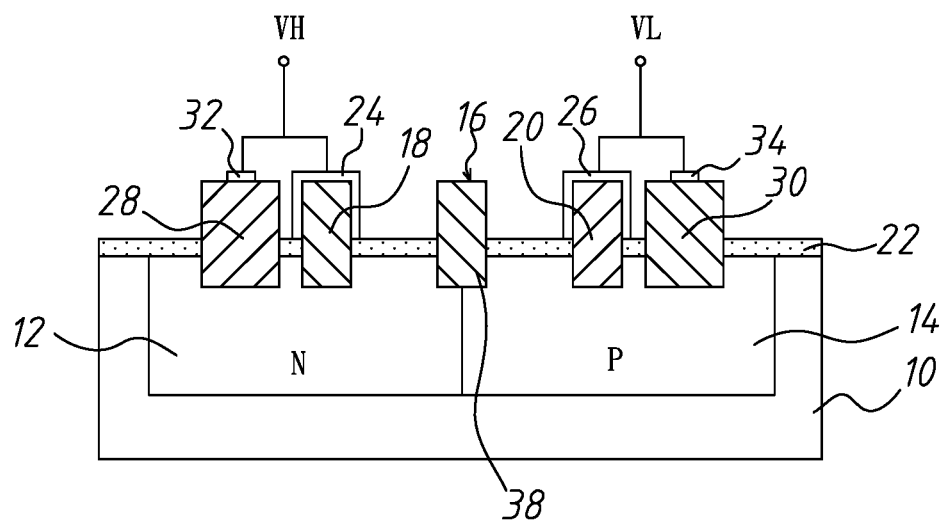
FIG. 95 is a sectional view taken along Line j1-j1' of FIG. 93.

Refer to FIG. 93, FIG. 94 and FIG. 95. The thirty-seventh embodiment of the self-balanced silicon-controlled rectification device of the present invention is introduced as below. The thirty-seventh embodiment is different from the fifth embodiment in the heavily doped clamping fins 16. In the thirty-seventh embodiment, the heavily doped clamping fins 16 are realized with a plurality of N-type heavily doped clamping fins 36 and a plurality of P-type heavily doped clamping fins 38 arranged in an alternative way, and the insulation layer 22 is arranged among the heavily doped clamping fins 16. The other structures of the thirty-seventh embodiment are the same to those of the fifth embodiment so will not be reiterated.

Figure 96:
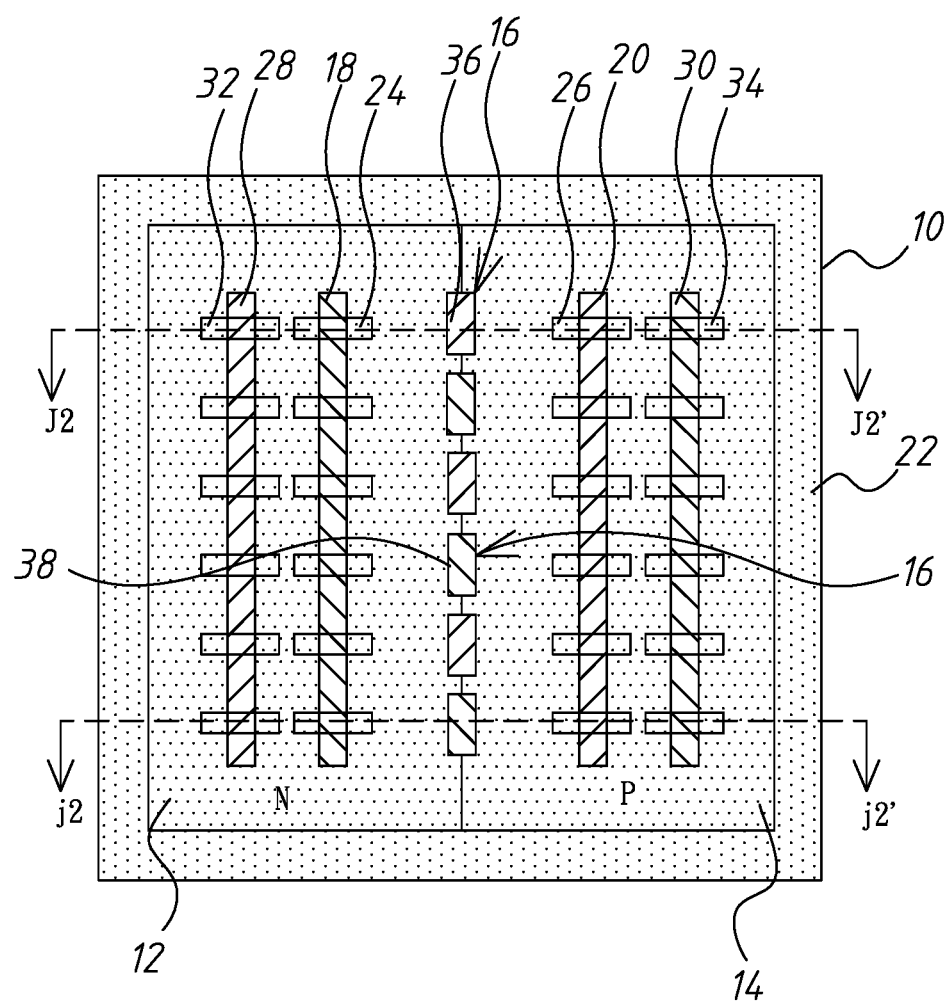
FIG. 96 is a layout schematically showing a self-balanced silicon-controlled rectification device according to the thirty-eighth embodiment of the present invention.
Figure 97:
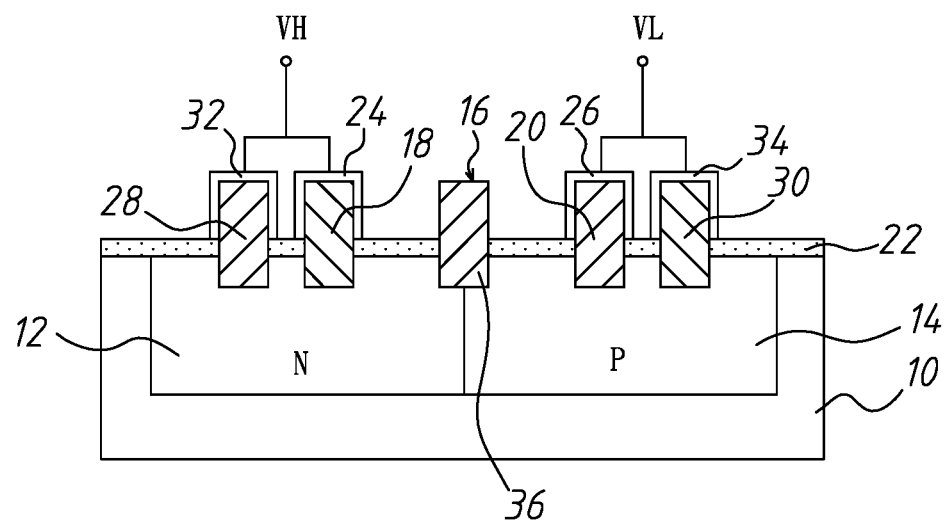
FIG. 97 is a sectional view taken along Line J2-J2' of FIG. 96.
Figure 98:
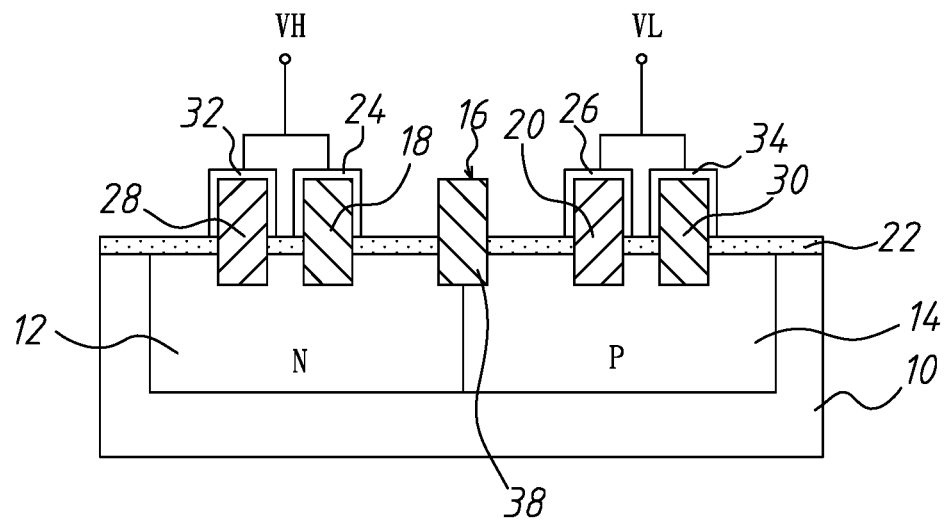
FIG. 98 is a sectional view taken along Line j2-j2' of FIG. 96.

Refer to FIG. 96, FIG. 97 and FIG. 98. The thirty-eighth embodiment of the self-balanced silicon-controlled rectification device of the present invention is introduced as below. The thirty-eighth embodiment is different from the sixth embodiment in the heavily doped clamping fins 16. In the thirty-eighth embodiment, the heavily doped clamping fins 16 are realized with a plurality of N-type heavily doped clamping fins 36 and a plurality of P-type heavily doped clamping fins 38 arranged in an alternative way, and the insulation layer 22 is arranged among the heavily doped clamping fins 16. The other structures of the thirty-eighth embodiment are the same to those of the sixth embodiment so will not be reiterated.

Figure 99:
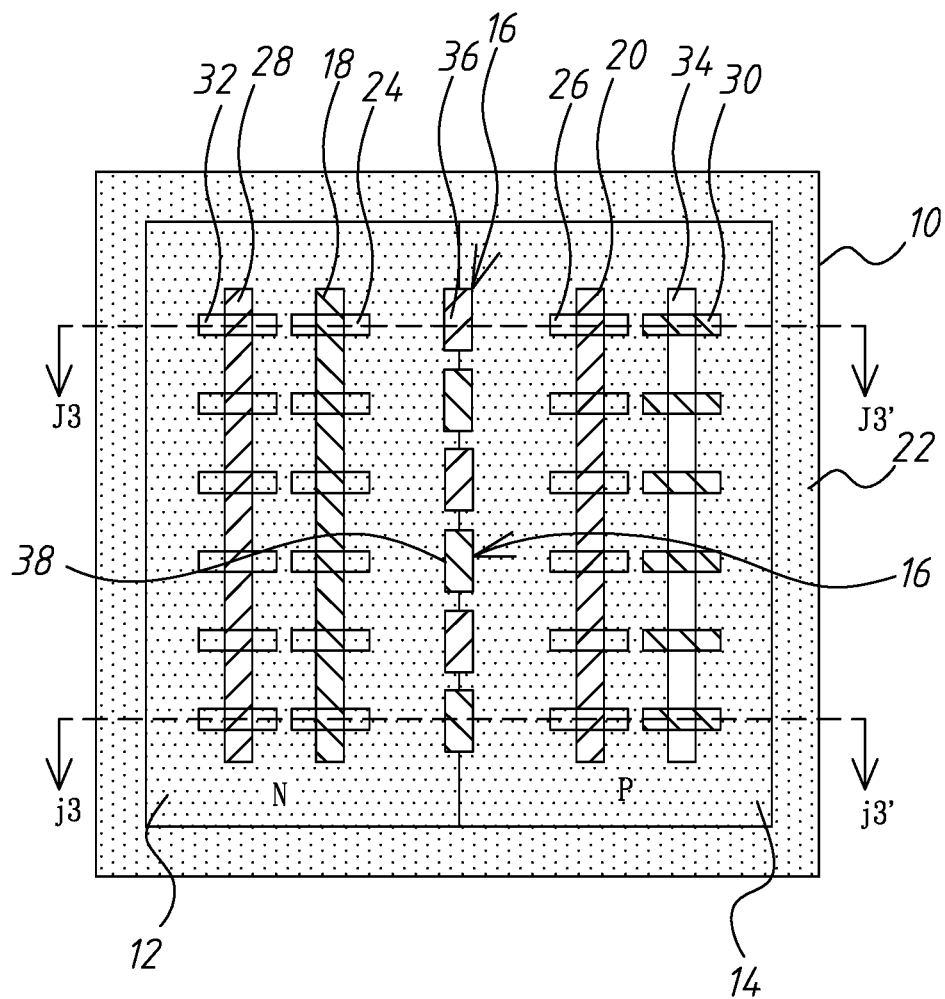
FIG. 99 is a layout schematically showing a self-balanced silicon-controlled rectification device according to the thirty-ninth embodiment of the present invention.
Figure 100:
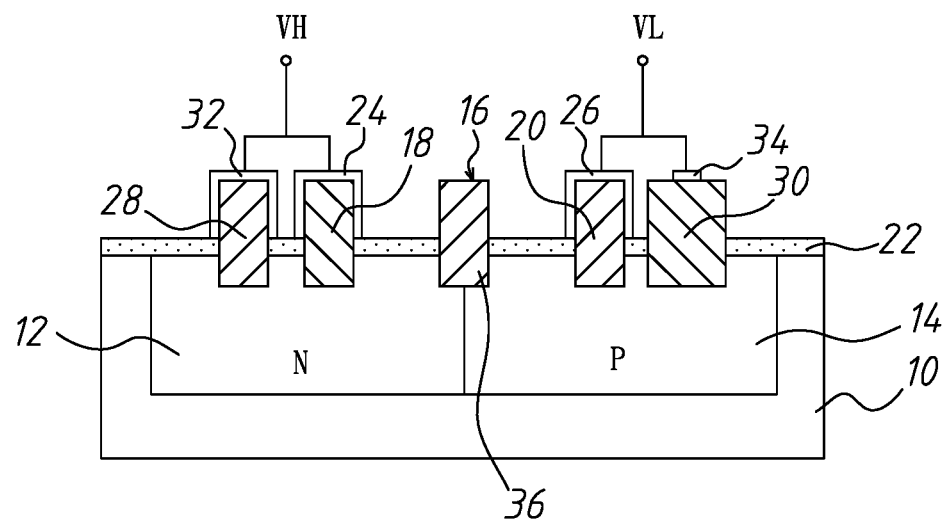
FIG. 100 is a sectional view taken along Line J3-J3' of FIG. 99.
Figure 101:
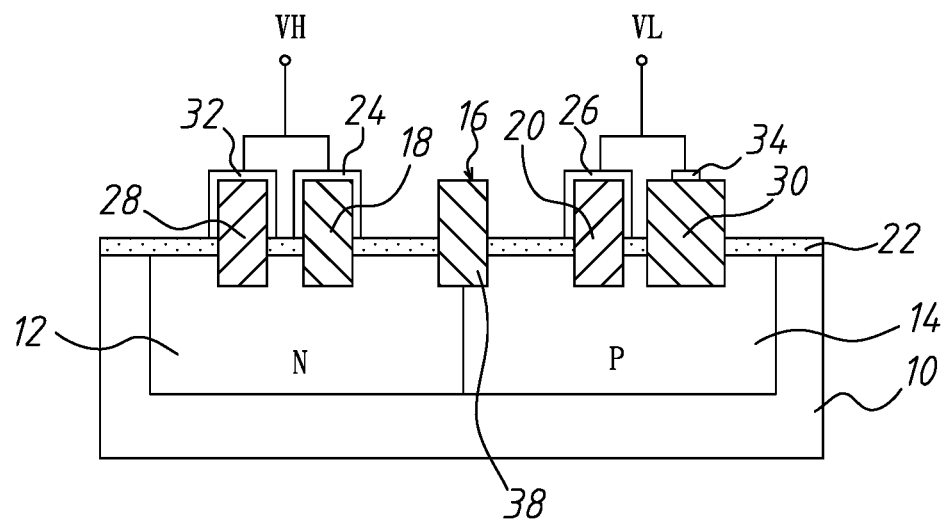
FIG. 101 is a sectional view taken along Line j3-j3' of FIG. 99.

Refer to FIG. 99, FIG. 100 and FIG. 101. The thirty-ninth embodiment of the self-balanced silicon-controlled rectification device of the present invention is introduced as below. The thirty-ninth embodiment is different from the seventh embodiment in the heavily doped clamping fins 16. In the thirty-ninth embodiment, the heavily doped clamping fins 16 are realized with a plurality of N-type heavily doped clamping fins 36 and a plurality of P-type heavily doped clamping fins 38 arranged in an alternative way, and the insulation layer 22 is arranged among the heavily doped clamping fins 16. The other structures of the thirty-ninth embodiment are the same to those of the seventh embodiment so will not be reiterated.

Figure 102:
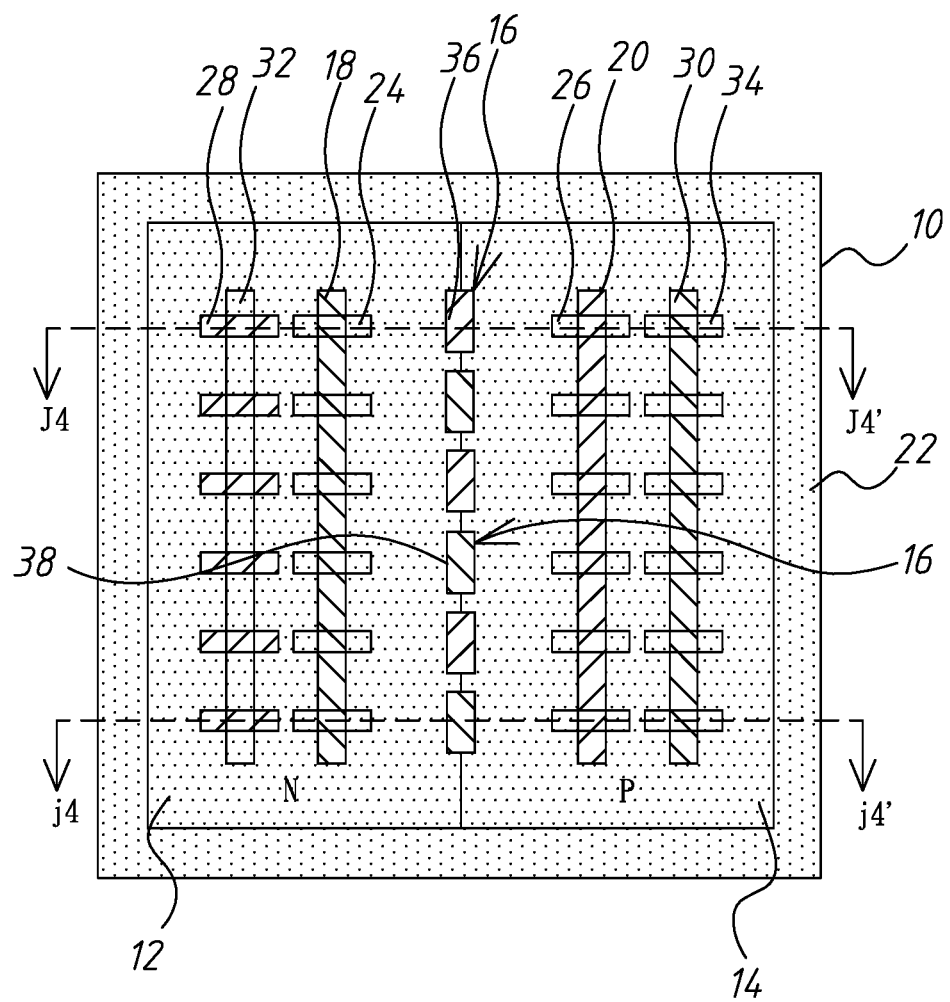
FIG. 102 is a layout schematically showing a self-balanced silicon-controlled rectification device according to the fortieth embodiment of the present invention.
Figure 103:
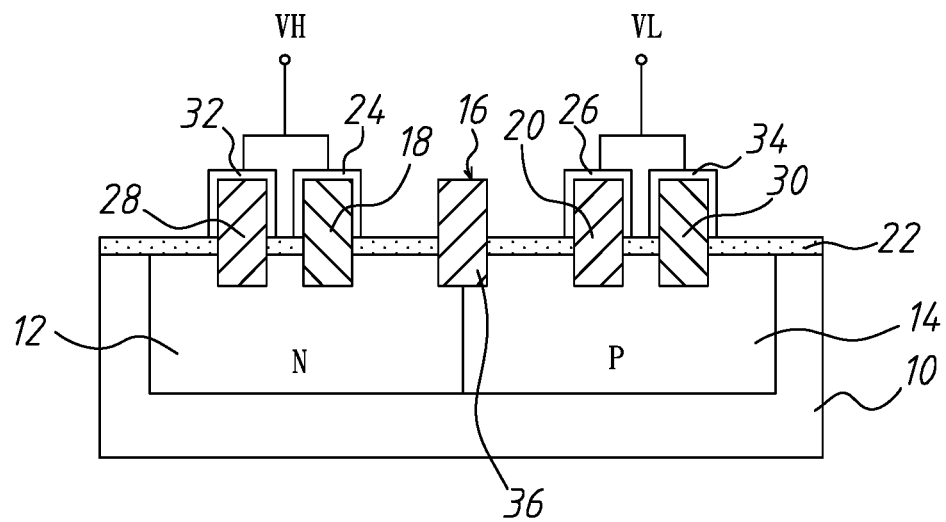
FIG. 103 is a sectional view taken along Line J4-J4' of FIG. 102.
Figure 104:
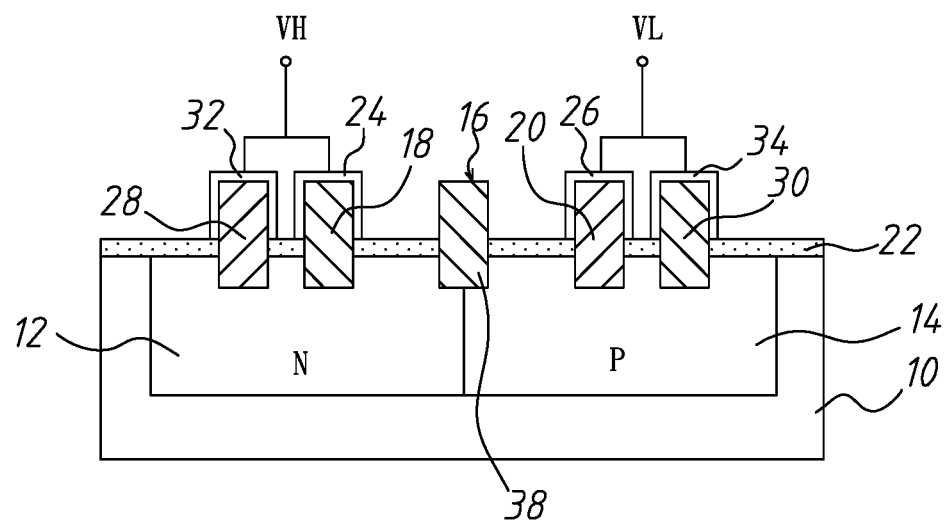
FIG. 104 is a sectional view taken along Line j4-j4' of FIG. 102.

Refer to FIG. 102, FIG. 103 and FIG. 104. The fortieth embodiment of the self-balanced silicon-controlled rectification device of the present invention is introduced as below. The fortieth embodiment is different from the eighth embodiment in the heavily doped clamping fins 16. In the fortieth embodiment, the heavily doped clamping fins 16 are realized with a plurality of N-type heavily doped clamping fins 36 and a plurality of P-type heavily doped clamping fins 38 arranged in an alternative way, and the insulation layer 22 is arranged among the heavily doped clamping fins 16. The other structures of the fortieth embodiment are the same to those of the eighth embodiment so will not be reiterated.

Figure 105:
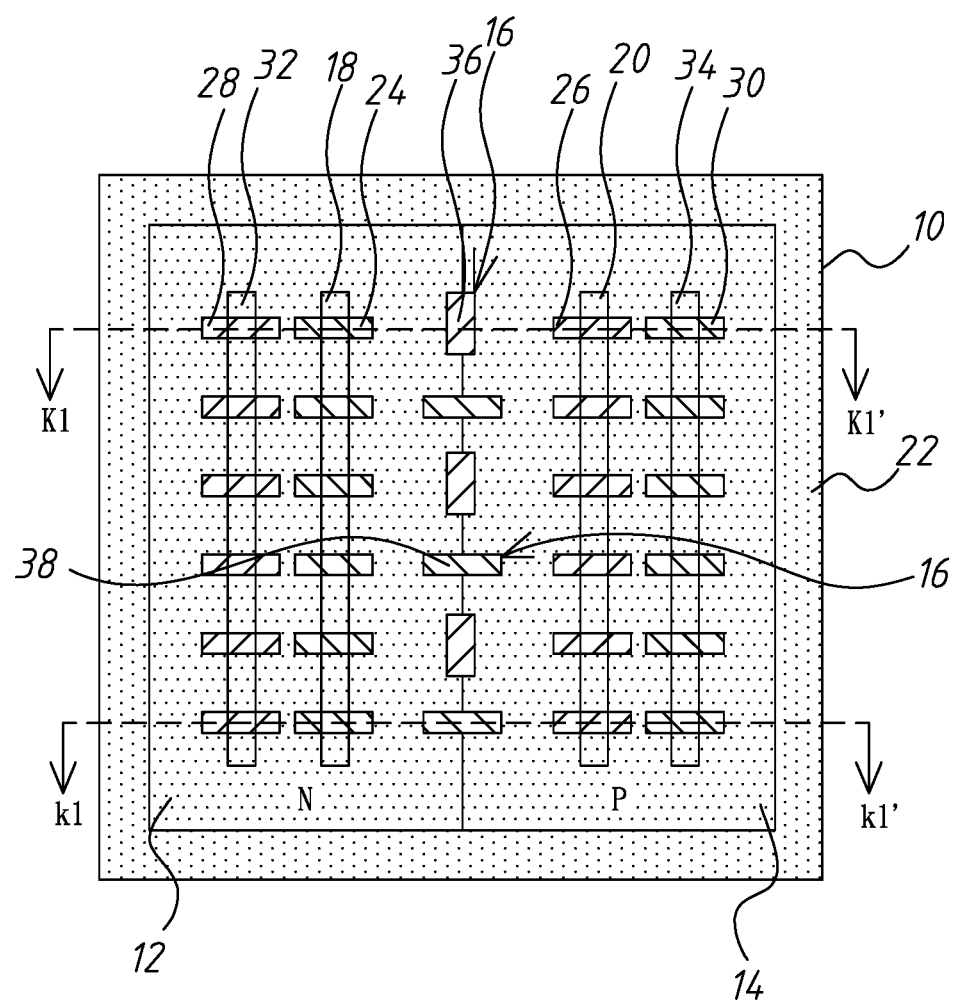
FIG. 105 is a layout schematically showing a self-balanced silicon-controlled rectification device according to the forty-first embodiment of the present invention.
Figure 106:
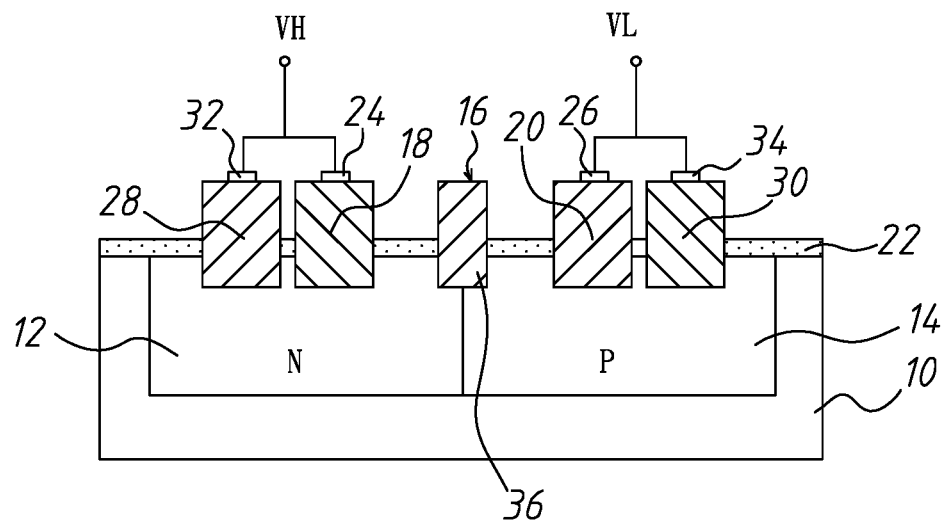
FIG. 106 is a sectional view taken along Line K1-K1' of FIG. 105.
Figure 107:
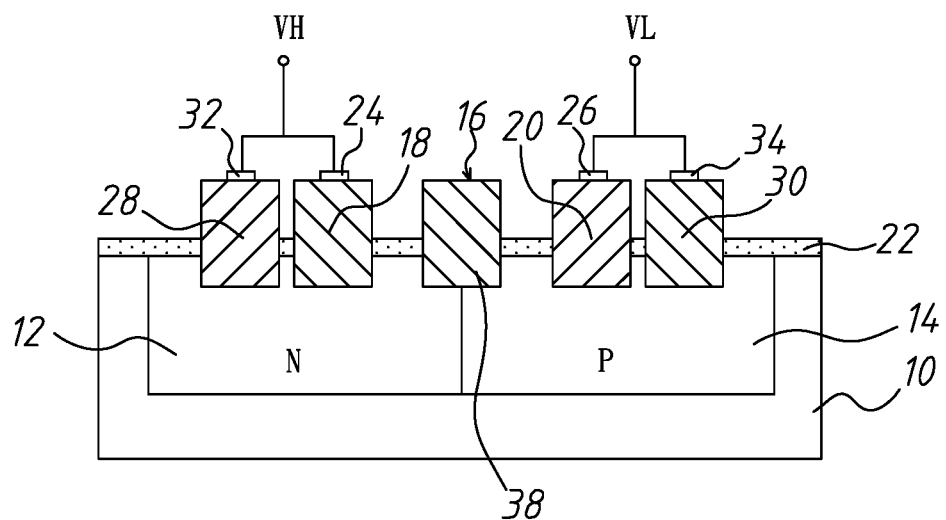
FIG. 107 is a sectional view taken along Line k1-k1' of FIG. 105.

Refer to FIG. 105, FIG. 106 and FIG. 107. The fortieth-first embodiment of the self-balanced silicon-controlled rectification device of the present invention is introduced as below. The fortieth-first embodiment is different from the first embodiment in the heavily doped clamping fins 16. In the fortieth-first embodiment, the heavily doped clamping fins 16 are realized with a plurality of N-type heavily doped clamping fins 36 and a plurality of P-type heavily doped clamping fins 38 arranged in an alternative way, and the insulation layer 22 is arranged among the heavily doped clamping fins 16. The P-type heavily doped clamping fins 38 are arranged along the first direction, and the N-type heavily doped clamping fins 36 are arranged along the second direction. The other structures of the fortieth-first embodiment are the same to those of the first embodiment so will not be reiterated.

Figure 108:
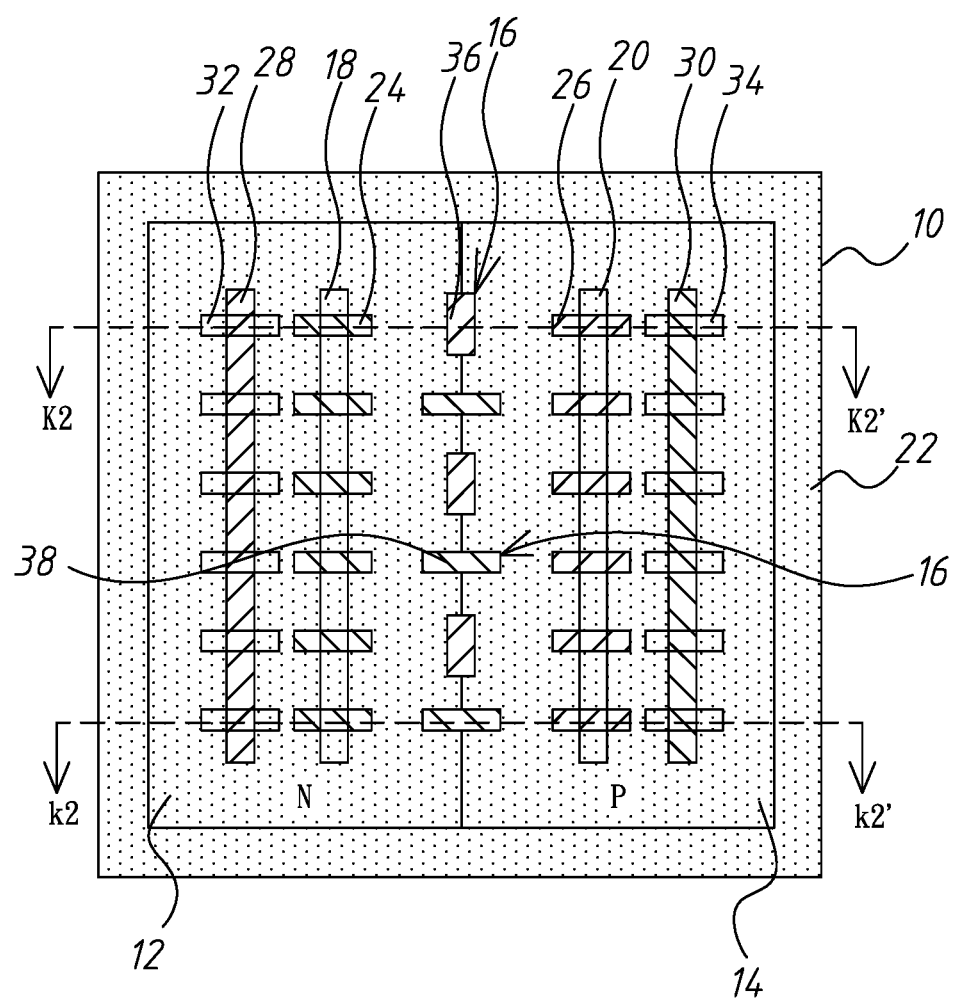
FIG. 108 is a layout schematically showing a self-balanced silicon-controlled rectification device according to the forty-second embodiment of the present invention.
Figure 109:
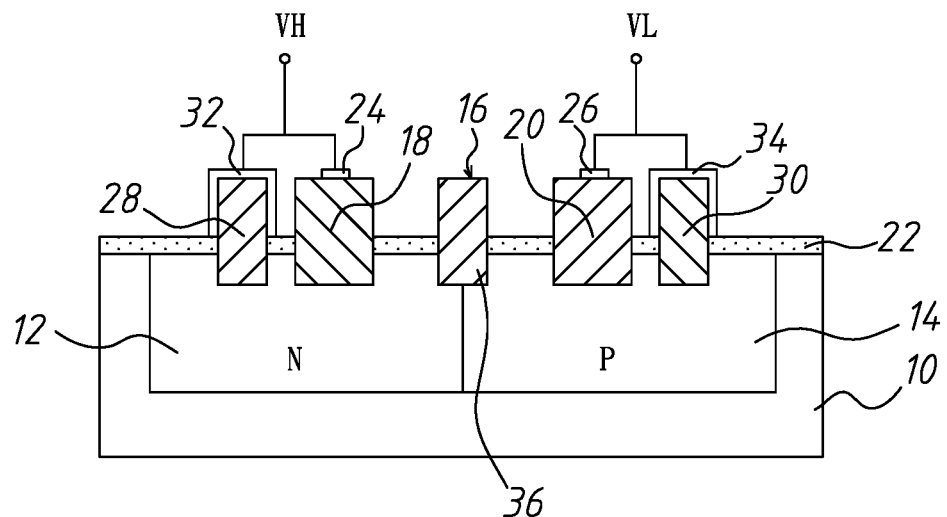
FIG. 109 is a sectional view taken along Line K2-K2' of FIG. 108.
Figure 110:
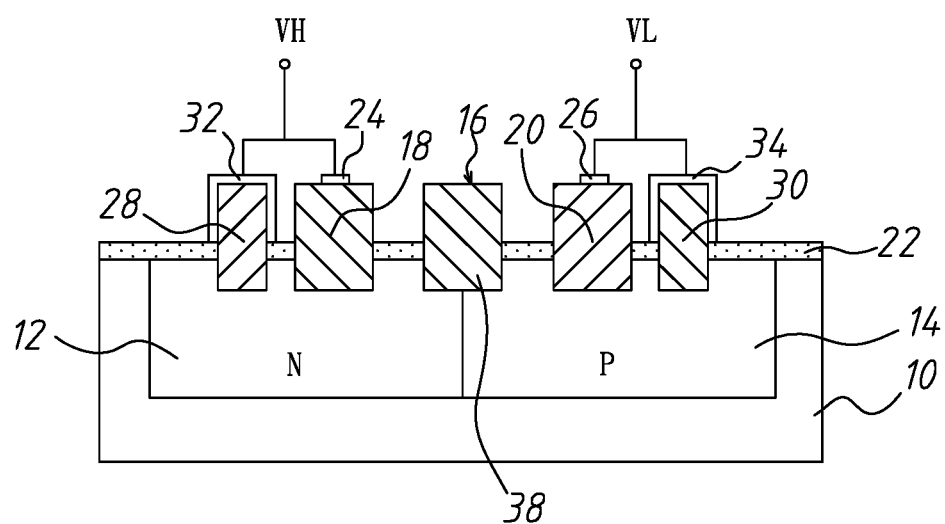
FIG. 110 is a sectional view taken along Line k2-k2' of FIG. 108.

Refer to FIG. 108, FIG. 109 and FIG. 110. The fortieth-second embodiment of the self-balanced silicon-controlled rectification device of the present invention is introduced as below. The fortieth-second embodiment is different from the second embodiment in the heavily doped clamping fins 16. In the fortieth-second embodiment, the heavily doped clamping fins 16 are realized with a plurality of N-type heavily doped clamping fins 36 and a plurality of P-type heavily doped clamping fins 38 arranged in an alternative way, and the insulation layer 22 is arranged among the heavily doped clamping fins 16. The P-type heavily doped clamping fins 38 are arranged along the first direction, and the N-type heavily doped clamping fins 36 are arranged along the second direction. The other structures of the fortieth-second embodiment are the same to those of the second embodiment so will not be reiterated.

Figure 111:
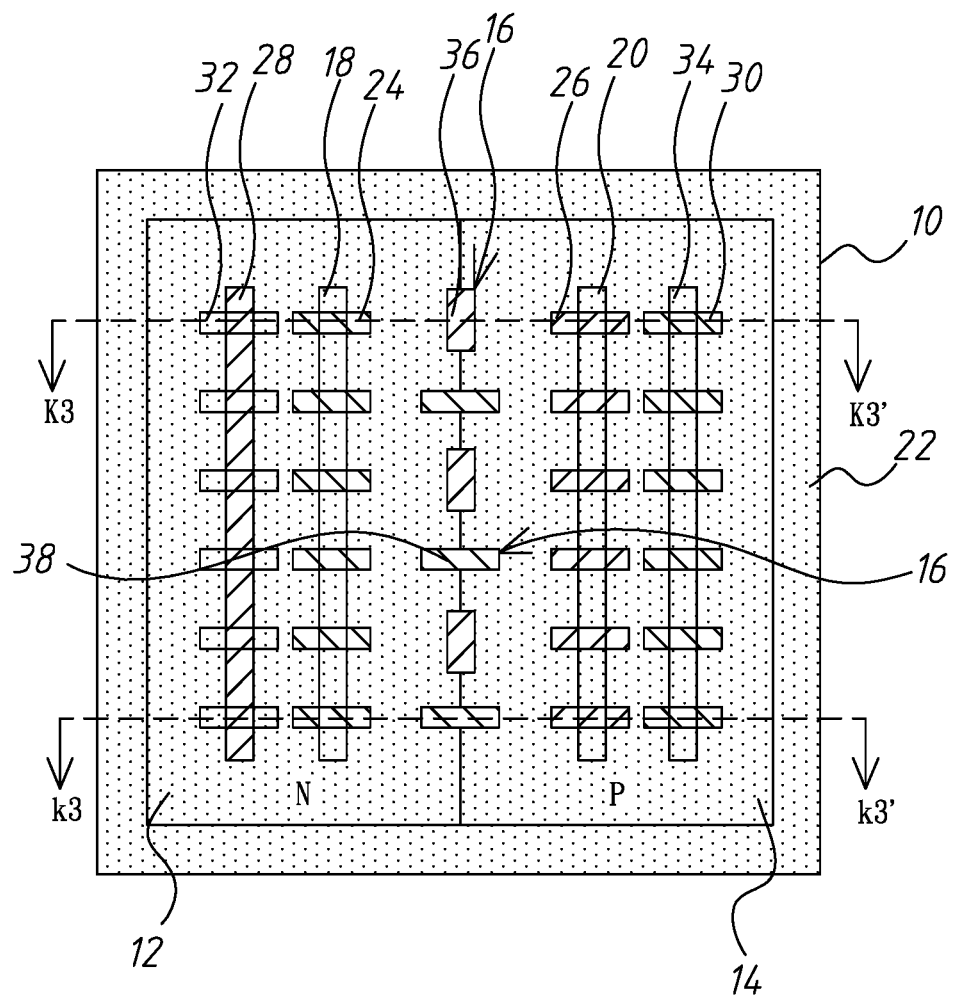
FIG. 111 is a layout schematically showing a self-balanced silicon-controlled rectification device according to the forty-third embodiment of the present invention.
Figure 112:
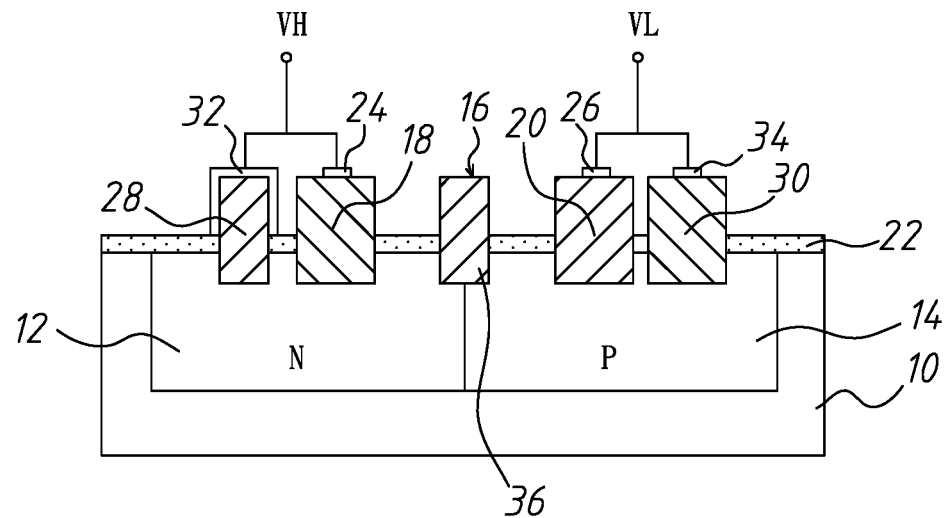
FIG. 112 is a sectional view taken along Line K3-K3' of FIG. 111.
Figure 113:
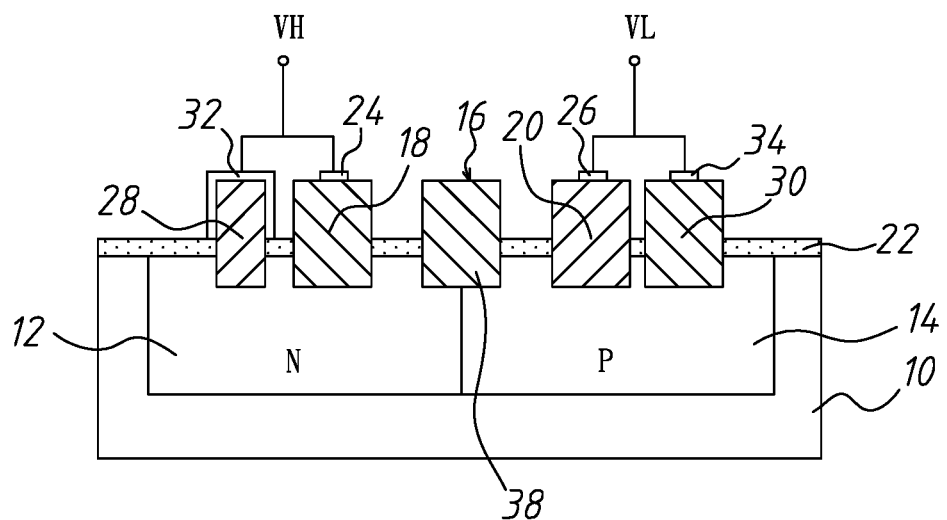
FIG. 113 is a sectional view taken along Line k3-k3' of FIG. 111.

Refer to FIG. 111, FIG. 112 and FIG. 113. The fortieth-third embodiment of the self-balanced silicon-controlled rectification device of the present invention is introduced as below. The fortieth-third embodiment is different from the third embodiment in the heavily doped clamping fins 16. In the fortieth-third embodiment, the heavily doped clamping fins 16 are realized with a plurality of N-type heavily doped clamping fins 36 and a plurality of P-type heavily doped clamping fins 38 arranged in an alternative way, and the insulation layer 22 is arranged among the heavily doped clamping fins 16. The P-type heavily doped clamping fins 38 are arranged along the first direction, and the N-type heavily doped clamping fins 36 are arranged along the second direction. The other structures of the fortieth-third embodiment are the same to those of the third embodiment so will not be reiterated.

Figure 114:
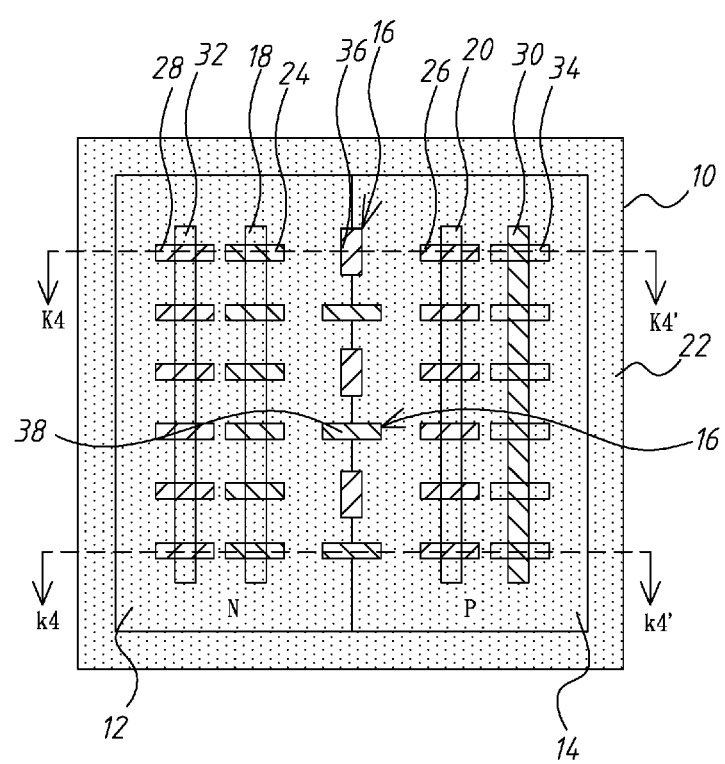
FIG. 114 is a layout schematically showing a self-balanced silicon-controlled rectification device according to the forty-fourth embodiment of the present invention.
Figure 115:
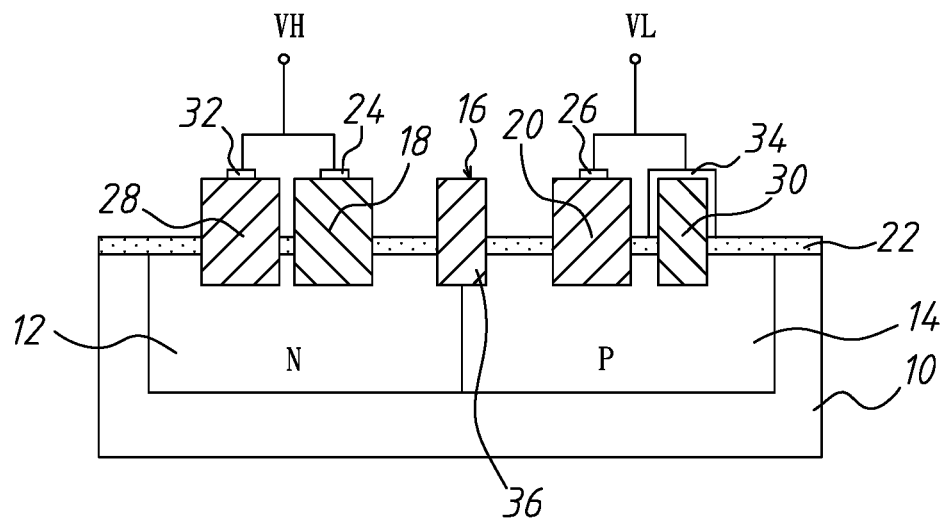
FIG. 115 is a sectional view taken along Line K4-K4' of FIG. 114.
Figure 116:
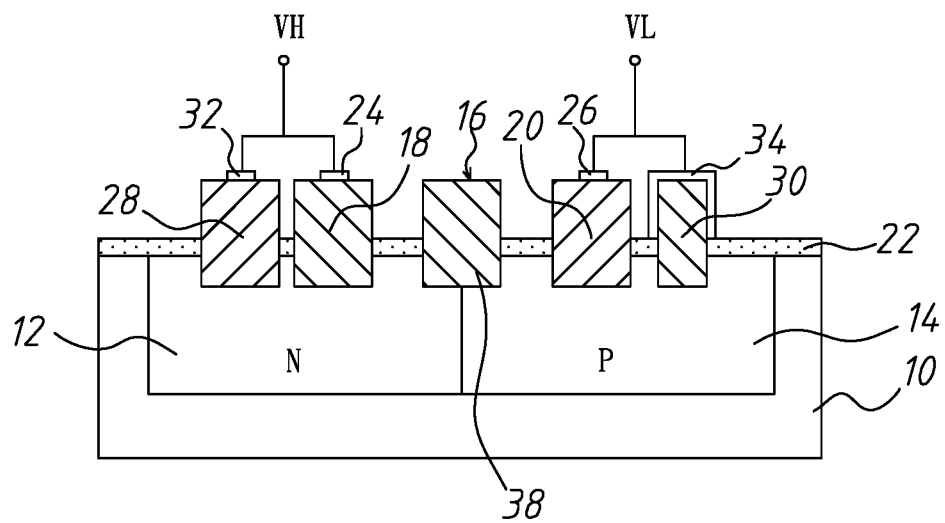
FIG. 116 is a sectional view taken along Line k4-k4' of FIG. 114.

Refer to FIG. 114, FIG. 115 and FIG. 116. The fortieth-fourth embodiment of the self-balanced silicon-controlled rectification device of the present invention is introduced as below. The fortieth-fourth embodiment is different from the fourth embodiment in the heavily doped clamping fins 16. In the fortieth-fourth embodiment, the heavily doped clamping fins 16 are realized with a plurality of N-type heavily doped clamping fins 36 and a plurality of P-type heavily doped clamping fins 38 arranged in an alternative way, and the insulation layer 22 is arranged among the heavily doped clamping fins 16. The P-type heavily doped clamping fins 38 are arranged along the first direction, and the N-type heavily doped clamping fins 36 are arranged along the second direction. The other structures of the fortieth-fourth embodiment are the same to those of the fourth embodiment so will not be reiterated.

Figure 117:
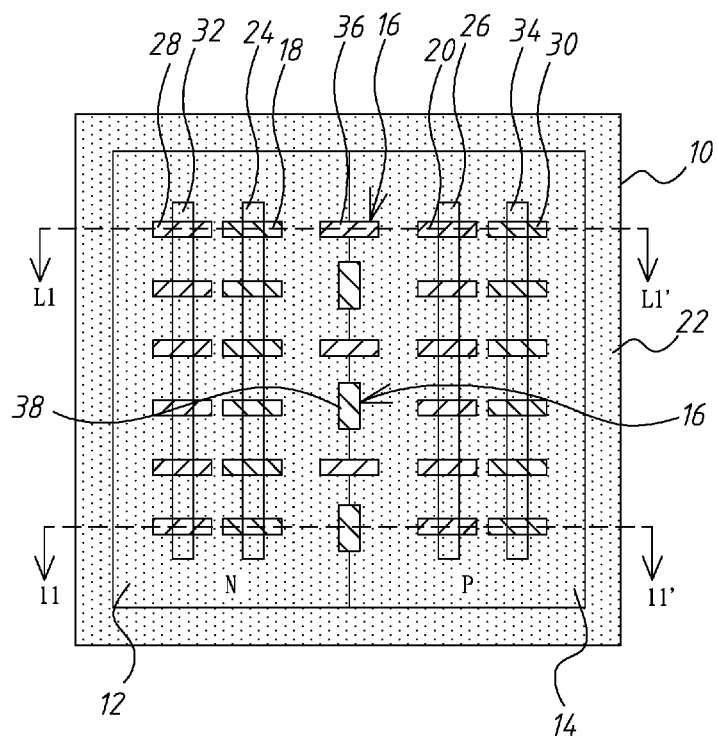
FIG. 117 is a layout schematically showing a self-balanced silicon-controlled rectification device according to the forty-fifth embodiment of the present invention.
Figure 118:
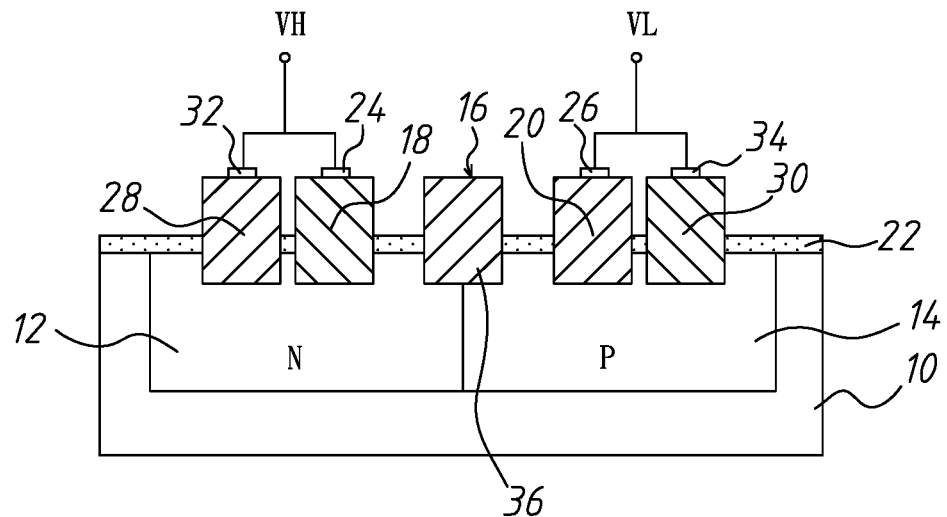
FIG. 118 is a sectional view taken along Line L1-L1' of FIG. 117.
Figure 119:
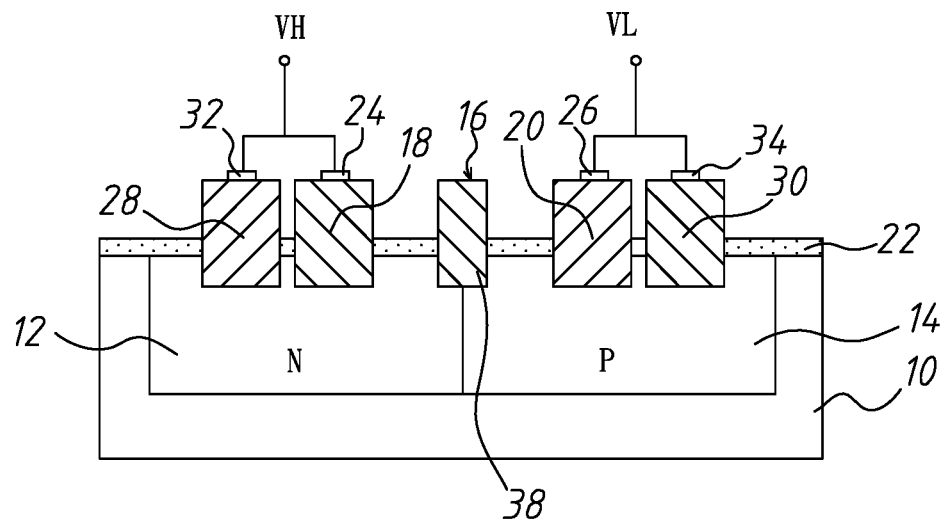
FIG. 119 is a sectional view taken along Line l1-l1' of FIG. 117.

Refer to FIG. 117, FIG. 118 and FIG. 119. The fortieth-fifth embodiment of the self-balanced silicon-controlled rectification device of the present invention is introduced as below. The fortieth-fifth embodiment is different from the first embodiment in the heavily doped clamping fins 16. In the fortieth-fifth embodiment, the heavily doped clamping fins 16 are realized with a plurality of N-type heavily doped clamping fins 36 and a plurality of P-type heavily doped clamping fins 38 arranged in an alternative way, and the insulation layer 22 is arranged among the heavily doped clamping fins 16. The P-type heavily doped clamping fins 38 are arranged along the second direction, and the N-type heavily doped clamping fins 36 are arranged along the first direction. The other structures of the fortieth-fifth embodiment are the same to those of the first embodiment so will not be reiterated.

Figure 120:
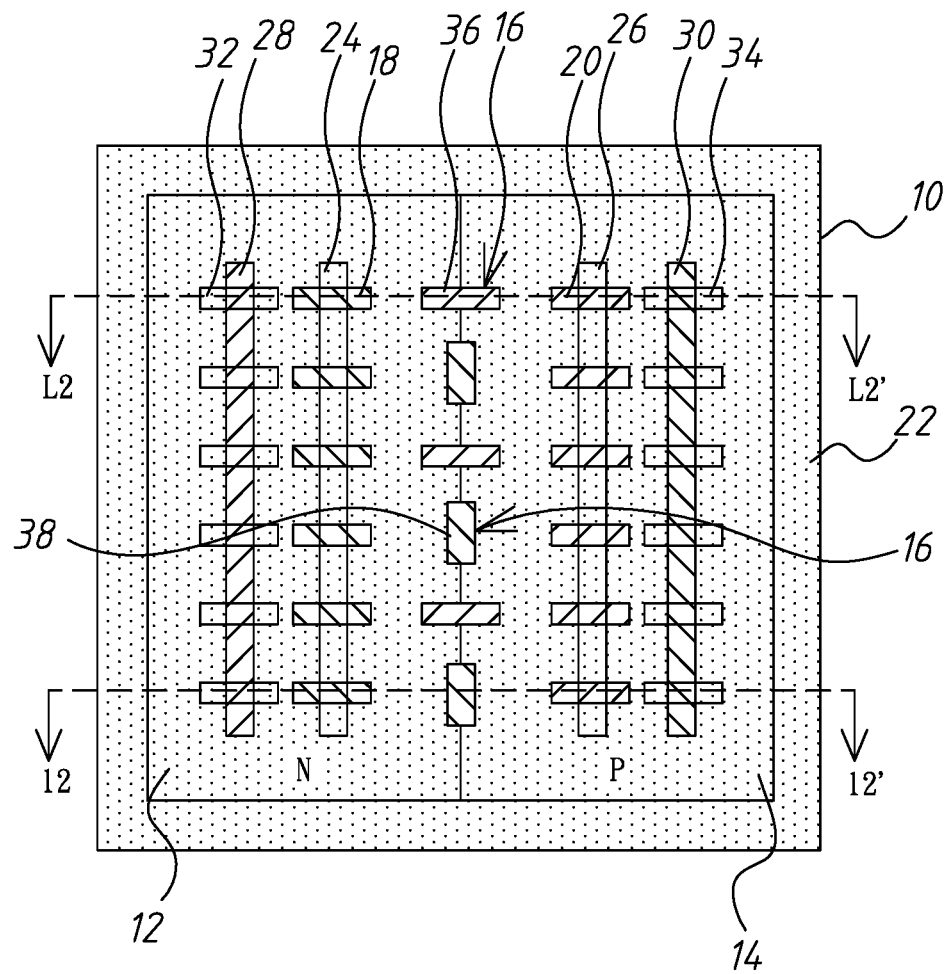
Figure 121:
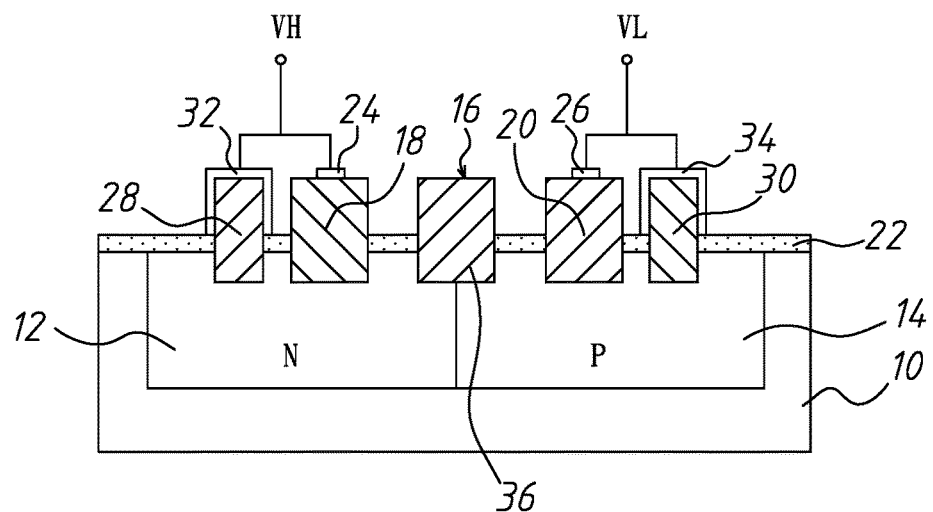
Figure 122:
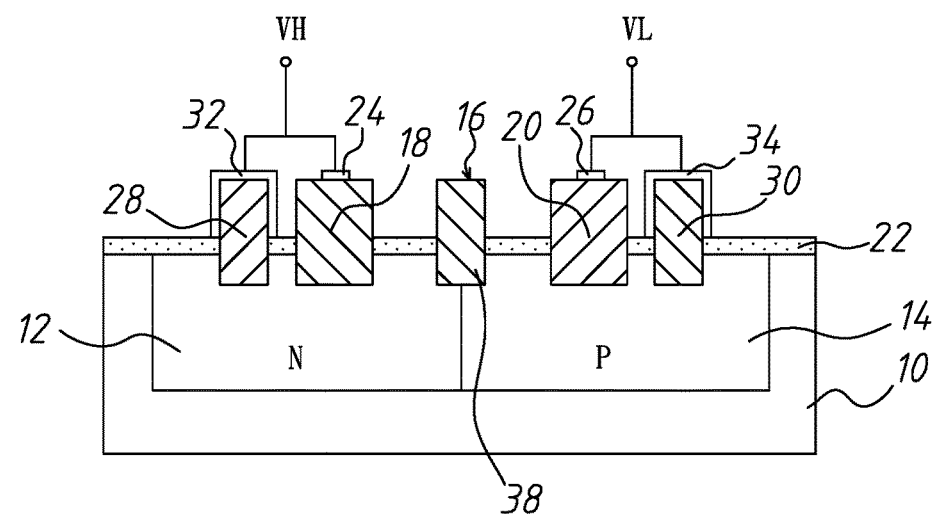

Refer to FIG. 120, FIG. 121 and FIG. 122. The fortieth-sixth embodiment of the self-balanced silicon-controlled rectification device of the present invention is introduced as below. The fortieth-sixth embodiment is different from the second embodiment in the heavily doped clamping fins 16. In the fortieth-sixth embodiment, the heavily doped clamping fins 16 are realized with a plurality of N-type heavily doped clamping fins 36 and a plurality of P-type heavily doped clamping fins 38 arranged in an alternative way, and the insulation layer 22 is arranged among the heavily doped clamping fins 16. The P-type heavily doped clamping fins 38 are arranged along the second direction, and the N-type heavily doped clamping fins 36 are arranged along the first direction. The other structures of the fortieth-sixth embodiment are the same to those of the second embodiment so will not be reiterated.

Figure 123:
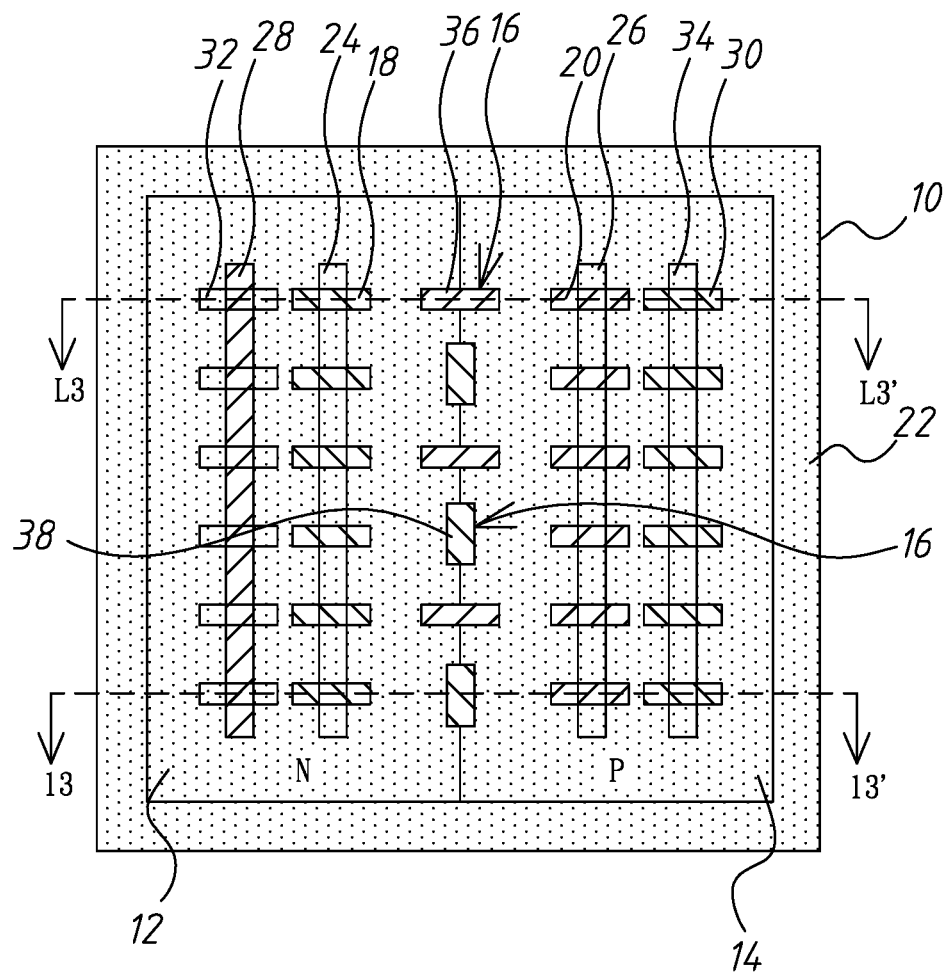
Figure 124:
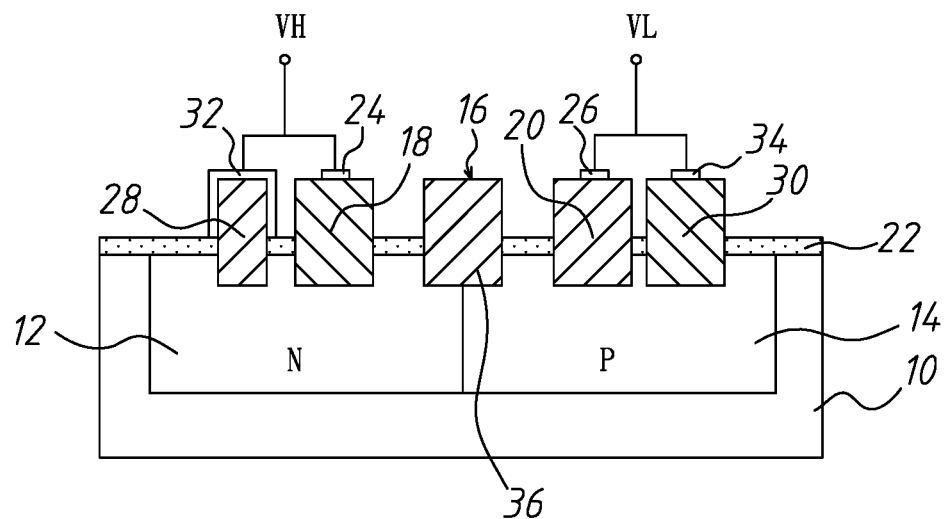
Figure 125:
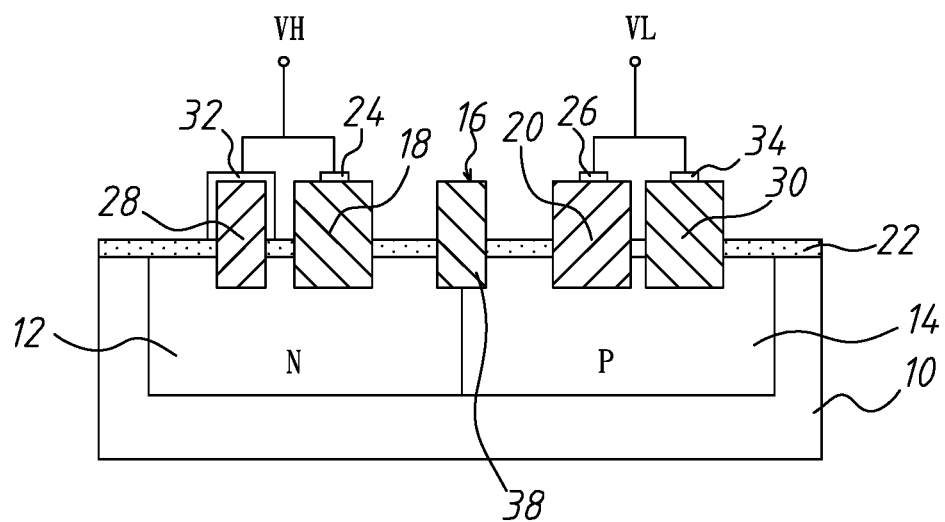

Refer to FIG. 123, FIG. 124 and FIG. 125. The fortieth-seventh embodiment of the self-balanced silicon-controlled rectification device of the present invention is introduced as below. The fortieth-seventh embodiment is different from the third embodiment in the heavily doped clamping fins 16. In the fortieth-seventh embodiment, the heavily doped clamping fins 16 are realized with a plurality of N-type heavily doped clamping fins 36 and a plurality of P-type heavily doped clamping fins 38 arranged in an alternative way, and the insulation layer 22 is arranged among the heavily doped clamping fins 16. The P-type heavily doped clamping fins 38 are arranged along the second direction, and the N-type heavily doped clamping fins 36 are arranged along the first direction. The other structures of the fortieth-seventh embodiment are the same to those of the third embodiment so will not be reiterated.

Figure 126:
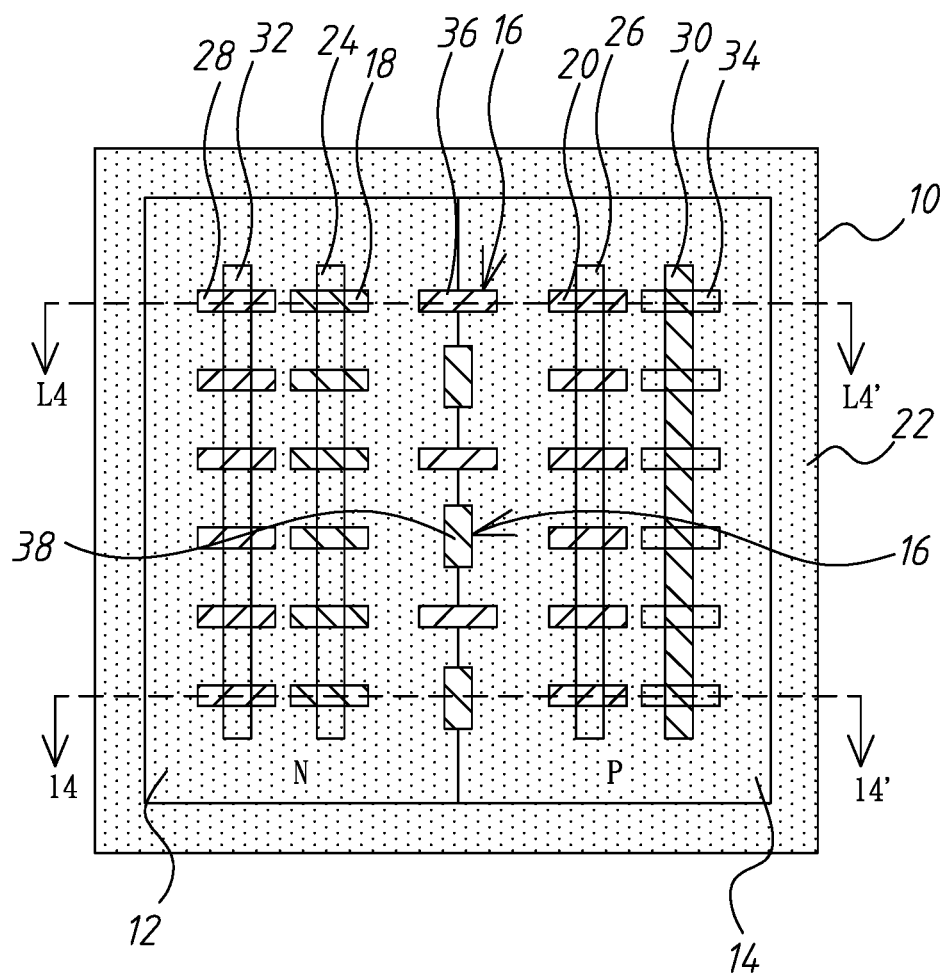
Figure 127:
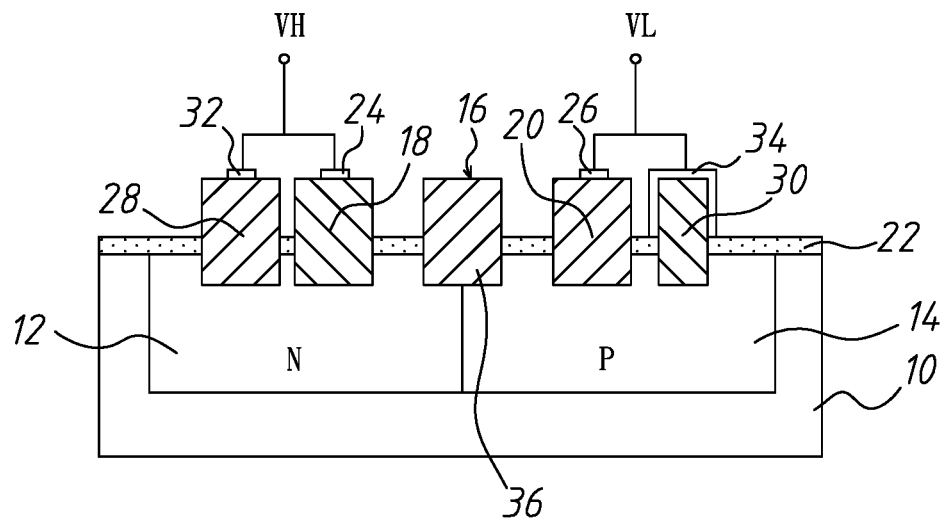
Figure 128:
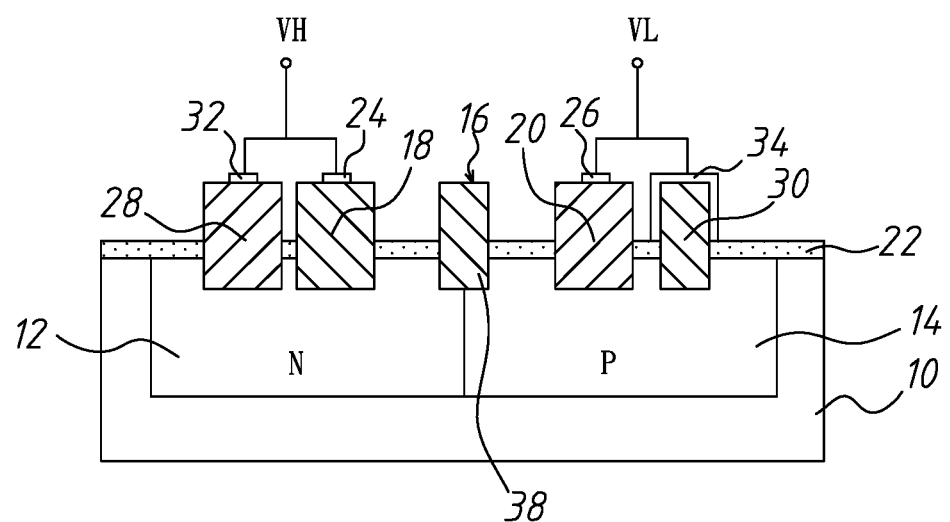

Refer to FIG. 126, FIG. 127 and FIG. 128. The fortieth-eighth embodiment of the self-balanced silicon-controlled rectification device of the present invention is introduced as below. The fortieth-eighth embodiment is different from the fourth embodiment in the heavily doped clamping fins 16. In the fortieth-eighth embodiment, the heavily doped clamping fins 16 are realized with a plurality of N-type heavily doped clamping fins 36 and a plurality of P-type heavily doped clamping fins 38 arranged in an alternative way, and the insulation layer 22 is arranged among the heavily doped clamping fins 16. The P-type heavily doped clamping fins 38 are arranged along the second direction, and the N-type heavily doped clamping fins 36 are arranged along the first direction. The other structures of the fortieth-eighth embodiment are the same to those of the fourth embodiment so will not be reiterated.

Figure 129:
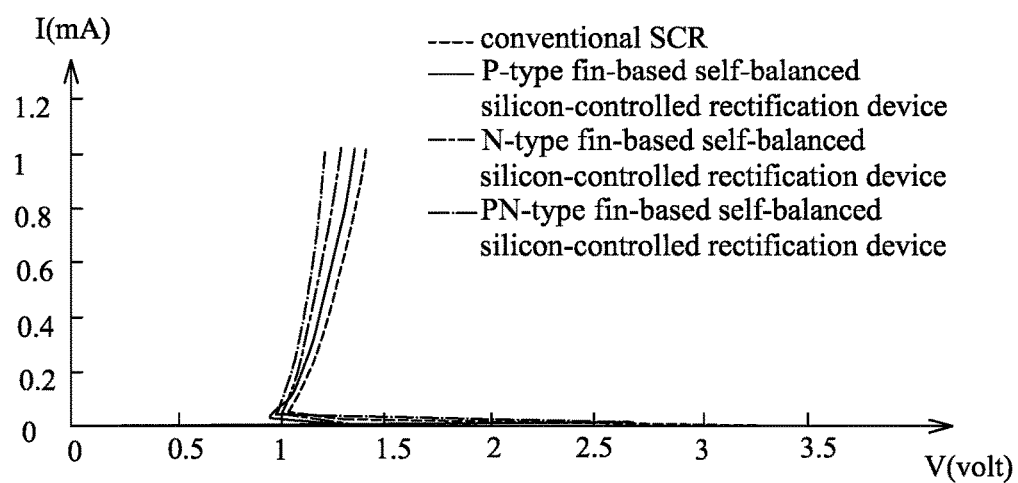

Finally, refer to FIG. 129. FIG. 129 is a diagram showing I-V characteristic curves of a conventional silicon-controlled rectifier (SCR), a P-type fin-based self-balanced silicon-controlled rectification device, an N-type fin-based self-balanced silicon-controlled rectification device and a PN-type fin-based self-balanced silicon-controlled rectification device according to an embodiment of the present invention. The first sixteen embodiments of the present invention refer to the P-type fin-based self-balanced silicon-controlled rectification device or the N-type fin-based self-balanced silicon-controlled rectification device. The last thirty-two embodiments of the present invention refer to the PN-type fin-based self-balanced silicon-controlled rectification device. Compared with the first embodiment of the present invention, the conventional SCR lacks the heavily doped clamping fins. As a result, the heavily doped clamping fins are used to reduce the trigger voltage of the SCR. From FIG. 129, the trigger voltages of the conventional SCR, the P-type fin-based self-balanced silicon-controlled rectification device, the N-type fin-based self-balanced silicon-controlled rectification device and the PN-type fin-based self-balanced silicon-controlled rectification device are respectively 3.4V, 1.4V, 1.4V, and 2.7V. Thus, compared with the conventional SCR, the improve rates of the P-type fin-based self-balanced silicon-controlled rectification device, the N-type fin-based self-balanced silicon-controlled rectification device and the PN-type fin-based self-balanced silicon-controlled rectification device are respectively 242%, 242% and 125%.

In conclusion, the present invention uses the N-type doped well, the P-type doped well, the heavily doped clamping fin, the first P-type heavily doped fin, and the first N-type heavily doped fin to establish a plurality of SCRs, so as to reduce the semiconductor failures due to ESD and obtain the lower trigger voltage.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A self-balanced silicon-controlled rectification device comprising:
   a substrate;
   an N-type doped well arranged in said substrate;
   a P-type doped well arranged in said substrate and arranged adjacent to said N-type doped well;
   at least one heavily doped clamping fin arranged in said N-type doped well and said P-type well and protruded up from a surface of said substrate; and
   at least one first P-type heavily doped fin and at least one first N-type heavily doped fin respectively arranged in said N-type doped well and said P-type doped well, respectively arranged at two opposite sides of said heavily doped clamping fin, and protruded up from said surface of said substrate, and said heavily doped clamping fin and each of said first P-type heavily doped fin and said first N-type heavily doped fin are spaced at a fixed interval, and said N-type doped well, said P-type doped well, said heavily doped clamping fin, said first P-type heavily doped fin and said first N-type heavily doped fin form a plurality of silicon-controlled rectifiers (SCRs), and said first P-type heavily doped fin and said first N-type heavily doped fin are respectively coupled to a high voltage terminal and a low voltage terminal, and voltages of said high voltage terminal and said low voltage terminal forward bias said SCRs to generate a plurality of uniform electrostatic discharge (ESD) currents through said SCRs.

2. The self-balanced silicon-controlled rectification device according to claim 1, further comprising an insulation layer arranged on said surface of said substrate and arranged between said heavily doped clamping fin and each of said first P-type heavily doped fin and said first N-type heavily doped fin.

3. The self-balanced silicon-controlled rectification device according to claim 2, wherein said heavily doped clamping fin is a P-type heavily doped clamping fin or an N-type heavily doped clamping fin.

4. The self-balanced silicon-controlled rectification device according to claim 3, wherein said at least one heavily doped clamping fin is a plurality of said heavily doped clamping fins arranged along a first direction, and said at least one first P-type heavily doped fin is a plurality of said first P-type heavily doped fins arranged along said first direction, and said at least one first N-type heavily doped fin is a plurality of said first N-type heavily doped fins arranged along said first direction, and said insulation layer is arranged among said heavily doped clamping fins, arranged among said first P-type heavily doped fins and arranged among said first N-type heavily doped fins.

5. The self-balanced silicon-controlled rectification device according to claim 4, further comprising:
   a first contact arranged on sidewalls and tops of said first P-type heavily doped fins and said insulation layer, and arranged along a second direction intersecting said first direction, and said first P-type heavily doped fins are coupled to said high voltage terminal via said first contact; and
   a second contact arranged on sidewalls and tops of said first N-type heavily doped fins and said insulation layer, and arranged along said second direction, and said first N-type heavily doped fins are coupled to said low voltage terminal via said second contact.

6. The self-balanced silicon-controlled rectification device according to claim 3, wherein said heavily doped clamping fin is arranged along a first direction, and said first P-type heavily doped fin is arranged along said first direction, and said first N-type heavily doped fin is arranged along said first direction.

7. The self-balanced silicon-controlled rectification device according to claim 6, further comprising:
   a plurality of first contacts arranged on sidewalls and a top of said first P-type heavily doped fin and said insulation layer, and arranged along a second direction intersecting said first direction, and said first P-type heavily doped fin is coupled to said high voltage terminal via said first contacts; and
   a plurality of second contacts arranged on sidewalls and a top of said first N-type heavily doped fin and said insulation layer, and arranged along said second direction, and said first N-type heavily doped fin is coupled to said low voltage terminal via said second contacts.

8. The self-balanced silicon-controlled rectification device according to claim 3, wherein said at least one heavily doped clamping fin is a plurality of said heavily doped clamping fins arranged along a first direction, and said first P-type heavily doped fin is arranged along a second direction intersecting said first direction, and said first N-type heavily doped fin is arranged along said second direction, and said insulation layer is arranged among said heavily doped clamping fins.

9. The self-balanced silicon-controlled rectification device according to claim 8, further comprising:
   a plurality of first contacts arranged on sidewalls and a top of said first P-type heavily doped fin and said insulation layer, and arranged along said first direction, and said first P-type heavily doped fin is coupled to said high voltage terminal via said first contacts; and
   a plurality of second contacts arranged on sidewalls and a top of said first N-type heavily doped fin and said insulation layer, and arranged along said first direction, and said first N-type heavily doped fin is coupled to said low voltage terminal via said second contacts.

10. The self-balanced silicon-controlled rectification device according to claim 3, wherein said heavily doped clamping fin is arranged along a first direction, and said at least one first P-type heavily doped fin is a plurality of said first P-type heavily doped fins arranged along a second direction intersecting said first direction, and said at least one first N-type heavily doped fin is a plurality of said first N-type heavily doped fins arranged along said second direction, and said insulation layer is arranged among said first P-type heavily doped fins and arranged among said first N-type heavily doped fins.

11. The self-balanced silicon-controlled rectification device according to claim 10, further comprising:
   a first contact arranged on sidewalls and tops of said first P-type heavily doped fins and said insulation layer, and arranged along said first direction, and said first P-type heavily doped fins are coupled to said high voltage terminal via said first contact; and
   a second contact arranged on sidewalls and tops of said first N-type heavily doped fins and said insulation layer, and arranged along said first direction, and said first N-type heavily doped fins are coupled to said low voltage terminal via said second contact.

12. The self-balanced silicon-controlled rectification device according to claim 2, wherein said at least one heavily doped clamping fin comprises at least one P-type heavily doped clamping fin and at least one N-type heavily doped clamping fin, and said insulation layer is arranged among said heavily doped clamping fins.

13. The self-balanced silicon-controlled rectification device according to claim 12, wherein said at least one P-type heavily doped clamping fin is a plurality of said P-type heavily doped clamping fins neighbored and arranged along a first direction, and said at least one N-type heavily doped clamping fin is a plurality of said N-type heavily doped clamping fins neighbored and arranged along said first direction, and said at least one first P-type heavily doped fin is a plurality of said first P-type heavily doped fins arranged along said first direction, and said at least one first N-type heavily doped fin is a plurality of said first N-type heavily doped fins arranged along said first direction, and said insulation layer is arranged among said first P-type heavily doped fins and arranged among said first N-type heavily doped fins.

14. The self-balanced silicon-controlled rectification device according to claim 13, further comprising:
   a first contact arranged on sidewalls and tops of said first P-type heavily doped fins and said insulation layer, and arranged along a second direction intersecting said first direction, and said first P-type heavily doped fins are coupled to said high voltage terminal via said first contact; and
   a second contact arranged on sidewalls and tops of said first N-type heavily doped fins and said insulation layer, and arranged along said second direction, and said first N-type heavily doped fins are coupled to said low voltage terminal via said second contact.

15. The self-balanced silicon-controlled rectification device according to claim 12, wherein said P-type heavily doped clamping fin is arranged along a first direction, and said N-type heavily doped clamping fin is arranged along said first direction, and said first P-type heavily doped fin is arranged along said first direction, and said first N-type heavily doped fin is arranged along said first direction.

16. The self-balanced silicon-controlled rectification device according to claim 15, further comprising:
   a plurality of first contacts arranged on sidewalls and a top of said first P-type heavily doped fin and said insulation layer, and arranged along a second direction intersecting said first direction, and said first P-type heavily doped fin is coupled to said high voltage terminal via said first contacts; and
   a plurality of second contacts arranged on sidewalls and a top of said first N-type heavily doped fin and said insulation layer, and arranged along said second direction, and said first N-type heavily doped fin is coupled to said low voltage terminal via said second contacts.

17. The self-balanced silicon-controlled rectification device according to claim 12, wherein said at least one P-type heavily doped clamping fin is a plurality of said P-type heavily doped clamping fins neighbored and arranged along a first direction, and said at least one N-type heavily doped clamping fin is a plurality of said N-type heavily doped clamping fins neighbored and arranged along said first direction, and said first P-type heavily doped fin is arranged along a second direction intersecting said first direction, and said first N-type heavily doped fin is arranged along said second direction.

18. The self-balanced silicon-controlled rectification device according to claim 17, further comprising:
a plurality of first contacts arranged on sidewalls and a top of said first P-type heavily doped fin and said insulation layer, and arranged along said first direction, and said first P-type heavily doped fin is coupled to said high voltage terminal via said first contacts; and
a plurality of second contacts arranged on sidewalls and a top of said first N-type heavily doped fin and said insulation layer, and arranged along said first direction, and said first N-type heavily doped fin is coupled to said low voltage terminal via said second contacts.

19. The self-balanced silicon-controlled rectification device according to claim 12, wherein said P-type heavily doped clamping fin is arranged along a first direction, and said N-type heavily doped clamping fin is arranged along said first direction, and said at least one first P-type heavily doped fin is a plurality of said first P-type heavily doped fins arranged along a second direction intersecting said first direction, and said at least one first N-type heavily doped fin is a plurality of said first N-type heavily doped fins arranged along said second direction, and said insulation layer is arranged among said first P-type heavily doped fins and arranged among said first N-type heavily doped fins.

20. The self-balanced silicon-controlled rectification device according to claim 19, further comprising:
a first contact arranged on sidewalls and tops of said first P-type heavily doped fins and said insulation layer, and arranged along said first direction, and said first P-type heavily doped fins are coupled to said high voltage terminal via said first contact; and
a second contact arranged on sidewalls and tops of said first N-type heavily doped fins and said insulation layer, and arranged along said first direction, and said first N-type heavily doped fins are coupled to said low voltage terminal via said second contact.

21. The self-balanced silicon-controlled rectification device according to claim 12, wherein said at least one P-type heavily doped clamping fin is a plurality of said P-type heavily doped clamping fins, and said at least one N-type heavily doped clamping fin is a plurality of said N-type heavily doped clamping fins, and said P-type heavily doped clamping fins and said N-type heavily doped clamping fins are arranged in an alternative way.

22. The self-balanced silicon-controlled rectification device according to claim 21, wherein said P-type heavily doped clamping fins and said N-type heavily doped clamping fins are arranged along a first direction, and said at least one first P-type heavily doped fin is a plurality of said first P-type heavily doped fins arranged along said first direction, and said at least one first N-type heavily doped fin is a plurality of said first N-type heavily doped fins arranged along said first direction, and said insulation layer is arranged among said first P-type heavily doped fins and arranged among said first N-type heavily doped fins.

23. The self-balanced silicon-controlled rectification device according to claim 22, further comprising:
a first contact arranged on sidewalls and tops of said first P-type heavily doped fins and said insulation layer, and arranged along a second direction intersecting said first direction, and said first P-type heavily doped fins are coupled to said high voltage terminal via said first contact; and
a second contact arranged on sidewalls and tops of said first N-type heavily doped fins and said insulation layer, and arranged along said second direction, and said first N-type heavily doped fins are coupled to said low voltage terminal via said second contact.

24. The self-balanced silicon-controlled rectification device according to claim 21, wherein said P-type heavily doped clamping fins are arranged along a first direction, and said N-type heavily doped clamping fins are arranged along said first direction, and said first P-type heavily doped fin is arranged along said first direction, and said first N-type heavily doped fin is arranged along said first direction.

25. The self-balanced silicon-controlled rectification device according to claim 24, further comprising:
a plurality of first contacts arranged on sidewalls and a top of said first P-type heavily doped fin and said insulation layer, and arranged along a second direction intersecting said first direction, and said first P-type heavily doped fin is coupled to said high voltage terminal via said first contacts; and
a plurality of second contacts arranged on sidewalls and a top of said first N-type heavily doped fin and said insulation layer, and arranged along said second direction, and said first N-type heavily doped fin is coupled to said low voltage terminal via said second contacts.

26. The self-balanced silicon-controlled rectification device according to claim 21, wherein said P-type heavily doped clamping fins are arranged along a first direction, and said N-type heavily doped clamping fins are arranged along a second direction intersecting said first direction, and said at least one first P-type heavily doped fin is a plurality of said first P-type heavily doped fins arranged along said first direction, and said at least one first N-type heavily doped fin is a plurality of said first N-type heavily doped fins arranged along said first direction, and said insulation layer is arranged among said first P-type heavily doped fins and arranged among said first N-type heavily doped fins.

27. The self-balanced silicon-controlled rectification device according to claim 26, further comprising:
a first contact arranged on sidewalls and tops of said first P-type heavily doped fins and said insulation layer, and arranged along said second direction, and said first P-type heavily doped fins are coupled to said high voltage terminal via said first contact; and
a second contact arranged on sidewalls and tops of said first N-type heavily doped fins and said insulation layer, and arranged along said second direction, and said first N-type heavily doped fins are coupled to said low voltage terminal via said second contact.

28. The self-balanced silicon-controlled rectification device according to claim 21, wherein said N-type heavily doped clamping fins are arranged along a first direction, and said P-type heavily doped clamping fins are arranged along a second direction intersecting said first direction, and said at least one first P-type heavily doped fin is a plurality of said first P-type heavily doped fins arranged along said first direction, and said at least one first N-type heavily doped fin is a plurality of said first N-type heavily doped fins arranged along said first direction, and said insulation layer is arranged among said first P-type heavily doped fins and arranged among said first N-type heavily doped fins.

29. The self-balanced silicon-controlled rectification device according to claim 28, further comprising:
   a first contact arranged on sidewalls and tops of said first P-type heavily doped fins and said insulation layer, and arranged along said second direction, and said first P-type heavily doped fins are coupled to said high voltage terminal via said first contact; and
   a second contact arranged on sidewalls and tops of said first N-type heavily doped fins and said insulation layer, and arranged along said second direction, and said first N-type heavily doped fins are coupled to said low voltage terminal via said second contact.

30. The self-balanced silicon-controlled rectification device according to claim 2, further comprising:
   at least one second N-type heavily doped fin arranged in said N-type doped well, protruded up from said surface of said substrate and coupled to said high voltage terminal, and said insulation layer is arranged between said second N-type heavily doped fin and each of said first P-type heavily doped fin and said heavily doped clamping fin; and
   at least one second P-type heavily doped fin arranged in said P-type doped well, protruded up from said surface of said substrate and coupled to said low voltage terminal, and said insulation layer is arranged between said second P-type heavily doped fin and each of said first N-type heavily doped fin and said heavily doped clamping fin.

31. The self-balanced silicon-controlled rectification device according to claim 30, wherein said at least one second N-type heavily doped fin is a plurality of said second N-type heavily doped fins, and said at least one second P-type heavily doped fin is a plurality of said second P-type heavily doped fins, and said insulation layer is arranged among said second N-type heavily doped fins and arranged among said second P-type heavily doped fins.

32. The self-balanced silicon-controlled rectification device according to claim 31, further comprising:
   a third contact arranged on sidewalls and tops of said second N-type heavily doped fins and said insulation layer and said second N-type heavily doped fins are coupled to said high voltage terminal via said third contact; and
   a fourth contact arranged on sidewalls and tops of said second P-type heavily doped fins and said insulation layer and said second P-type heavily doped fins are coupled to said low voltage terminal via said fourth contact.

33. The self-balanced silicon-controlled rectification device according to claim 30, further comprising:
   a plurality of third contacts arranged on sidewalls and a top of said second N-type heavily doped fin and said insulation layer and said second N-type heavily doped fin is coupled to said high voltage terminal via said third contacts; and
   a plurality of fourth contacts arranged on sidewalls and a top of said second P-type heavily doped fin and said insulation layer and said second P-type heavily doped fin is coupled to said low voltage terminal via said fourth contacts.

34. The self-balanced silicon-controlled rectification device according to claim 30, wherein said at least one second P-type heavily doped fin is a plurality of said second P-type heavily doped fins, and said insulation layer is arranged among said second P-type heavily doped fins.

35. The self-balanced silicon-controlled rectification device according to claim 34, further comprising:
   a plurality of third contacts arranged on sidewalls and a top of said second N-type heavily doped fin and said insulation layer and said second N-type heavily doped fin is coupled to said high voltage terminal via said third contacts; and
   a fourth contact arranged on sidewalls and tops of said second P-type heavily doped fins and said insulation layer and said second P-type heavily doped fins are coupled to said low voltage terminal via said fourth contact.

36. The self-balanced silicon-controlled rectification device according to claim 30, wherein said at least one second N-type heavily doped fin is a plurality of said second N-type heavily doped fins, and said insulation layer is arranged among said second N-type heavily doped fins.

37. The self-balanced silicon-controlled rectification device according to claim 36, further comprising:
   a third contact arranged on sidewalls and tops of said second N-type heavily doped fins and said insulation layer and said second N-type heavily doped fins are coupled to said high voltage terminal via said third contact; and
   a plurality of fourth contacts arranged on sidewalls and a top of said second P-type heavily doped fin and said insulation layer and said second P-type heavily doped fin is coupled to said low voltage terminal via said fourth contacts.

38. The self-balanced silicon-controlled rectification device according to claim 1, wherein said substrate is a semiconductor substrate.

* * * * *